(12) United States Patent
Komyoji et al.

(10) Patent No.: US 6,673,386 B2
(45) Date of Patent: Jan. 6, 2004

(54) METHOD AND APPARATUS FOR FORMING PATTERN ONTO PANEL SUBSTRATE

(75) Inventors: Daido Komyoji, Ikoma (JP); Naoko Matsuda, Hirakata (JP); Akira Fukano, Ikoma (JP); Katsutoshi Ogawa, Hirakata (JP); Akira Kumon, Katano (JP); Hiroyuki Naka, Osaka (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 0 days.

(21) Appl. No.: 09/892,737

(22) Filed: Jun. 28, 2001

(65) Prior Publication Data

US 2002/0050061 A1 May 2, 2002

(30) Foreign Application Priority Data

Jun. 29, 2000 (JP) ........................................ 2000-196112
Mar. 9, 2001 (JP) ........................................ 2001-065826
Mar. 9, 2001 (JP) ........................................ 2001-065828

(51) Int. Cl.⁷ .............................................. B05D 3/14
(52) U.S. Cl. .................. 427/8; 118/6; 118/308; 118/624; 118/668; 427/58; 427/123; 427/189; 427/190; 427/191; 427/193; 427/195; 427/197; 427/202; 427/203; 427/258; 427/259; 427/261; 427/265; 427/272; 427/282; 427/294; 427/385.5; 427/421; 427/427; 427/466; 427/468; 427/469; 427/470; 427/472; 427/474; 427/561; 427/562; 427/564; 427/567
(58) Field of Search .............................. 427/466, 468, 427/469, 470, 472, 474, 561, 562, 564, 567, 58, 123, 189, 190, 191, 193, 195, 197, 202, 203, 258, 259, 261, 265, 272, 282, 294, 385.5, 421, 427, 8; 118/308, 624, 668, 6

(56) References Cited

U.S. PATENT DOCUMENTS

| 3,678,336 | A | * | 7/1972 | Winkless ........................ 317/3 |
| 3,778,841 | A | * | 12/1973 | Gundlach et al. ....... 346/74 ES |
| 5,307,092 | A | | 4/1994 | Larson |
| 5,703,433 | A | | 12/1997 | Fujii et al. |
| 5,818,490 | A | | 10/1998 | Larson |
| 5,851,732 | A | | 12/1998 | Kanda et al. |
| 6,075,319 | A | | 6/2000 | Kanda et al. |
| 6,156,433 | A | | 12/2000 | Hatori et al. |
| 6,171,746 | B1 | * | 1/2001 | Natsuhara et al. .......... 430/111 |

FOREIGN PATENT DOCUMENTS

| JP | 10-27543 | 1/1998 |
| WO | 97/02903 | 1/1997 |
| WO | 00/21690 | 4/2000 |

\* cited by examiner

Primary Examiner—Bernard Pianalto
(74) Attorney, Agent, or Firm—Wenderoth, Lind & Ponack, L.L.P.

(57) ABSTRACT

A method for forming a pattern on a surface of a panel substrate, includes electrically charging pattern-forming material particles, jetting out the electrically charged pattern-forming material particles through a nozzle by applying electrostatic force to the pattern-forming material particles to form a pattern, and fixing the pattern onto the panel substrate.

47 Claims, 66 Drawing Sheets

METHOD AND APPARATUS FOR FORMING PATTERN ONTO PANEL SUBSTRATE

BACKGROUND OF THE INVENTION

The present invention relates to a pattern forming method and apparatus which allows a desired pattern to be formed on a substrate implementing a large-scale panel such as a PDP (Plasma Display Panel), liquid crystal panel, organic EL (Electro Luminescence) panel, or circuit board with a low cost, and yet which allows a fine pattern to be formed with high precision. The invention also relates to pattern-forming material particles to be used for the pattern forming method and apparatus.

PDPs have become far thinner than CRT type image display devices, and flat in their image-displaying surfaces, thus being considered as useful for so-called wall-hanging type large-scale image display devices or the like.

In the image display mechanism of a PDP, in which a micro-cell structure is formed between a pair of transparent glass plates, plasma arcs are generated by this cell structure so that a fluorescent layer formed within the cell structure emits light, the resulting light emission being allowed to penetrate through the transparent glass plates so as to be radiated outside. In this one pair of glass plates, a multiplicity of transparent linear electrodes intersecting one another are formed, and producing plasma emission at the intersecting points of those linear electrodes allows an emission image having any arbitrary pattern to be formed. Arranging fluorescent layers corresponding to the three primary colors of R, G and B enable the display of color images.

Now, an explanation of PDPs is given below.

As shown in FIG. 85, a plasma display panel (PDP) is so constructed that electric discharge is generated locally between opposing two substrates, i.e. a front glass plate 80 and a back glass plate 89, thereby causing fluorescent layers 85 formed in partitions on the substrate to be excited so as to emit light.

On the inner surface of the front glass plate 80, transparent electrodes 81 for generating surface discharge along the substrate surface are arrayed, by one pair for each line. Each of the transparent electrodes 81 comprises a wide, linear band-shaped transparent electrode made of ITO thin film, and a narrow, linear band-shaped Ag bus electrode 82 made of metal thin film. The bus electrode 82 is an auxiliary electrode for ensuring appropriate electrical conductivity. A dielectric layer 83 is provided so as to cover the transparent electrodes 81, and a protective film 84 of MgO is deposited on the surface of the dielectric layer 83. Both the dielectric layer 83 and the protective film 84 have light transparency.

Next, on the inner surface of the back glass plate 89, address electrodes (data electrodes) 88 are arrayed so as to perpendicularly intersect the transparent electrodes 81. One linear rib, indicated by numeral 86, is provided between every adjacent ones of the address electrodes 88. The ribs 86 are formed from low melting-point glass, and opaque to ultraviolet rays. These ribs 86 partition the discharge space along the line direction in sub-pixels (unit light-emitting areas), and define the gap size of the discharge space.

Then, the fluorescent layers 85 of the three colors of R, G and B for color display are provided so as to cover the back wall surface including upper portions of the address electrodes 88 and side faces of the ribs 86. The transparent electrodes 81 correspond to one line of the matrix display, and one address electrode 88 corresponds to one column. Then, three columns correspond to one pixel (picture element). That is, one pixel is made up of three sub-pixels of R, G and B arrayed along the line direction.

Stored state of wall charges in the dielectric layer 83 is controlled by opposite discharge between the address electrodes 88 and the transparent electrodes 81. Applying sustain pulses alternately to the transparent electrodes 81 causes occurrence of surface discharge (main discharge) at the sub-pixels where a specified amount of wall charges are present. Ultraviolet rays caused by this surface discharge causes the fluorescent layer 85 to be locally excited, radiating visible light of a specified color. Out of this visible light, a portion of light that is transmitted by the front glass plate 80 becomes display light. Since the arrangement pattern of the ribs 86 is a stripe pattern, portions corresponding to individual columns within the discharge space are continuous in the column direction, stretching over all the lines. The color of emission light of the sub-pixels within each column is of the same.

Because of the large size of the panel substrate, the formation of the linear electrodes onto the surface of glass plates forming the PDP has so far been implemented by screen printing process, photoetching process, and thin film process.

However, there have been issues that the screen printing process is insufficient in the precision of fine patterns, while the photoetching process and the thin film process involve large numbers of steps, resulting in high-priced pattern formation. Such issues have been applicable also to the pattern formation onto other large-scale panel substrates such as the cell-surrounding wall formation in the fabrication of liquid crystal panels or organic EL panel, or the conductor-circuit formation onto circuit boards.

In particular, in the case of techniques involving exposure and development, resulting waste liquids cannot be adopted in terms of environmental issues. Besides, exposure equipment and development equipment are large in size and large in installation site, taking high equipment costs.

SUMMARY OF THE INVENTION

Accordingly, an object of the present invention is to provide a method and apparatus for forming a pattern onto a panel substrate, the method and apparatus being simple in processes and yet good at the precision of fine-pattern formation, as well as to provide pattern-forming material particles to be used for the pattern forming method and apparatus.

In order to achieve the above objects, the present invention has the following constitutions.

According to a first aspect of the present invention, there is provided a method for forming a pattern on a surface of a panel substrate, comprising:

electrically charging pattern-forming material particles;

jetting out the electrically charged pattern-forming material particles through a nozzle by applying electrostatic force to the pattern-forming material particles to form a pattern; and fixing the pattern onto the panel substrate.

According to a second aspect of the present invention, there is provided a method for forming a pattern onto a panel substrate according to the first aspect, wherein the electrically charging is implemented by a corona charging method.

According to a third aspect of the present invention, there is provided a method for forming a pattern onto a panel substrate according to the first or second aspect, wherein in forming the pattern, a pattern is once formed on a surface of an intermediate member with the jetted out pattern-forming material particles, and thereafter the pattern on the intermediate member is transferred onto the surface of the panel substrate, by which the pattern is formed on the panel substrate.

According to a fourth aspect of the present invention, there is provided a method for forming a pattern onto a panel substrate according to the first or second aspect, further comprising performing an exposure and development process on the formed pattern.

According to a fifth aspect of the present invention, there is provided a method for forming a pattern onto a panel substrate according to the first or second aspect, further comprising: forming an adhesion layer on a surface of the panel substrate to which the pattern-forming material particles have not yet jetted out from the nozzle.

According to a sixth aspect of the present invention, there is provided a method for forming a pattern onto a panel substrate according to the first or second aspect, wherein the pattern-forming material particles are particles each having a particle size of 0.5 to 15 $\mu$m formed from a compound material which contains a particle body and hard inorganic fine particles deposited on a surface of the particle body, the particle body containing one or more kinds of inorganic material selected from a group consisting of metal, metal oxide, ceramics, and glass, and a binder resin with a ratio of the inorganic material to a total amount of the inorganic material and the binder resin being 30 to 99 wt %.

According to a seventh aspect of the present invention, there is provided an apparatus for forming a pattern onto a panel substrate, comprising:
  a particle feeder for feeding electrically charged pattern-forming material particles;
  a nozzle placed between the particle feeder and the panel substrate; and
  a jet device for jetting out the pattern-forming material particles from the nozzle by exerting an electrostatic force to the pattern-forming material particles fed from particle feeder.

According to an eighth aspect of the present invention, there is provided an apparatus for forming a pattern onto a panel substrate according to the seventh aspect, further comprising a panel substrate holder having a flat surface for holding the panel substrate, wherein the panel substrate is vacuum-sucked up by this flat surface of the panel substrate holder.

According to a ninth aspect of the present invention, there is provided an apparatus for forming a pattern onto a panel substrate according to the seventh or eighth aspect, further comprising: a detector for detecting a distance between the nozzle and the panel substrate; and a distance controller for controlling the distance between the nozzle and the panel substrate based on detection information obtained from the detector.

According to a 10th aspect of the present invention, there is provided an apparatus for forming a pattern onto a panel substrate according to the seventh or eighth aspect, further comprising, around an opening of the nozzle, an electrode for converging a jet stream of the pattern-forming material particles by applying electrostatic force to the pattern-forming material particles that pass through the opening.

According to an 11th aspect of the present invention, there is provided a method for forming a pattern on a surface of a panel substrate according to the first aspect, wherein the pattern-forming material particle is composed of a resin material which is to be evaporated by baking process, and a kind of constituent material particles which are disposed within the resin material at a uniform distribution and which functions to form a pattern.

According to a 12th aspect of the present invention, there is provided a method for forming a pattern on a surface of a panel substrate according to the 11th aspect, wherein the plurality of kinds of constituent material particles which are distributed uniformly within the resin material.

According to a 13th aspect of the present invention, there is provided a method for forming a pattern on a surface of a panel substrate according to the 11th or 12th aspect, wherein the constituent material particle has a diameter $\frac{1}{5}$ or less a diameter of the pattern-forming material particle.

According to a 14th aspect of the present invention, there is provided a method for forming a pattern on a surface of a panel substrate according to the 11th aspect, wherein the constituent material particle is disposed at a central portion of the pattern-forming material particle and peripherally coated with the resin material.

According to a 15th aspect of the present invention, there is provided a method for forming a pattern on a surface of a panel substrate according to the 14th aspect, wherein another kind of constituent material particle is dispersedly disposed in the resin material present in peripheries of the central constituent material particle.

According to a 16th aspect of the present invention, there is provided a method for forming a pattern on a surface of a panel substrate according to the 14th aspect, wherein a multiplicity of smaller-diameter resin-material particles than the constituent material particle are deposited on a peripheral surface of the constituent material particle.

According to a 17th aspect of the present invention, there is provided a method for forming a pattern on a surface of a panel substrate according to any one of the 11th, 12th, and 14th aspects, wherein the constituent material particle is made of an electrically conductive material and, when baked, forms an electrode of the pattern.

According to a 18th aspect of the present invention, there is provided a method for forming a pattern on a surface of a panel substrate according to the 11th or 14th aspect, wherein when the pattern-forming material particle is electrically charged and thereafter jetted out by electrostatic force so as to be deposited onto the surface of the panel substrate, by which the pattern is formed:
  baking the pattern-forming material particles containing different kinds of constituent material particles which are deposited so as to be coexistent at individual sites, by which different constituent material particles are mixed together.

According to a 19th aspect of the present invention, there is provided a method for forming a pattern on a surface of a panel substrate according to the 11th or 14th aspect, wherein when the pattern-forming material particle is electrically charged and thereafter jetted out by electrostatic force so as to be deposited onto the surface of the panel substrate, by which the pattern is formed:
  stacking the pattern-forming material particles on the panel substrate into a plurality of layers; and
  changing the kind of constituent material particles contained in the pattern-forming material particles among the individual layers of the pattern-forming material particles.

According to a 20th aspect of the present invention, there is provided a method for forming a pattern on a surface of a panel substrate according to the 11th or 14th aspect, wherein when the pattern-forming material particle is electrically charged and thereafter jetted out by electrostatic force so as to be deposited onto the surface of the panel substrate, by which the pattern is formed:

stacking the pattern-forming material particles on the panel substrate into a plurality of layers; and depositing the pattern-forming material particles in a wide-bottom shape with the lower layers, or layers closer to the panel substrate, increasingly wider in width.

According to a 21st aspect of the present invention, there is provided a method for forming a pattern onto a panel substrate according to the first aspect, wherein when the pattern is formed onto the surface of the panel substrate by the jetted-out pattern-forming material particles, an electrostatic pattern is formed on an intermediate body, the pattern-forming material particles are deposited onto the electrostatic pattern formed on the intermediate body, the pattern-forming material particles deposited on the intermediate body are transferred onto the panel substrate, and thereafter the transferred pattern-forming material particles are fixed onto the panel substrate; and further comprising cleaning the intermediate body onto which the pattern-forming material particles have been transferred, by which remaining pattern-forming material particles are removed.

According to a 22nd aspect of the present invention, there is provided a method for forming a pattern onto a panel substrate according to the 21st aspect, wherein when the transferred pattern-forming material particles are fixed onto the panel substrate, the processes from the charging of the pattern-forming material particles to the removal of pattern-forming material particles remaining on the intermediate body are repeated a plurality of times, by which a plurality of pattern-forming material particles are fixed; and further comprising baking the panel substrate so that the pattern is formed on the panel substrate, by which a plurality of patterns are formed at a time.

According to a 23rd aspect of the present invention, there is provided a method for forming a pattern onto a panel substrate according to the 21st or 22nd aspect, wherein the intermediate body is one in which an electrical conductor is buried within a platy substrate along the pattern, and in forming the electrostatic pattern on the intermediate body, a voltage is applied to the electrical conductor, by which the electrostatic pattern is formed on the surface of the substrate as the intermediate body.

According to a 24th aspect of the present invention, there is provided a method for forming a pattern onto a panel substrate according to the 21st or 22nd aspect, wherein the intermediate body is one in which a patterned mask is provided on the surface of the platy substrate.

According to a 25th aspect of the present invention, there is provided a method for forming a pattern onto a panel substrate according to the first or 21st aspect, wherein when the pattern-forming material particles are electrically charged, the pattern-forming material particles are electrically charged by an electric charger.

According to a 26th aspect of the present invention, there is provided a method for forming a pattern onto a panel substrate according to the first or 21st aspect, wherein when the electrically charged pattern-forming material particles are jetted out by electrostatic force, a mixture of the pattern-forming material particles and highly chargeable particles are jetted out.

According to a 27th aspect of the present invention, there is provided a method for forming a pattern onto a panel substrate according to the first or 21st aspect, wherein when the pattern-forming material particles are electrically charged the pattern-forming material particles are mixed with highly chargeable particles to be electrically charged.

According to a 28th aspect of the present invention, there is provided a method for forming a pattern onto a panel substrate according to the first or 21st aspect, wherein when the pattern-forming material particles are electrically charged, the pattern-forming material particles are electrically charged by friction between a blade and the pattern-forming material particles.

According to a 29th aspect of the present invention, there is provided a method for forming a pattern onto a panel substrate according to the first aspect, wherein when the electrically charged pattern-forming material particles are jetted out through the nozzle by exerting electrostatic force on the electrically charged pattern-forming material particles to perform application of the pattern-forming material particles; and when the pattern is formed by the jetted-out pattern-forming material particles, a voltage is applied to an electrically conductive layer present on a top surface of the panel.

According to a 30th aspect of the present invention, there is provided a method for forming a pattern onto a panel substrate according to the first aspect, wherein when the electrically charged pattern-forming material particles are jetted out through the nozzle by exerting electrostatic force on the electrically charged pattern-forming material particles to perform application of the pattern-forming material particles; and when the pattern is formed by the jetted-out pattern-forming material particles, a voltage is applied to a conductor provided on a back side of the panel; and fixing the pattern on the panel substrate.

According to a 31st aspect of the present invention, there is provided a method for forming a pattern onto a panel substrate according to the first aspect, wherein when the electrically charged pattern-forming material particles are jetted out through the nozzle by exerting electrostatic force on the electrically charged pattern-forming material particles to perform application of the pattern-forming material particles; and when the pattern is formed by the jetted-out pattern-forming material particles, a voltage is applied to a conductor provided on a back side of the panel, an electrically conductive film is formed on a top surface of the panel, and a voltage is applied to the film.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
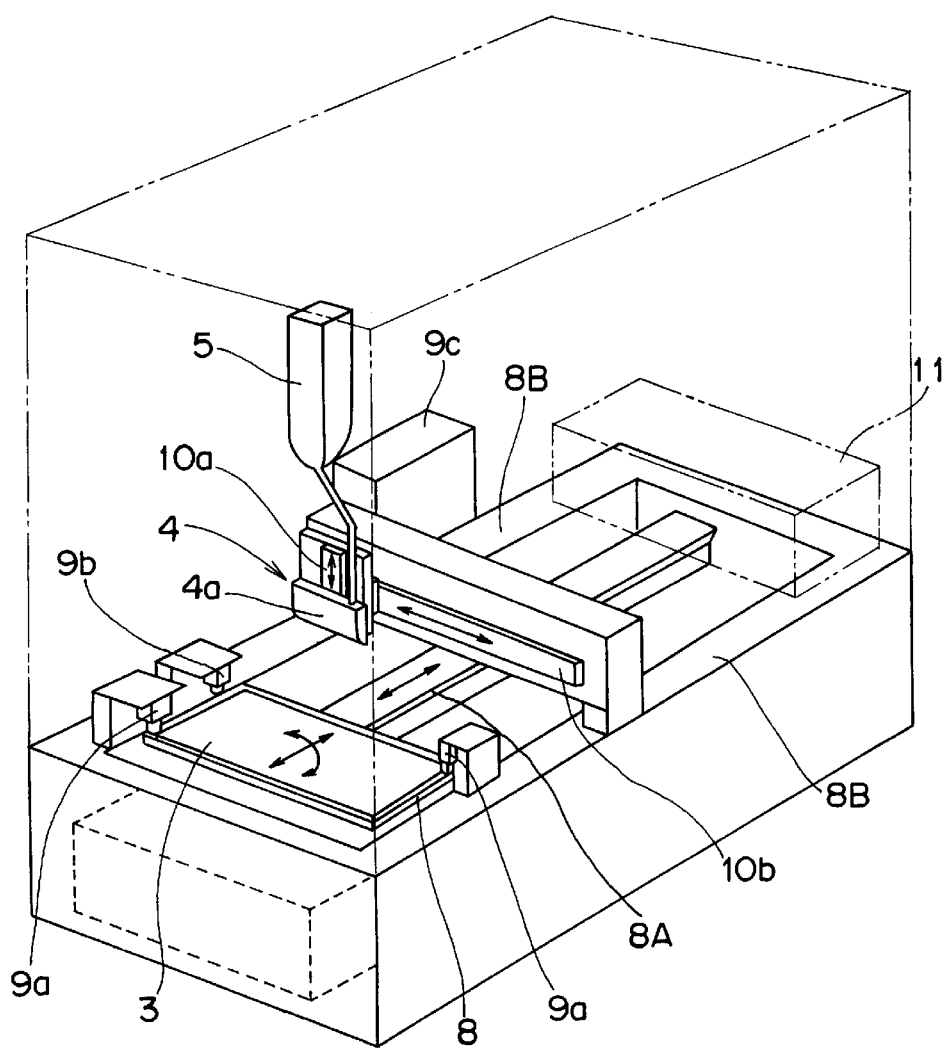
FIG. 1 is a perspective view representing a pattern forming apparatus according to a first embodiment of the present invention.

Before the description of the present invention proceeds, it is to be noted that like parts are designated by like reference numerals throughout the accompanying drawings.

Hereinbelow, embodiments of the present invention are described in detail with reference to the accompanying drawings.

(First Embodiment)

Figure 2:
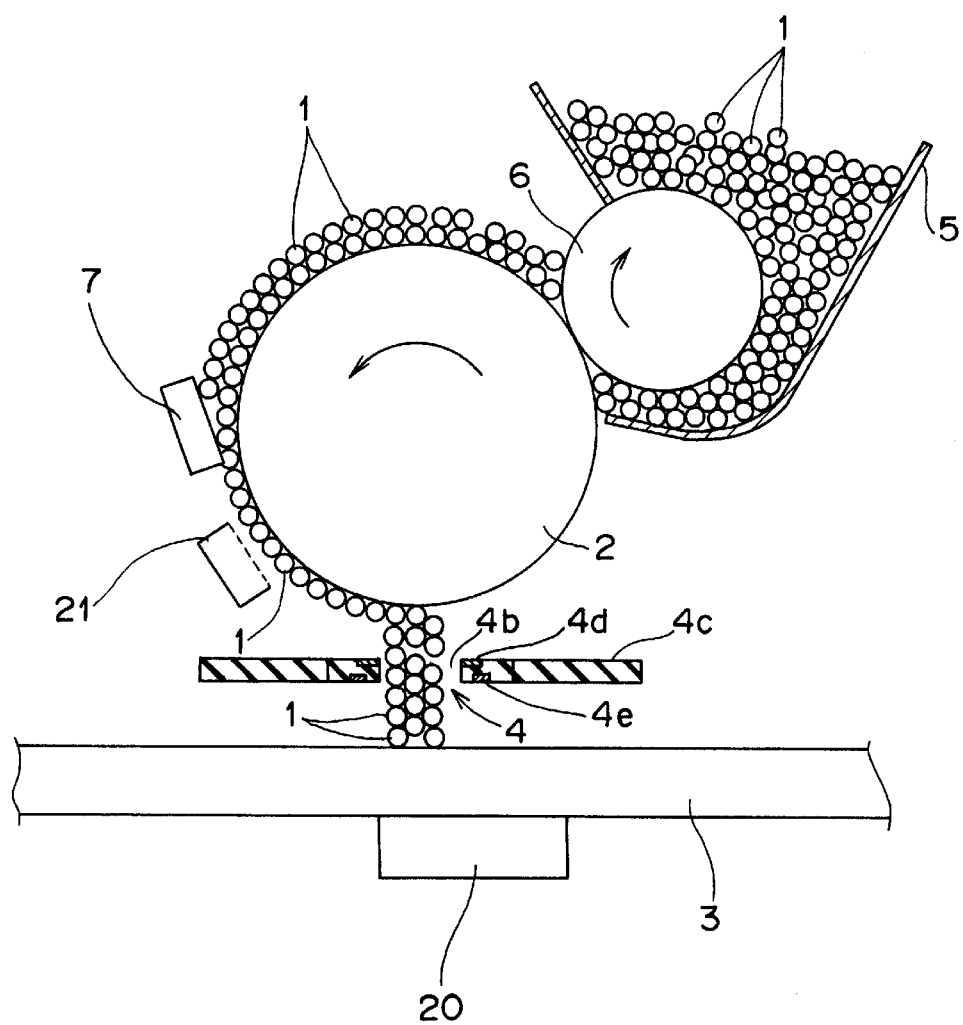
FIG. 2 is an enlarged side sectional view representing a part of the pattern forming apparatus.

FIGS. 1 and 2 show an apparatus for forming a pattern onto a panel substrate according to a first embodiment of the present invention.

This pattern forming apparatus is equipped with a particle feeder 2 for carrying and conveying pattern-forming material particles 1, and moreover a nozzle 4 placed between the particle feeder 2 and a panel substrate 3. In addition, although a roller-like particle feeder 2 is shown in FIG. 2, the particle feeder 2 is not limited to this, and may be belt-like shaped, for example. The panel substrate 3 is given by a glass plate or the like. The nozzle 4, housed in a casing 4a, is provided by an FPC (Flexible Printed Circuit board) 4c having holes 4b that allows the pattern-forming material particles 1 to pass therethrough. In a hopper 5 for housing therein the pattern-forming material particles 1, a particle feed roller 6 is provided and, when rotating, feeds the pattern-forming material particles 1 within the hopper 5 toward the particle feeder 2. Carried pattern-forming material particles 1, which are placed and stacked on the peripheral surface of the particle feeder 2, are negatively charged by a blade 7 rubbing thereagainst, and regulated in thickness to one–three layers. The pattern-forming material particles 1 having reached the position of the nozzle 4 are jetted out from the particle feeder 2 to the surface of the panel substrate 3 under voltage control by a control electrode 4d placed on the particle feeder 2 side.

The nozzle 4 has a five-layer structure, where the central layer is a 100 μm thick polyimide sheet, and electrode layers are provided above and below the central layer, each surface of the electrode layers being covered with an insulating layer, which is covered at its surface with a semiconductive film. The reason of the coverage with a semiconductive or semi-insulating film is to prevent the nozzle 4 from being charged by occurrence of static electricity.

Figure 11:
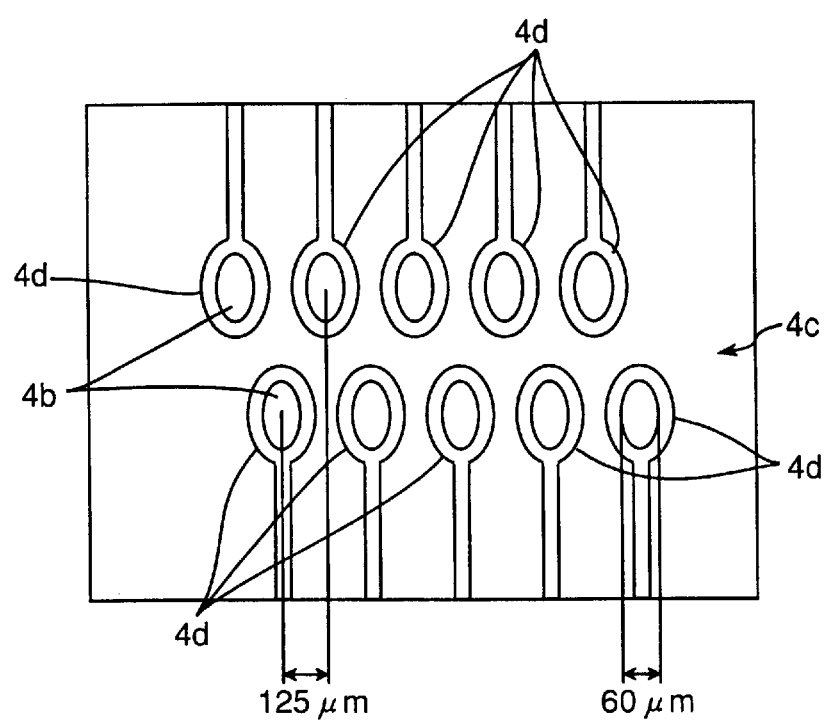
FIG. 11 is an explanatory view of each inner diameter of circular holes around which ninety control electrodes of a nozzle FPC are arranged, as well as pitch intervals of the holes.

Each hole 4b is circular shaped as shown in FIG. 11, but may also be rectangular shaped. The hole 4b is set to a size of an about 70 to 150 μm diameter or width, and can be drilled by excimer laser or pressing, or YAG laser, $CO_2$ laser, or the like.

The surface of the panel substrate 3 is supplied with a voltage application of about +1000 V with respect to the particle feeder 2. The control electrode 4d, under a non-jet state, is supplied with a voltage application of –100 to –200 V with respect to the particle feeder 2. In a jet state, the control electrode 4d is set to +300 V, causing the negatively charged pattern-forming material particles 1 to be jetted out to the panel substrate 3 by electrostatic force. It is also possible that the pattern-forming material particles 1 are positively charged, while the applied voltage is set to the opposite polarity.

A charger 21 for electrically charging the panel substrate 3 may be provided in the charging system so that the panel substrate 3 is charged from its top surface side such as in a corona charger or contact charger, or in the back charging system so that the panel substrate 3 is given a voltage from its back, as in a voltage generator 20.

Figure 8:
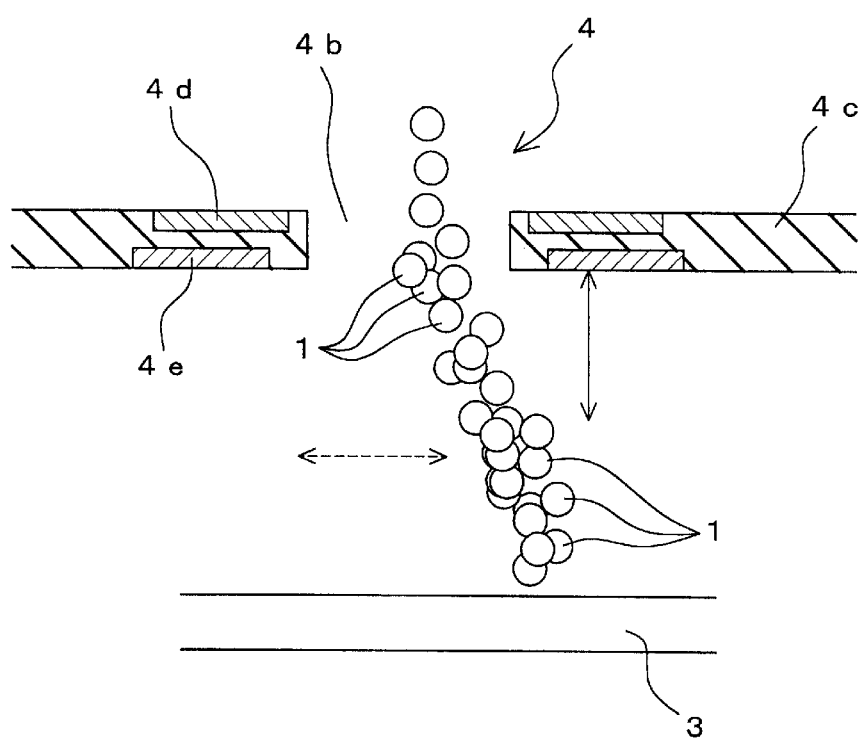
FIG. 8 is an explanatory view of a state in which a jet stream of pattern-forming material particles is biased toward one direction such as the back-and-forth direction or the left-and-right direction.

Around the nozzle hole 4b, in addition to the control electrode 4d for turning on and off the jet-out of the pattern-forming material particles 1, a deflecting electrode 4e is also buried on the panel substrate 3 side, so that the pattern-forming material particles I are controlled in their jet-out angle by the action of the deflecting electrode 4e. The deflecting electrode 4e performing such an action is, generally, placed at a position opposite to the control electrode 4d around the nozzle hole 4b, so as to deflect the jet stream of the pattern-forming material particles 1 toward one direction such as the back-and-forth direction or the right-and-left direction. As an example, in the case where a PDP is used as the panel substrate 3 while PDP electrodes are formed by the above pattern forming apparatus as shown in FIG. 8, the convergence part of the electrodes at a panel end portion is enabled to bend the pattern-forming material particles 1, thereby forming a convergence part, by the convergence electrode of the nozzle 4, that is, by the deflecting electrode 4e. Otherwise, the deflecting electrode may be a ring-shaped one for converging and throttling the jet stream of the pattern-forming material particles 1, other than such a deflecting electrode 4e as described above.

Figure 9:
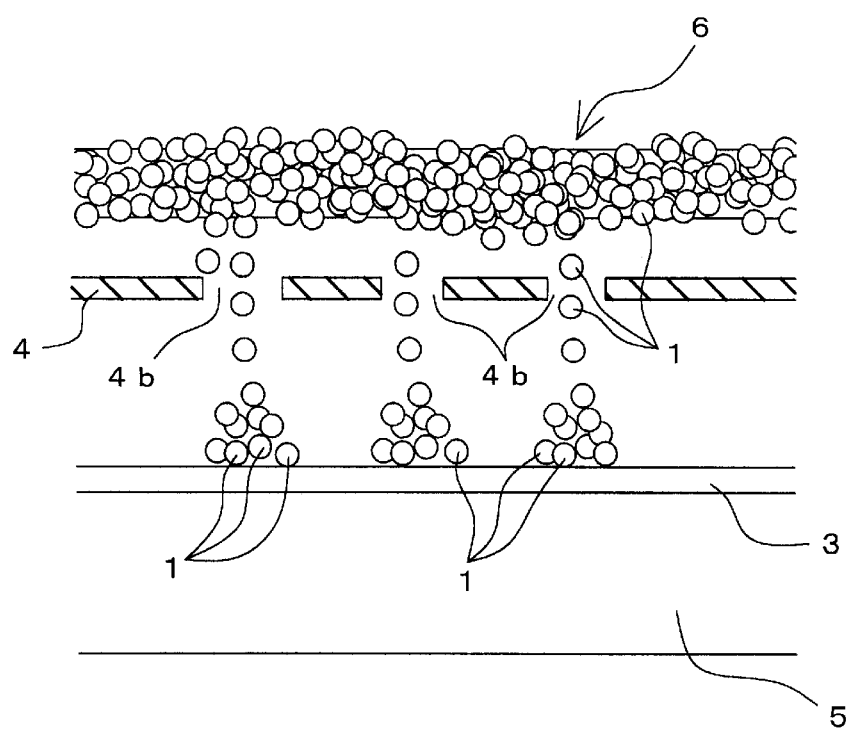
FIG. 9 is an explanatory view of a state in which the interval between holes of the nozzle is coincident with the interval between electrodes, which is the pattern to be formed.

Also, as shown in FIG. 9, the interval of the holes 4b of the nozzle 4 is set equal to the interval of electrodes, which is the pattern to be formed.

The panel substrate 3 is placed on an X-Y stage or X-Y table 8 as one example of a panel substrate holder, with the placement position of the panel substrate 3 changeable back and forth, right and left, by the moving functions of the X-Y table 8 in the X direction and the Y direction. The holder for the panel substrate 3 like the X-Y table 8 is so designed that its position is detected by a CCD or other camera depending on a marker or the like provided at an end corner portion or the like of the panel substrate 3 in the preceding step, where when shifted from the holding position, the panel substrate 3 is aligned by being shifted in position.

(Intermediate Sheet)

By appropriately combining the control of the jet-out angle of the pattern-forming material particles 1 and the change of the position of the panel substrate 3, the pattern-forming material particles 1 jetted out from the nozzle 4 are enabled to form a desired pattern (not shown). Such a pattern is generally formed directly on the surface of the panel substrate 3, but in some cases, as described later, may be temporarily formed on an intermediate body or intermediate member 12 and then transferred from the intermediate member 12 onto the panel substrate 3. When such an intermediate member 12 is used, it is possible that the jet stream of the pattern-forming material particles 1 is made by electrically charging this intermediate member 12. When the thickness of the intermediate body is small, a voltage is applied to the back surface to pull out the pattern-forming material particles 1.

The pattern directly formed on the surface of the panel substrate 3 or transferred from the intermediate member 12 in this way will be temporarily set (fixed) stably on the panel substrate 3, even as it is, by the energy at the collision of the jet stream of the pattern-forming material particles 1 against the surface of the panel substrate 3 or by the pressing force at the transfer. However, in order to strengthen this temporary setting force, another pressing force may be applied, or the adhesion force may be increased by, for example, melting resin components of the pattern-forming material particles 1.

Figure 86:
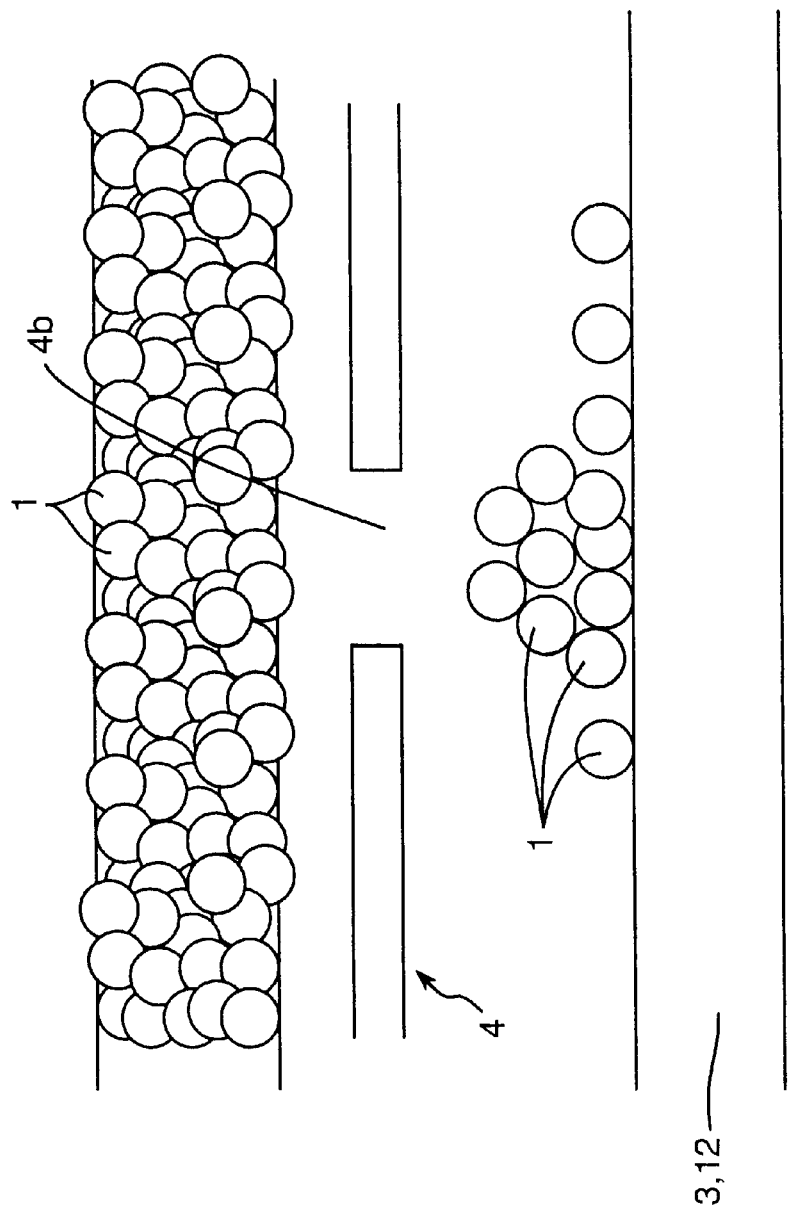
FIG. 86 is a view for explaining defection in a case where an adhesive layer is not formed on a pattern-forming surface of a panel substrate or an intermediate member.
Figure 87:
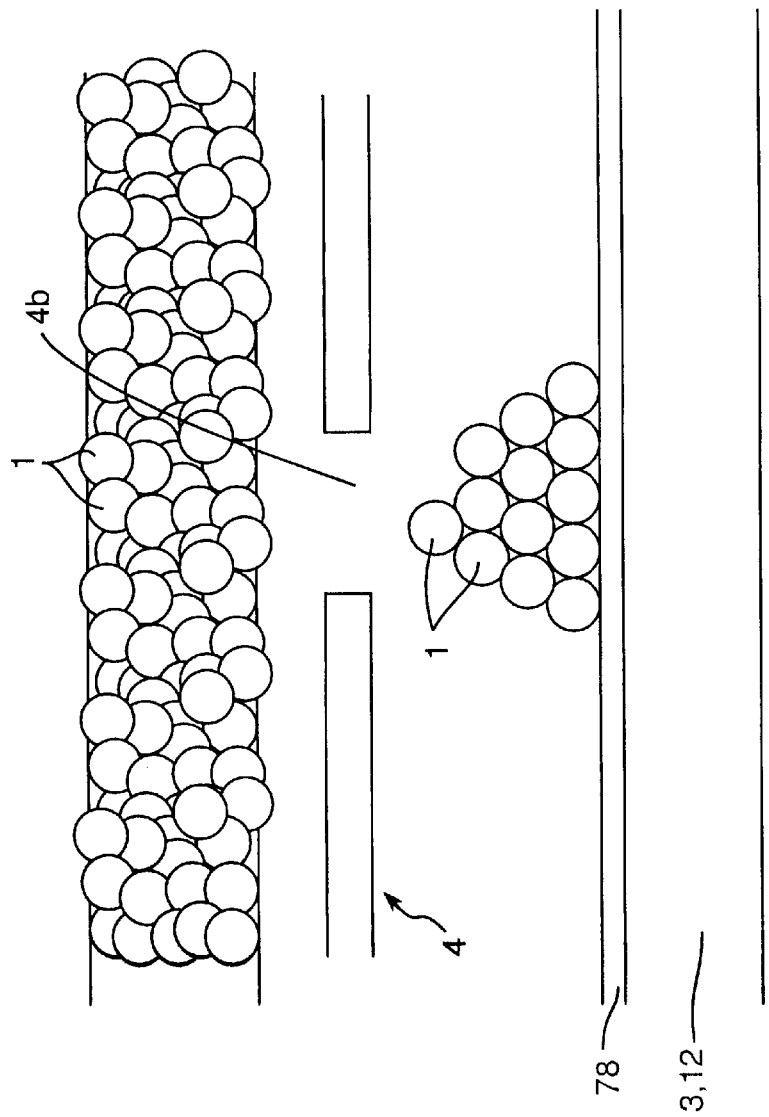
FIG. 87 is a view for explaining an example where an adhesive layer is formed on a pattern-forming surface of a panel substrate or an intermediate member.

The pattern-forming material particles 1 colliding with the surface of the panel substrate 3 or the intermediate member 12, when having no strong adhesive force or sticking force in themselves, may be scattered in dots beyond the pattern-forming area as a result of reaction against the collision as shown in FIG. 86. For prevention of this, it is preferred to form an adhesive layer 78 on the pattern-forming surface of the panel substrate 3 or the intermediate member 12 by, for example, applying oil, an adhesive or a solvent to the surface with some other disturbance power as shown in FIG. 87, so that the collision energy of the pattern-forming material particles 1 is absorbed or that the adhesion force onto the panel substrate 3 is increased, thereby preventing the pattern-forming material particles 1 from being scattered.
(Postprocessing)

Figure 88:
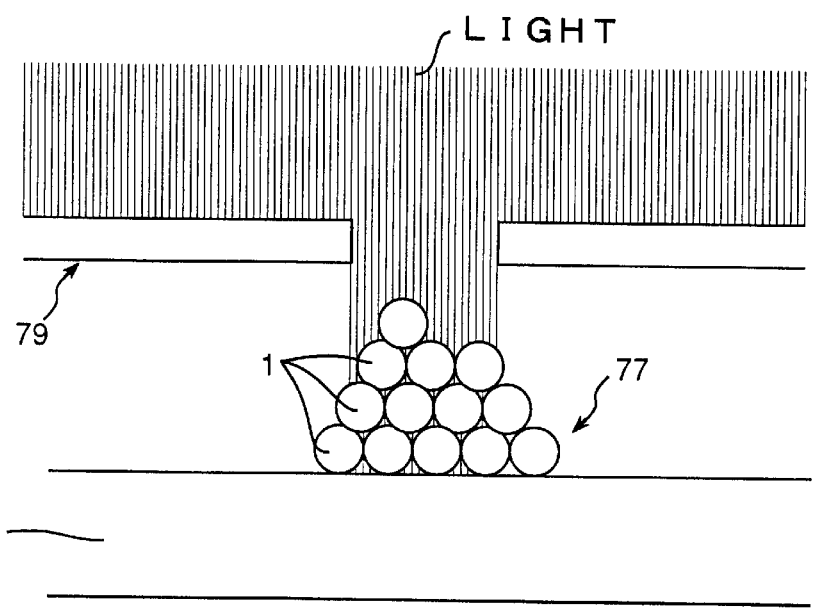
FIG. 88 is a view for explaining a state where a screen is placed on a pattern formed on a surface of a panel substrate or an intermediate member.
Figure 89:
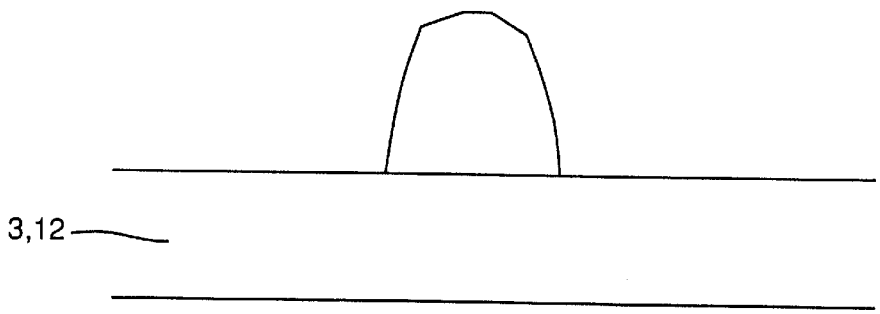
FIG. 89 is a view for explaining a state where exposure to light, development, and fixing have been accomplished after FIG. 88.
Figure 12:
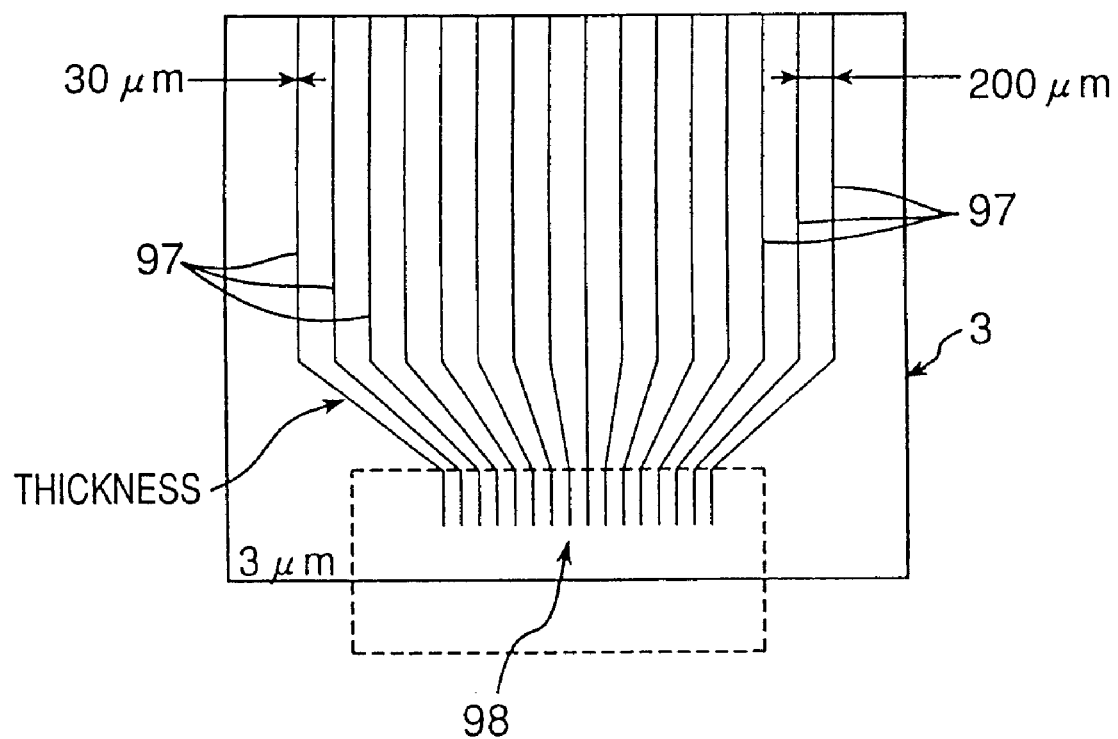

The pattern formed on the surface of the panel substrate 3 or the intermediate member 12 is good at precision, even as it is. However, in the case where the precision needs to be further enhanced, it is also possible that a screen 79 having an opening pattern corresponding to a desired pattern is placed on the pattern 77 formed on the surface of the panel substrate 3 or the intermediate member 12 (see FIG. 88), and then, after exposure to light for solidification, the forming material particles of the other parts are flushed away by a development process (see FIG. 89). In this case, the resins constituting the pattern-forming material particles 1 are preferably thermosetting ones that allow the exposure and development processes to be accomplished. For example, cellulose based resins or acrylic resins are usable. It is not limited to perform these exposure and development processes after the fixing process, but these exposure and development processes may be performed before the fixing process.
(Pattern Forming Apparatus)

Referring to FIG. 1, reference numeral 9a denotes position recognition units arranged in a pair opposite to each other at opposing end portions of the panel substrate 3 so as to recognize the position of the panel substrate 3 (e.g., a pair of markers present at the opposite end portions of the panel substrate 3), 9b denotes a laser displacement gauge for measuring the thickness of the panel substrate 3, and 9c denotes a control board. The recognition units 9a and the laser displacement gauge 9b may be provided also by known optical sensors exploiting the reflection of laser diode light. These measuring instruments employ the laser system or the like. The distance between the nozzle 4 and the panel substrate 3 largely affects the precision of the image to be drawn, where a wider distance would cause the width of drawn lines to be increased. For the drawing of lines or the like, the distance is preferably not more than 0.1 mm. With a demand for pattern precision, the gap distance needs to be not more than 0.050 mm. When the pattern-forming material particles are applied uniformly in a spray-like manner without forming any pattern, the gap distance is broadened conversely. The position recognition units 9a, 9a arranged in a pair at opposing corners of the panel substrate 3 make it possible to set the panel substrate 3 relative to the X-Y table 8 so that a pair of markers present at the opposing end portions of the panel substrate 3 can be seen uniformly.
(Nozzle)

Figure 15:
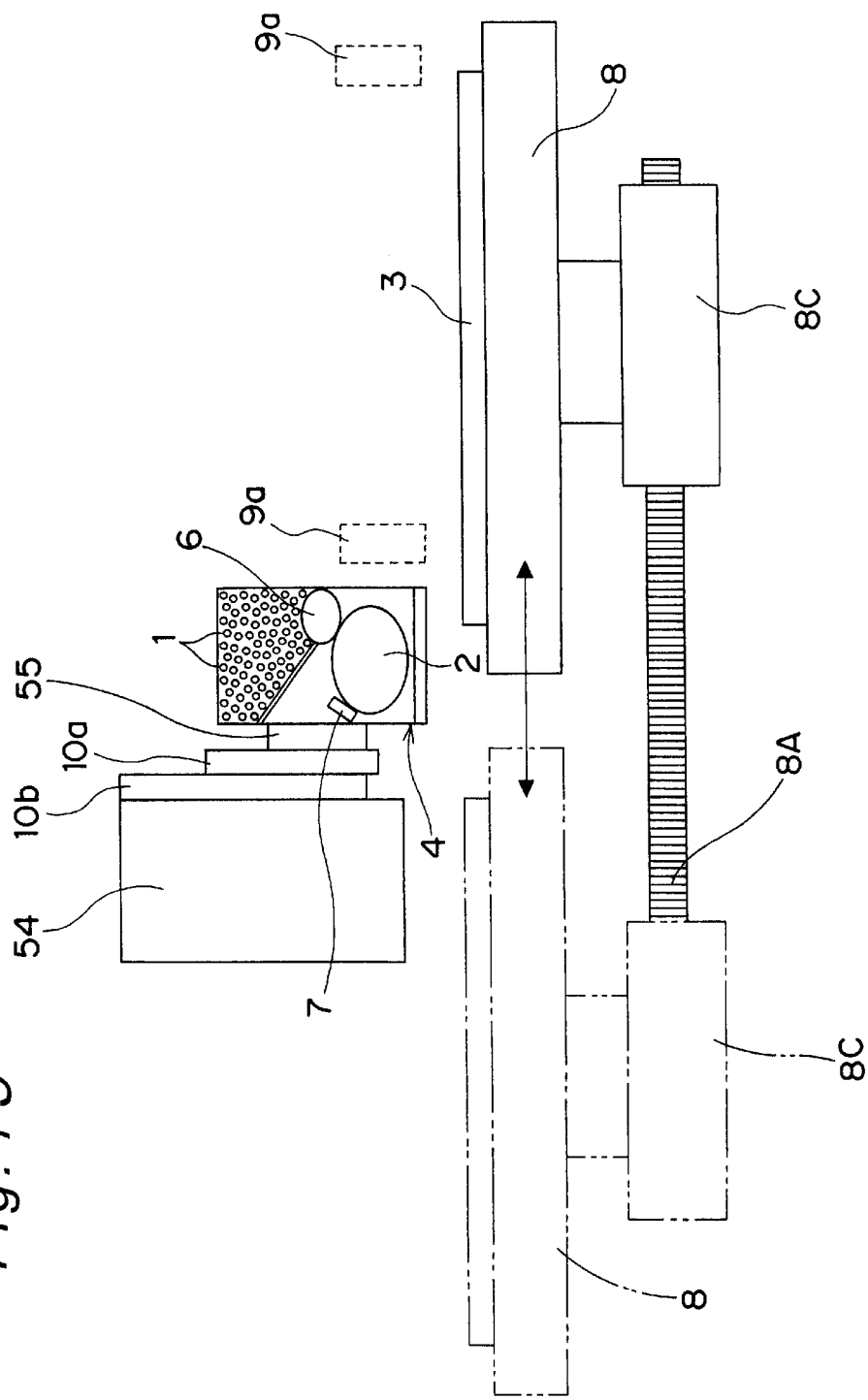
FIG. 15 is a schematic side view of a pattern forming apparatus according to the first embodiment.
Figure 16:
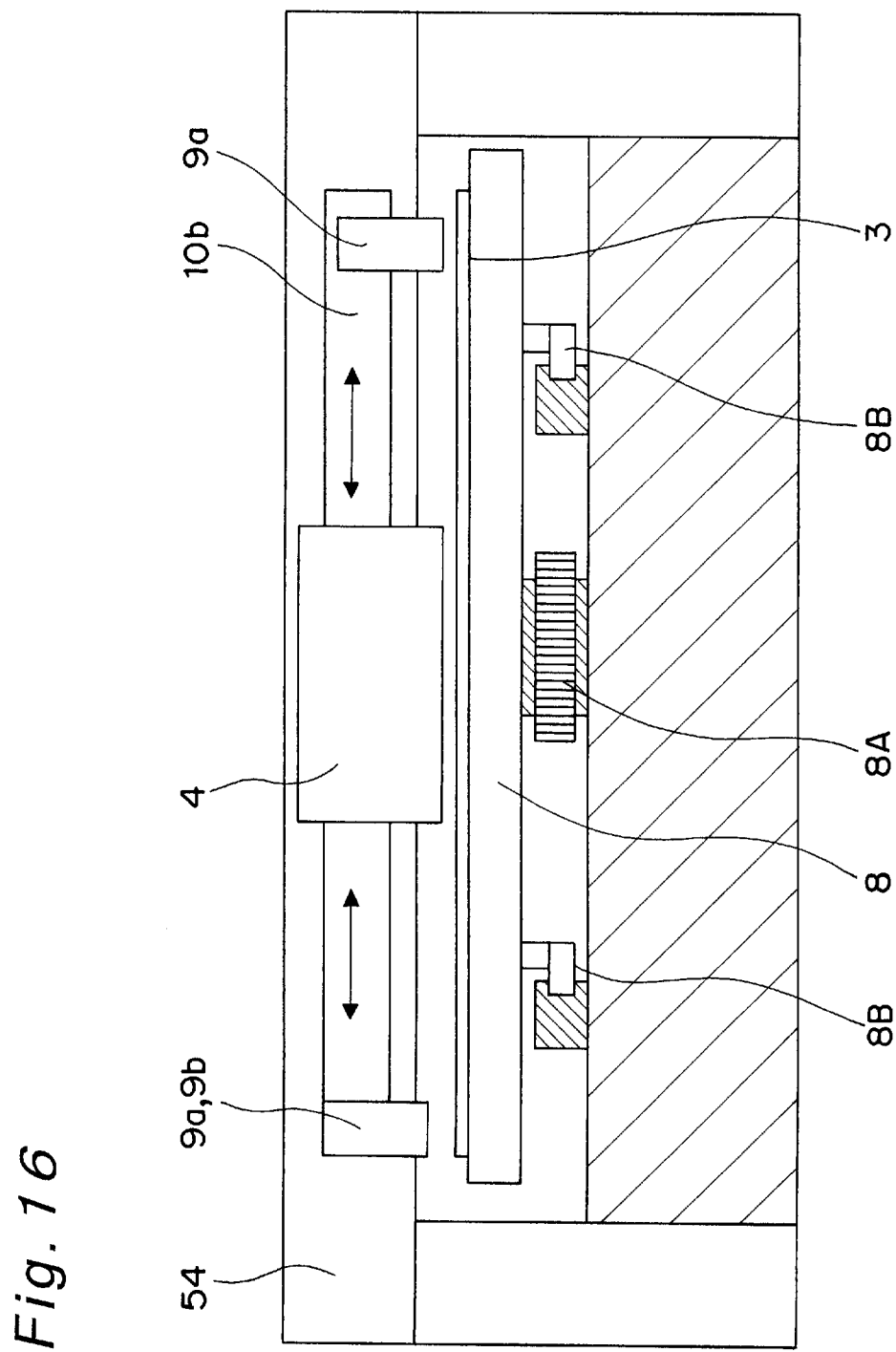
FIG. 16 is a schematic front view of a pattern forming apparatus according to the first embodiment.

A nozzle casing 4a, in which the particle feeder 2 and the particle feed roller 6 are housed, is attached to a horizontal rail 10b via a vertical rail 10a, and thus being movable right and left, up and down. The addition of this action allows a further finer pattern formation to be accomplished with the pattern-forming material particles I jetted out from the nozzle 4, where a pattern formation over the whole panel substrate 3 can be accomplished. It is also possible to use a three-axis robot or a three-axis manipulator. The motive power for moving the individual rails 10a, 10b is provided by using an up-and-down driver unit and a right-and-left driver unit such as stepping motors or servomotors installed on the nozzle 4, whereas air cylinders, hydraulic cylinders or the like are also usable instead of the above ones. The X-Y table 8 is so arranged that, as shown also in FIGS. 15 and 16, while a ball screw 8A for use of moving the panel substrate is driven into rotation by a motor or the like contained in the base of the pattern forming apparatus, the X-Y table 8 coupled to a nut member 8C screwed to the ball screw 8A is moved along a pair of rails 8B provided on both sides, by which the glass panel 3 is moved. It is noted that in FIGS. 15 and 16, numeral 54 denotes a pillar for supporting the horizontal rail 10b, numeral 55 denotes a rotating stage disposed between the vertical rail 10a and the nozzle 4, where the nozzle 4 is enabled to rotate about the rotational axis of the rotating stage 55.
(Control)

Control of the movement of the nozzle 4, control of the movement of the panel substrate 3, and ON-OFF control of the pattern-forming material particles I are all performed by a personal computer 9c, as an example of the control board, coupled to the control parts of the individual driver units. The personal computer 9c includes a CPU, ROM, I/O ports and the like, by which signals are transmitted from the personal computer 9c to the control sections of the individual driver units, for example, driver circuits or electric circuits for driving the motors, so that the drive of the motors is controlled.

With this pattern forming apparatus, a desired pattern is formed on the surface of the panel substrate 3, where the method for this formation includes the following four steps (a) to (d), and generally, further includes the following baking step (e):

Step (a): a step of electrically charging the pattern-forming material particles 1 with the blade 7 of the particle feeder 2;

Step (b): a step of applying electrostatic force generated between the electrically charged pattern-forming material particles 1 and the substrate 3 to the electrically charged pattern-forming material particles 1 to thereby jet out the particles 1 from the hole 4b of the nozzle 4;

Step (c): a step of forming a desired pattern with the jetted-out pattern-forming material particles 1;

Step (d): a step of fixing the pattern onto the panel substrate 3, where the pattern may be either formed and fixed directly onto the panel substrate 3 or temporarily formed on the intermediate member and then transferred and fixed onto the panel substrate 3 as described before;

Step (e): a step of baking the panel substrate 3 having the fixed pattern with a kiln 11, where resin components are evaporated by baking, by which a pattern composed mainly of metal or glass components is formed.

Material and structure of the pattern-forming material particles 1 to be used in the first embodiment of the present invention have only to be those which allow the particles to be fixedly set onto the panel substrate 3 by the fixing or baking process. In brief, the material and the structure depend on the kind of the object on which the pattern is to be formed, i.e., the kind of the panel substrate 3 such as a PDP, liquid crystal panel, circuit board. For example, the pattern-forming material particles are particles having a particle size of 0.5 to 15 $\mu$m formed from a compound material which contains particle bodies and hard inorganic fine particles deposited on the surfaces of the particle bodies, the particle bodies containing one or more kinds of inorganic material selected from a group consisting of metal, metal oxide, ceramics, and glass; and a binder resin with a ratio of the inorganic material to the total amount of the inorganic material and the binder resin being 30 to 99 wt %. With the ratio of the inorganic material less than 30 wt % or beyond 99 wt %, it would be impossible to control the charge amount of the particles. Also, with the particle size less than 0.5 μm or beyond 15 μm, it would be impossible to control the charge amount per unit volume. When the surface of the pattern-forming material particle is covered with resin material, at least 10 vol % of the resin is needed with 99 wt % found by converting 10 vol % into wt %. The ratio of the inorganic material of 30 wt % is the minimum amount for accomplishing various kinds of characteristics. If the particle size is less than 0.5 μm, it is too small to control the particle, while if the particle size is beyond 15 μm, it is too large to control the particle.

As the metal for obtaining the particle bodies, are usable electrode materials such as silver, gold, copper, or silver-palladium. As the metal oxide, are usable barrier materials such as alumina, titanium oxide, and glass frit, fixing agents, or fluorescent substances. The binder resin is exemplified by thermoplastic resins including: polyethylene, polypropylene, polyvinyl chloride, styrene, ethylene vinyl acetate copolymer, polyester, and polystyrene; cellulose resins such as methyl cellulose, ethyl cellulose, nitrocellulose, cellulose acetate, cellulose propionate, and cellulose butyrate; or methacrylic resins such as methyl methacrylate, ethyl methacrylate, normal butyl methacrylate, isobutyl methacrylate, and isopropyl methacrylate.

For the obtainment of the pattern-forming material particles 1, for example, the above materials are melted and kneaded, rolled and cooled, ground into several mm squares with a hammer mill or cutter mill, further ground into 5 to 15 μm with a grinding mill, classified so that coarse particles of 20 μm or more particle sizes as well as fine particles of 5 μm or less particle sizes are excluded, by which particle bodies are obtained. Then, fine particles of colloidal silica, titanium oxide, alumina, or the like can be deposited on the surfaces of the particle bodies with a fast fluidizing mixer. Further, a spheroidizing process may be performed by making the particles into a sprayed state in a high-temperature thermal air stream.

The pattern-forming material particles 1 can also be obtained by microcapsulation methods, polymerization methods, spray dry methods, or the like.

The pattern-forming material particles 1 may be particles of 0.5 to 20 μm particle sizes formed of metal particles or ceramic particles coated with resin. It is also possible to coat metal particles and ceramics or glass with resin respectively as different particles, and to form a pattern by nozzles corresponding to the individual particles.

In the pattern forming method according to the first embodiment of the present invention, it is also possible that the above steps (a) to (c) are repeated to form a plurality of patterns on the surface of the panel substrate 3 and thereafter the fixing step (d) is performed, or that the steps (a) to (d) are repeated to form a plurality of patterns on the surface of the panel substrate 3 and thereafter the baking step (e) is performed, so that the fixing step or the baking step has to be done only once. The plurality of patterns are, for example, those obtained by forming on the panel substrate 3 a pattern of silver, then a pattern of oxide, and then a pattern of ceramics. Unlike this example, there are some cases where when a thick pattern cannot be formed at once, the pattern formation is performed several times to obtain a thickness. When several times of pattern formation are involved, such a collective baking as shown above is convenient.

(Endless Sheet)

Figure 3:
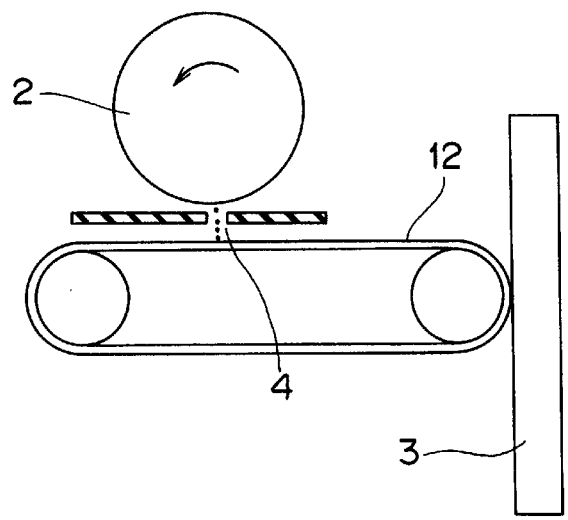
FIG. 3 is a view for explaining a transfer method using an intermediate member.

In the pattern forming method of the first embodiment of the present invention, it is also possible that after a pattern is temporarily formed on the surface of the intermediate member 12, which is implemented by a rotating endless sheet, with the jetted-out pattern-forming material particles I at the step (c) as seen in FIG. 3, this pattern on the intermediate member 12 is transferred onto the surface of the panel substrate 3. This intermediate member 12 may also be one definite sheet instead of an endless sheet. This intermediate member 12, provided by a film in which an electrically conductive filler is dispersed in a resin, has a resistance of about $10^8$ Ωcm. Application of the pattern-forming material particles to the intermediate member 12 is performed by applying a voltage to the back side of the intermediate member 12 as described above. Otherwise, the intermediate member 12 may be provided in a drum form other than the sheet form. The pattern transfer is performed by pressure-pushing from the intermediate member (e.g., intermediate body) 12 to the panel substrate 3.

Preferably, the intermediate member 12 is cleaned after the pattern transfer so as to be used repetitively. The thickness of the intermediate member 12 is not limited particularly, but preferably not more than 0.3 mm.

(Cleaning)

Figure 4:
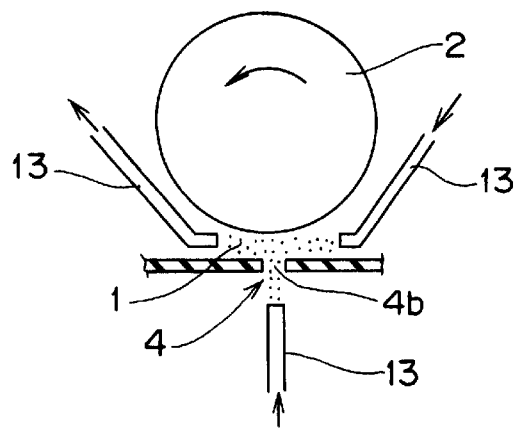
FIG. 4 is a view for explaining a particle cleaning method.

In the first embodiment of the present invention, the pattern forming method may further comprise a step (f) of removing the pattern-forming material particles I filling up or deposited around the inside of the nozzle 4. This step can be performed, for example, by sucking up the pattern-forming material particles I with a vacuum suction nozzle 13 as seen in FIG. 4. The removal may be done by, in addition to such methods employing an air jet, methods employing vibrations such as ultrasonic waves, or in combination of these methods. This particle removal operation is preferably performed periodically except at pattern formations.

Figure 5:
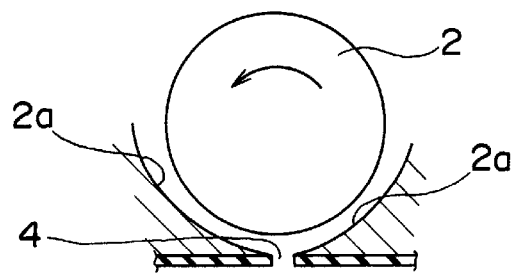
FIG. 5 is a view for explaining a method for preventing the nozzle hole from clogging.

In the first embodiment of the present invention, the particle feeder 2 may also be so made up that, as seen in FIG. 5, the particle feeder 2, being placed upper inward of the nozzle 4, has a sloped surface 2a along its lower peripheral surface with the lower end of this sloped surface 2a confronting the hole 4b of the nozzle 4. Eliminating any flat portions around the nozzle hole 4b like this can help to prevent the nozzle hole from occurrence of clogging.

(Vacuum Suction)

In the first embodiment of the present invention, in the case where the panel substrate 3 is held by a flat surface of the X-Y table 8 and the flat surface sucks up the panel substrate 3 by vacuum, even if the panel substrate 3 is so thin as to tend to undulate or warp, these tendencies can be solved by vacuum suction so that the distance between the panel substrate 3 and the nozzle 4 can be maintained constant.

In the case where the thickness of the panel substrate 3 is constantly measured by the laser displacement gauge 9b shown in FIG. 1, the distance between the nozzle 4 and the panel substrate 3 can be adjusted by making up-and-down movement of the nozzle casing 4a based on detection information derived from the measurement, so that some extent of undulation or warp of the panel substrate 3 can be solved by vacuum suction.

(Environment)

For the working of the first embodiment of the present invention, it is preferable that ambient temperature or humidity within the hopper 5, around the particle feeder 2, near the nozzle hole 4b, and other places are maintained constant so that the electrically charged state or jetted-out state of the pattern-forming material particles are maintained constant.

After the pattern formation, electric charges are preferably removed as soon as possible from the pattern-forming surfaces of the panel substrate 3 and the intermediate member 12. Therefore, it is preferable that parts involved in the pattern formation are covered with casing 4a, for example as shown in FIG. 1, so that an electrostatic stream or air stream is directed from inside to outside of the casing 4a so as to be applied to the pattern-forming surface of the panel substrate 3 or intermediate member 12. Equipment to be used for this may be given by an eraser.

(Hole Configuration)

Figure 6:
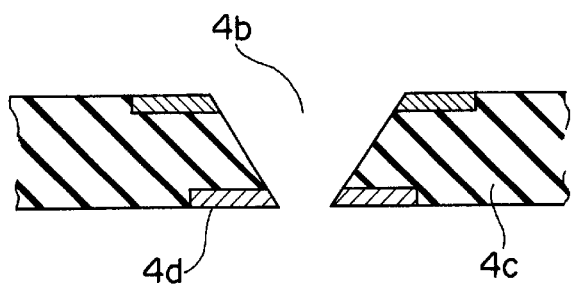
FIG. 6 is a view for explaining a modification example of the nozzle hole.

In the first embodiment of the present invention, the nozzle hole 4b can be a tapered hole which is wider on one side closer to the particle feeder 2 and narrower on the other side closer to the panel substrate 3, as seen in FIG. 6. In this case, the hole diameter can be made smaller without difficulties and without the need for forcedly reducing the diameter of the hole 4b.

In the first embodiment of the present invention, whereas the distance between the nozzle 4 and the panel substrate 3 is preferably suppressed to about 0.150±0.025 $\mu$m for better precision of patterning, it is recommendable for easier fulfilment of this that the FPC 4c having a passage hole 4b for the pattern-forming material particles 1 is supported in a state of tension. In addition, making the distance approach to 0.050±0.025 $\mu$m allows even better precision of patterning to be achieved.

Figure 7:
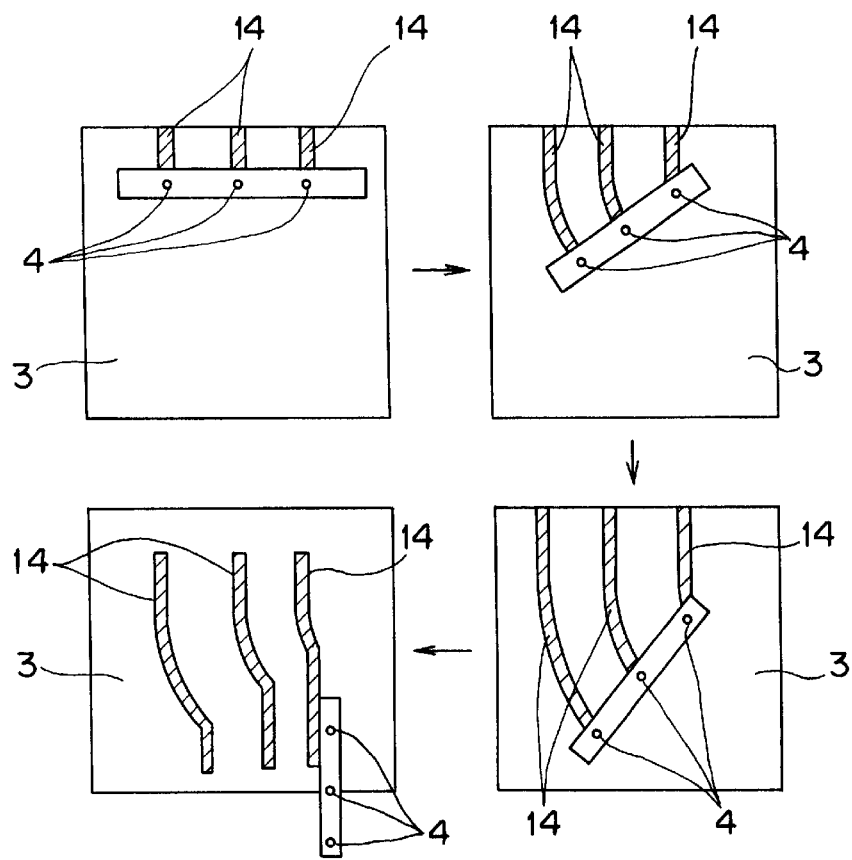
FIG. 7 is a view for explaining a state in which a plurality of nozzle holes are being rotated.

For diagonal-line patterns, their discontinuities can be solved by shifting little by little the position where jetted-out pattern-forming material particles 1 strike against the panel substrate 3. In this case, providing a plurality of holes 4b in array as seen in FIG. 7 with narrower intervals between one another makes the occurrence of dot lines unlikely to occur. It is also possible that the collision area of the pattern-forming material particles 1 against the panel substrate 3 is increased by the action of the control electrode 4d provided around the nozzle hole 4b. It is further possible that a plurality of nozzles 4 are provided in array and made rotatable as seen in FIG. 7, where reference numeral 14 denotes a pattern.

(Surface Treatment)

Scattering of the pattern-forming material particles 1 on the surface of the panel substrate 3 can be prevented by applying an adhesive solvent such as polyvinyl alcohol or turpentine oil to the surface of the panel substrate 3. The application method may be spraying process or dipping process.

A specific working example in which the above method is applied to the formation of PDP electrodes is 10 shown below. Component parts out of the following description are the same as those of the above description.

A glass panel as an example of the panel substrate 3 is sized 2.8 mm thick and 42 inches, 700 mm×500 mm. Its unevenness of glass thickness is +5 $\mu$m. The glass substrate has a transparent conductive film of about 1000 Å deposited on its surface and patterned with a laser. Surface irregularities of the glass were such that the glass substrate, when set to the X-Y table 8, was set into close contact by vacuum suction, the irregularities resulting in ±5 $\mu$m or less.

The pattern-forming material particles were fabricated from 70 wt % of 0.2 $\mu$m-dia. silver particles, 28 wt % of polyethylene resin, 1 wt % of a charge controlling agent, and 1 wt % of an external additive.

Characteristic controlling agents serve for control so that particles have negative charges, where monoazo dyes or their chromium complexes, salicylic metal salts, and the like are usable therefor.

On the surface of the pattern-forming material particles, are adhesively deposited about 0.1 $\mu$m-dia. fine particles of colloidal silica, titanium oxide, alumina, or the like as external additives. The reason for the use of these particles is to improve the fluidity of the pattern-forming material particles and to improve the charging amount of the pattern-forming material particles. Silver particles are very high in conductivity, the highest next to gold among metals, so that pattern-forming material particles fabricated therefrom cannot be high in charging amount. Therefore, it is appropriate to provide a feed roller which has a function of forced charging or which employs corona discharge. The corona charger may be provided normally by one that charges the surface of the photoconductor. The corona charger has a 50 $\mu$m dia. tungsten wire stretched, which a shielded with metal in its three peripheral directions. In its one direction, a meshed sheet is stretched. Applying a voltage of 5 kV or so to the wire causes corona discharge to occur, the discharge being transferred to the pattern-forming material particles over the mesh, by which the pattern-forming material particles are electrically charged. In this case, since the pattern-forming material particles are negatively charged, a negative voltage is applied to the wire. However, if the charger is too close to the pattern-forming material particles, the pattern-forming material particles would be melted by the discharge. The distance of the charger from the pattern-forming material particles is appropriately about 5 mm, and preferably 10 mm or more.

The mean particle size of the pattern-forming material particles was set to 6 $\mu$m. As to the fabrication method therefor, polyethylene resin was heated to 300° C. so as to be melted, and silver particles and charge controlling agent were mixed thereinto and sufficiently stirred with a propeller-shaped stirrer so as to be dispersed uniformly. This was followed by rapid refrigeration in a refrigerator so that the mixture is solidified. The resulting mass was ground into several mm squares with a hammer mill and a cutter mill, further ground into 0.5 to 15 $\mu$m with a grinding mill, classified so that coarse particles of 20 $\mu$m or more particle sizes as well as fine particles of 5 $\mu$m or less particle sizes are excluded, by which particle bodies were obtained. Then, fine particles of colloidal silica, titanium oxide, alumina, or the like were deposited on the surfaces of the particle bodies with a fast fluidizing mixer.

In the nozzle FPC 4c, copper electrodes and deflecting and lead-out electrodes were formed in pattern by photographic formation process on top and bottom of a polyimide sheet having a thickness of 100 $\mu$m, by which an electrically conductive film was formed on the surface of the sheet. This film is provided so that static electricity will not accumulate on the nozzle FPC 4c. The FPC 4c fabricated in this case was one having a hole diameter of 80 $\mu$m and ten holes.

A regulator blade used in this case was one formed by applying urethane or the like having a hardness of 40–80 (JIS (Japanese Industrial Standards) K6301, A) and elasticity to a metal sheet. Pattern-forming material particles are frictionally charged between the blade and a developing roller so as to be negatively charged. Although the pattern-forming material particles are negatively charged in the first embodiment of the present invention, the forming material particles and the frictionally charging material may be selected so that the pattern-forming material particles are positively charged.

With the blade, the pattern-forming material particles are formed into one to three layers on the roller. The regulator blade, although grounded to the earth normally, yet is used with a DC or AC current applied thereto for stronger charging of the pattern-forming material particles.

The developing roller is fabricated with stainless steel, aluminum, iron material, or their alloys and having preliminarily been polished, with a diameter of 16 mm and irregularities of within 2 µm.

A feed roller formed by covering a metal rod with urethane foam or synthetic rubber at a thickness of 2 to 6 mm was used. Its bite into the developing roller was set to about 0.1 to 2 mm.

As to the application control, a voltage of +300 V is applied to the lead-out electrode in response to an instruction from the personal computer, so that pattern-forming material particles are applied to the glass panel. Out of application, a voltage of −100 V is applied to the lead-out electrode, so that unnecessary pattern-forming material particles are prevented from falling onto the glass panel.

For application, a negative voltage of −100 was applied to the deflecting electrode so that the application width was converged, by which a 70 µm electrode line was drawn. If line drawing were done without the application of −100 V, the drawn pattern would be broadened line width or dotted around, so that the pattern-forming material particles would be scattered. By performing the application two times in overlay, a thickness of 20 µm was ensured. The application rate was 10 cm/sec.

Voltage application to the glass panel was fulfilled by applying a voltage of 1200 V to the X-Y table 8 placed thereunder.

First, the glass panel is coarsely set to the X-Y table 8. The glass panel is set by the position recognition units 9a so that a pair of markers present at opposing end portions of the glass panel can be seen evenly. The glass panel is vacuum-sucked up to the X-Y table 8. The X-Y table 8 has its surface irregularities suppressed to within ±5 µm or less.

The surface irregularities of the glass panel are within ±10 µm or less. When the panel substrate 3 is set up, the X-Y table 8 is driven by a built-in motor or the like to move along the rail 8A toward the nozzle 4. Then, by the laser displacement gauge 9b, position and thickness of the panel surface are detected, information thereabout is transferred to the control system 8, and then the position of the nozzle 4 is driven by the up-and-down driver unit to move up and down along the vertical rail 10a. When the glass panel 3, going on the movement, has come under the nozzle 4, a voltage is applied from the personal computer 9c to the lead-out electrode so as to effectuate the application of the pattern-forming material particles 1, by which the pattern-forming material particles 1 are applied to the glass panel 3. The nozzle 4 is driven by the right-and-left driver unit to move along the rail 10b from one end of the glass panel 3 toward the other end, where when the nozzle 4 has come to the other end of the glass panel 3, the voltage changes from +300 V to −100 V, causing the application to be halted. Thereafter, the nozzle 4 is driven by the right-and-left driver unit to move along the horizontal rail 10b from the other end of the glass panel 3 to its one end, converse to the foregoing, by which a similar pattern drawing is carried out. At the time of this application or application halt, as required, the X-Y table 8 has its ball screw 8A for use of panel substrate movement driven by a motor or the like to rotate as described before, so that the X-Y table 8 coupled to the nut member 8C screwed to the ball screw 8A is moved along a pair of rails 8B on both sides, thus moving the glass panel 3.

Through repetitions of this operation, an electrode pattern is formed all over the glass panel.

After the pattern drawing with the pattern-forming material particles 1, the glass panel 3 was heat-treated on a hot plate at 180° C. for 10 minutes, by which the pattern-forming material particles 1 were fixed to the glass panel 3. Thereafter, by heat treatment at 600° C., resins were evaporated and the pattern-forming material particles 1 were baked, by which a silver electrode was fabricated. The fabricated electrode was 80 µm wide, 6 µm thick, and 2.5 µΩcm in resistance. In steps following this, an insulating film is fabricated on this electrode in the front of the panel by die coating or the like. In the case of a top surface plate, the MgO film is formed by deposition, where the top surface plate is completed. In the case of a back plate, barriers are formed on the insulating film and fluorescent films are formed on the barriers, where the back plate is completed. The two panels are seal-fitted together, followed by air discharge and gas introduction, by which the PDP is completed. After this, attachment members such as circuits and the panel are assembled together, thus a television is completed.

Figure 10:
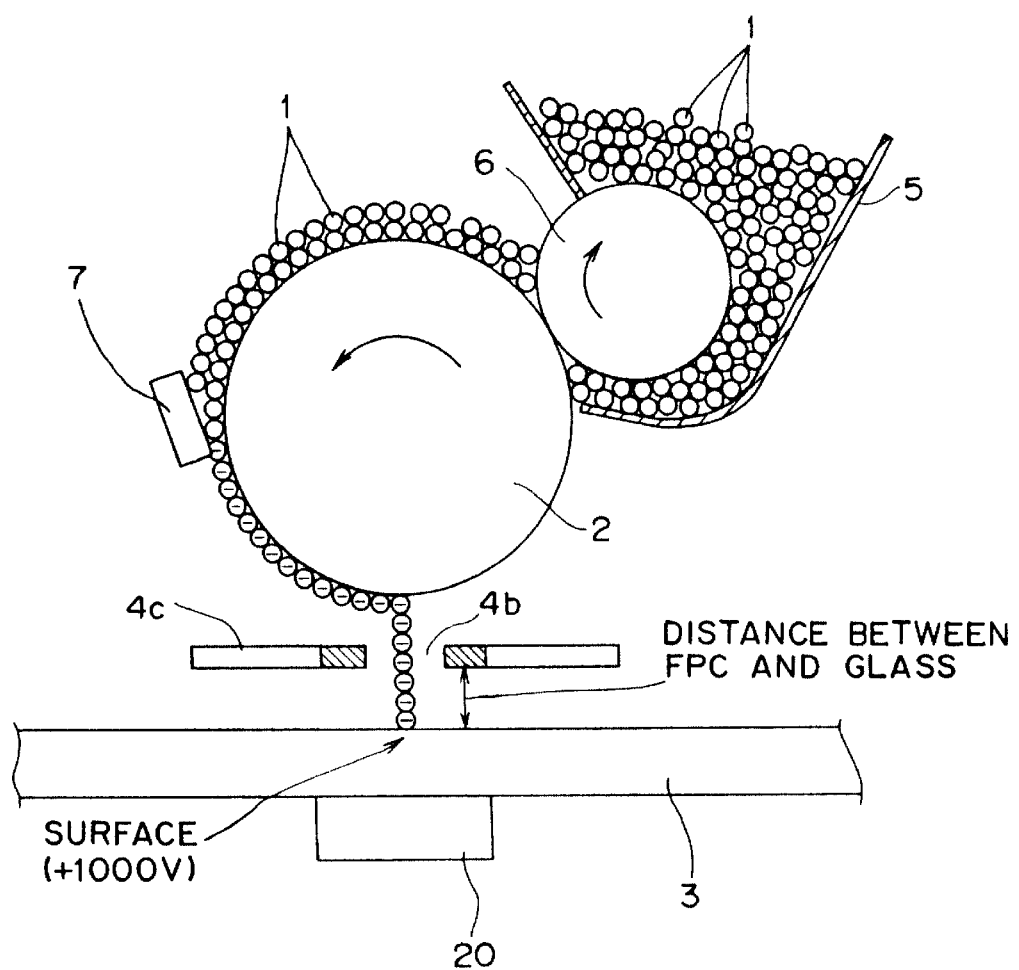
FIG. 10 is an explanatory view in a case in which a thin line is drawn.
Figure 12:
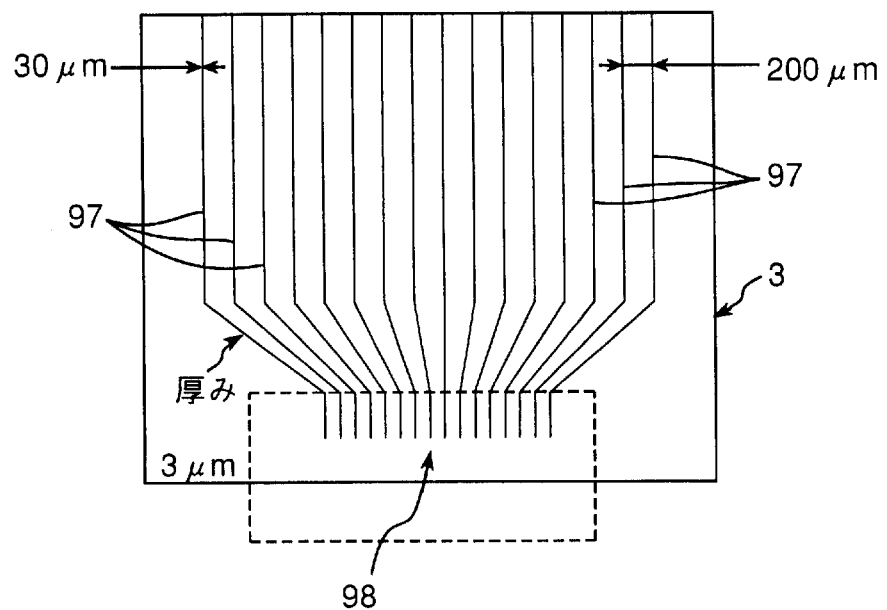
FIG. 12 is an explanatory view of a state in which electrodes including terminal parts of a PDP with adjacent intervals are very small are formed.

A case in which a line thinner than that of FIG. 2 is drawn with this pattern forming apparatus is shown in FIG. 10. As a specific example of the case in which such a thin line as shown in FIG. 10 is drawn, each of the circular holes 4b with ninety control electrodes 4d disposed around in the FPC 4c of the nozzle 4 has an inner diameter of 60 µm, the interval pitch of the holes 4b being 125 µm, as shown in FIG. 11, in which case electrodes 97 including PDP terminal portions 98 with a very smaller neighboring pitch can be formed as shown in FIG. 12. In FIG. 12, the interval pitch of the electrodes 97 except the terminal portions 98 is 200 µm, each electrode 97 having a width of 30 µm and a thickness of 3 µm.

Figure 13:
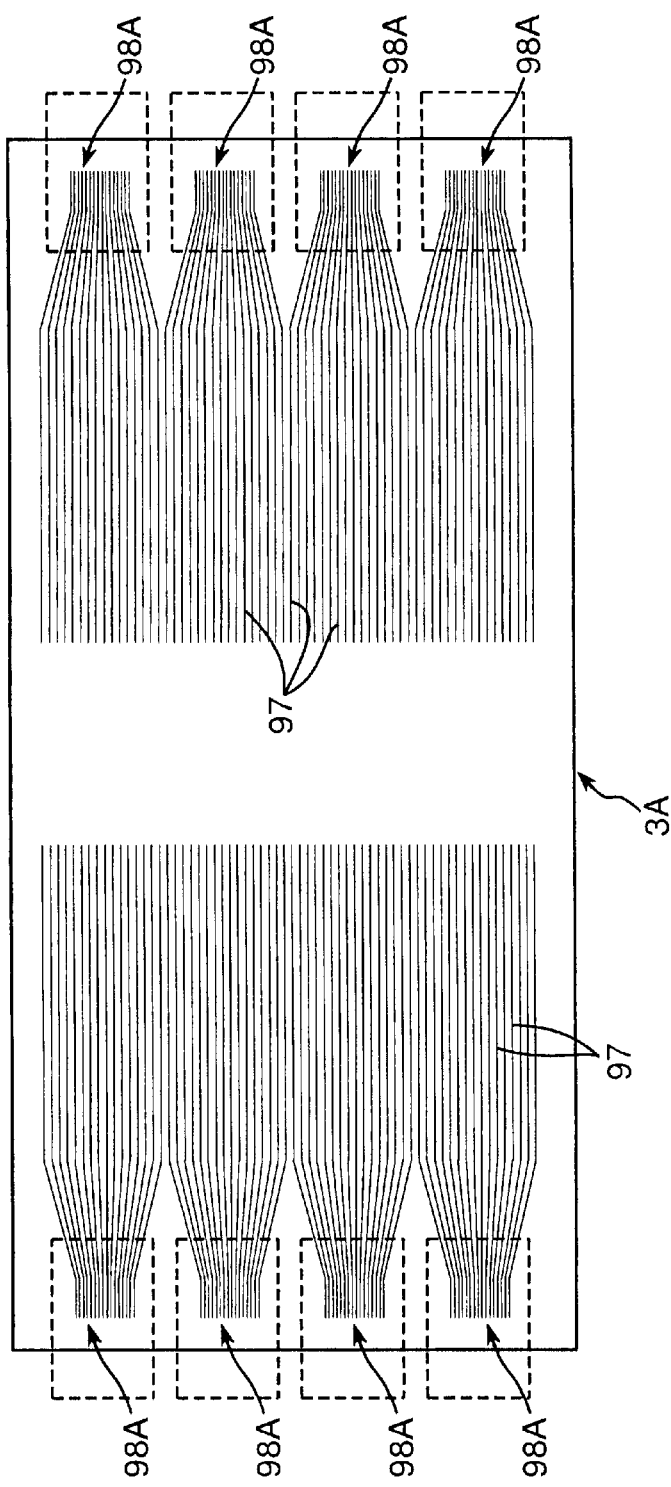
FIG. 13 is a view of a front glass plate of a PDP formed by the pattern forming apparatus.
Figure 14:
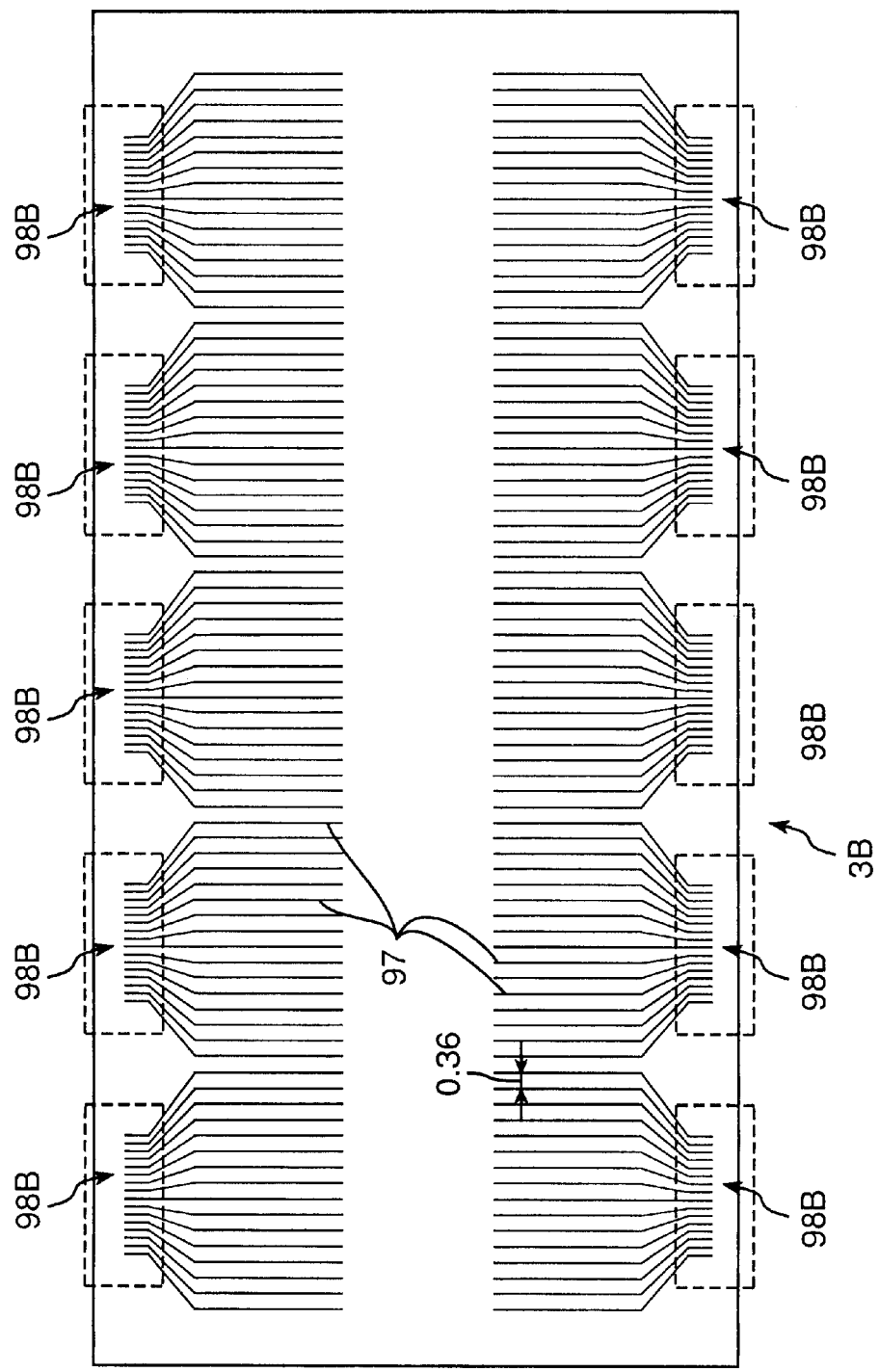
FIG. 14 is a view of a back glass plate of a PDP formed by the pattern forming apparatus.

A more concrete example in which electrodes are formed on a front glass plate 3A (750 mm×600 mm) of a PDP with the pattern forming apparatus is shown in FIG. 13. In this case, the neighboring pitch of the electrodes becomes smaller in terminal portions 98A, the interval pitch between the electrodes 98A except the terminal portions being 400 µm and the thickness of each electrode being 3 µm. Further, an example in which electrodes are formed on a back glass plate 3B (750 mm×600 mm) of a PDP with the pattern forming apparatus is shown in FIG. 14. In this case, the neighboring pitch of the electrodes becomes smaller in terminal portions 98B, the interval pitch between the electrodes 98B except the terminal portions being 360 µm and the thickness of each electrode being 3 µm.

Next, parameter correlations of the back voltage, the lead-out voltage, the distance L1 between the FPC 4c and the panel substrate 3, the convergence voltage for the deflecting electrode 4e, the application rate of the nozzles, the number of times of applications, to the line thickness and width of the electrodes, respectively, are as follows.

Figure 17:
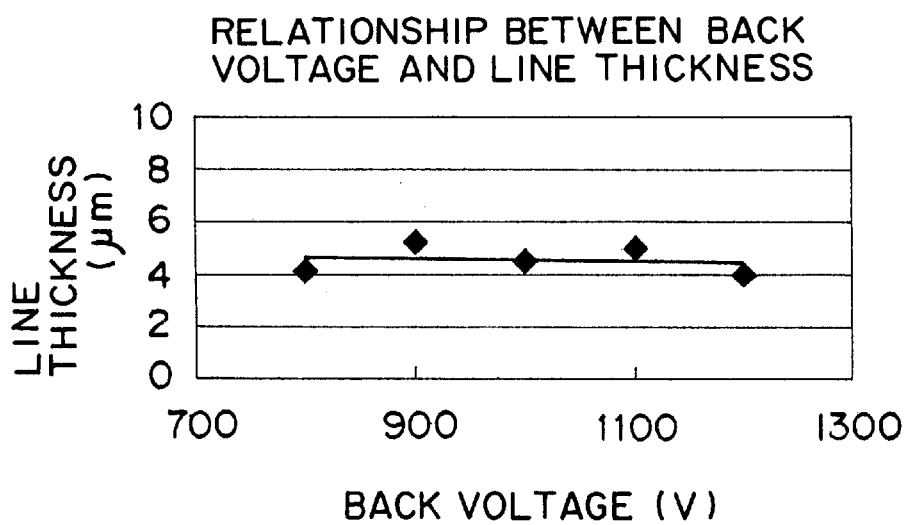
FIG. 17 is a chart showing the relationship between back voltage and line thickness.
Figure 18:
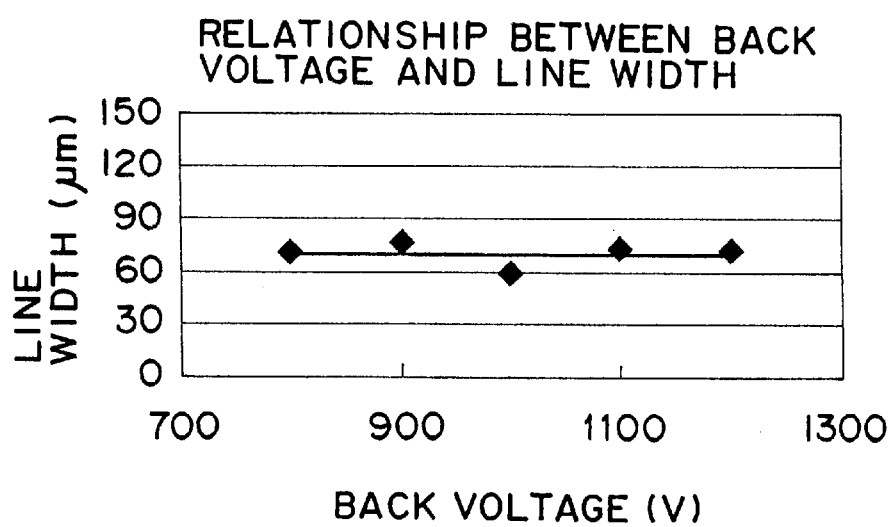
FIG. 18 is a chart showing the relationship between back voltage and width.

As shown in FIGS. 17 and 18, in the relationship between the back voltage and the line thickness or width, the line thickness or width shows almost no changes even if the back voltage is changed over a range of 800 V-1200 V. It follows that there is no relationship between the back voltage and the line thickness or width.

Figure 19:
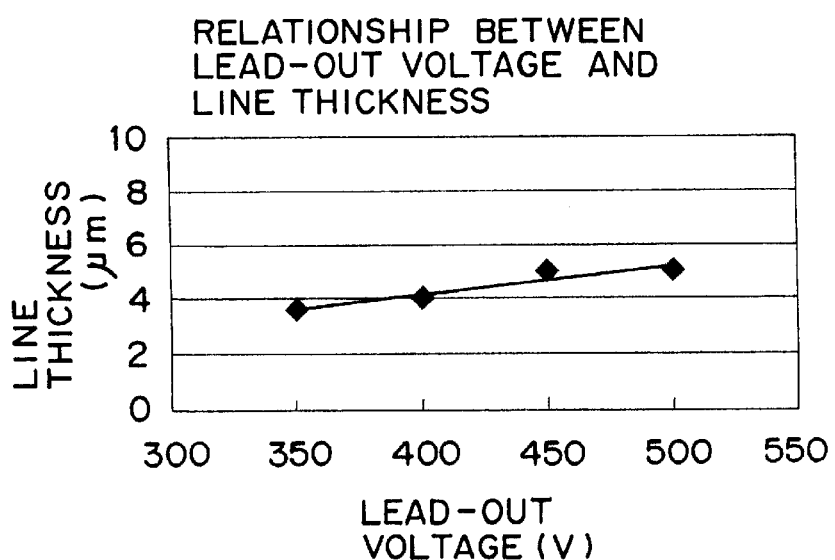
FIG. 19 is a chart showing lead-out voltage and line thickness.
Figure 20:
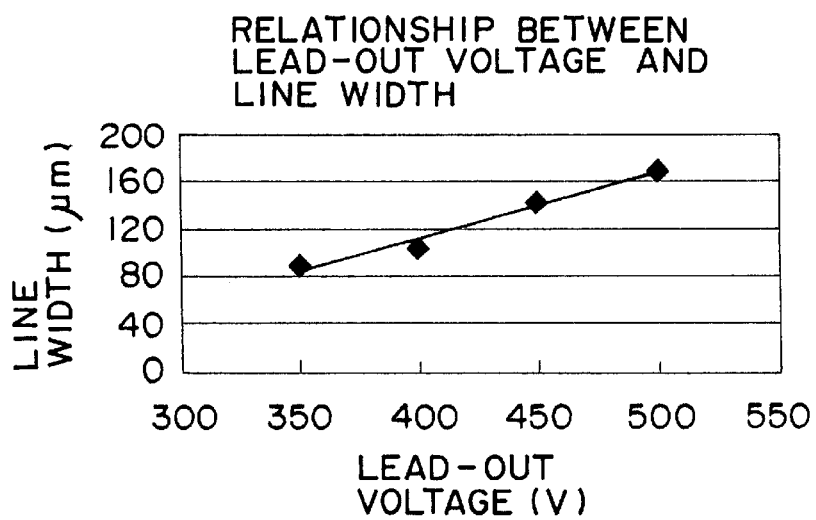
FIG. 20 is a chart showing lead-out voltage and line width.

In contrast to this, in the relationship between the lead-out voltage and the line thickness, as shown in FIG. 19, as the lead-out voltage varies from 350 V to 500 V, the line thickness increases from 3.5 µm to 5 µm, showing that a directly proportional relation holds. Also, as shown in FIG. 20, in the relationship between lead-out voltage and line width, as the lead-out voltage varies from 350 V to 500 V, the line width increases from 83 µm to 165 µm, showing that a directly proportional relation holds.

Figure 21:
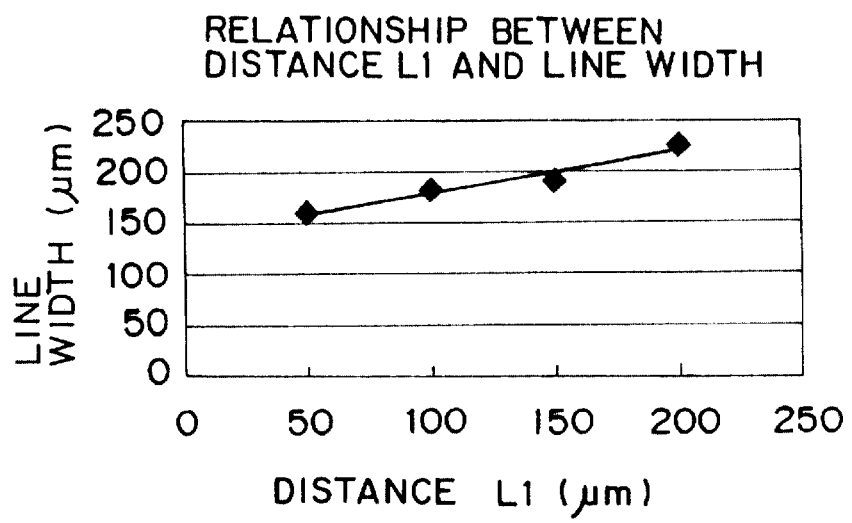
FIG. 21 is a chart showing the relationship between an FPC to panel-substrate distance L1 and line width.
Figure 22:
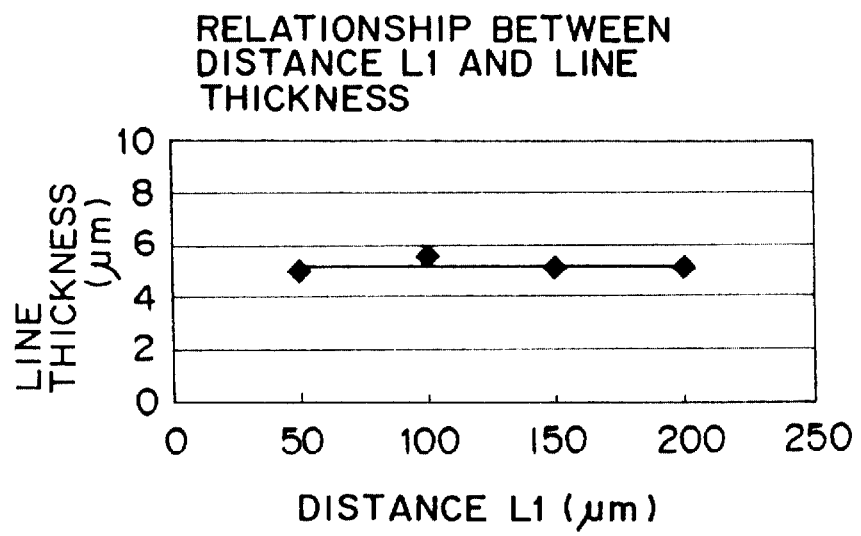
FIG. 22 is a chart showing the relationship between the distance L1 and line thickness.

Further, as shown in FIG. 21, the relationship between the distance L1 between the FPC 4c and the panel substrate 3 and the line width, as the distance L1 varies from 50 µm to 300 μm, the line width increases from 155 μm to 225 μm, showing that a directly proportional relation holds. In contrast to this, as shown in FIG. 22, in the relationship between the distance L1 and the line thickness, even if the distance L1 varies from 50 μm to 300 μm, the line thickness remains constant, 5 μm, without any changes, showing that there is no relations between the distance L1 and the line thickness.

Figure 23:
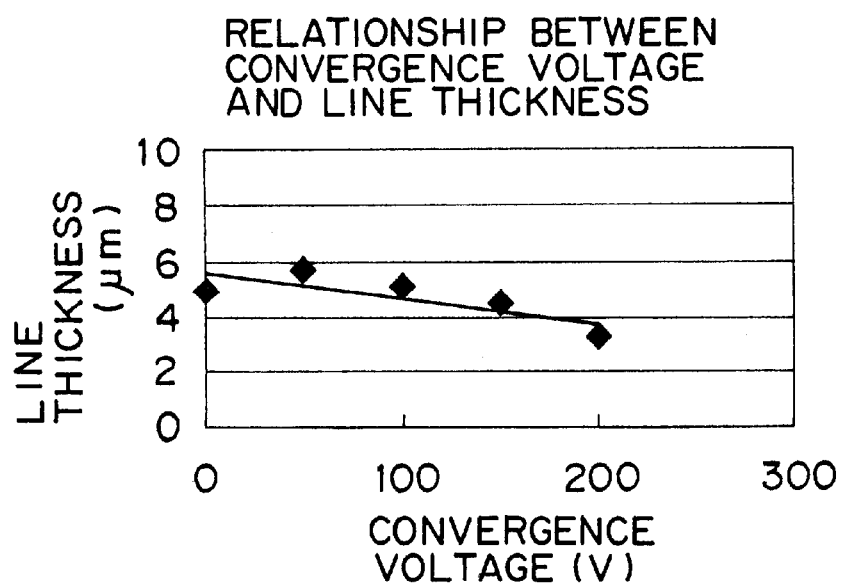
FIG. 23 is a chart showing the relationship between convergence voltage and line thickness.
Figure 24:
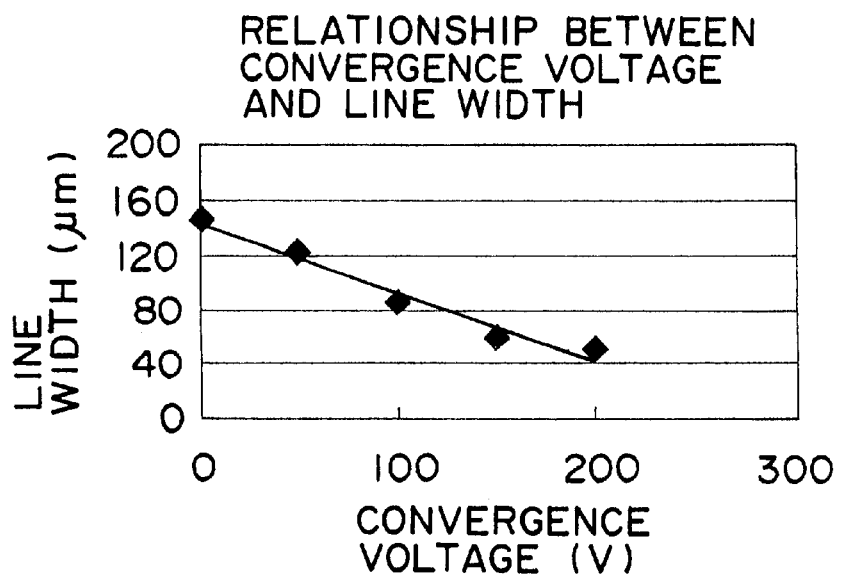
FIG. 24 is a chart showing the relationship between convergence voltage and line width.

Also, as shown in FIG. 23, in the relationship between the convergence voltage and the line thickness, as the convergence voltage varies from 0 V to 200 V, the line thickness decreases from 5.8 μm to 3.8 μm, showing that an inversely proportional relation holds. As shown in FIG. 24, in the relationship between the convergence voltage and the line width, as the convergence voltage varies from 0 V to 200 V, the line width decreases from 135 μm to 40 μm, showing that an inversely proportional relation holds.

Figure 25:
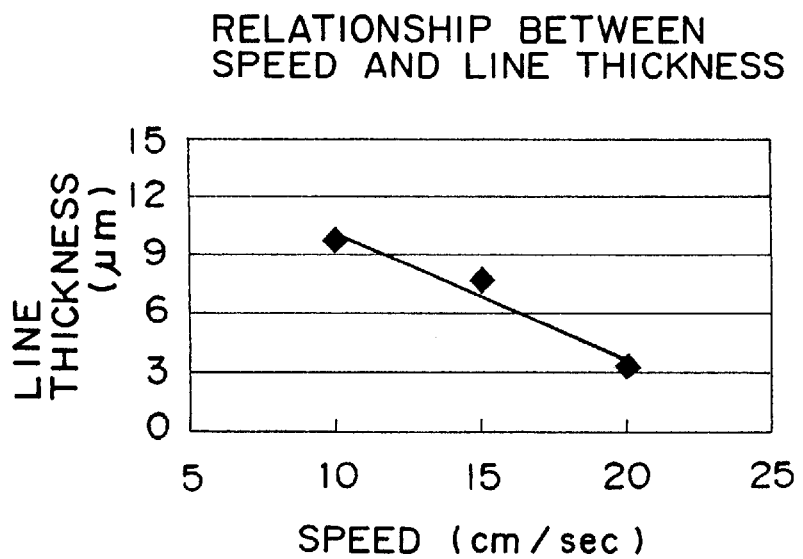
FIG. 25 is a chart showing the relationship between the nozzle's application speed and the line thickness.
Figure 26:
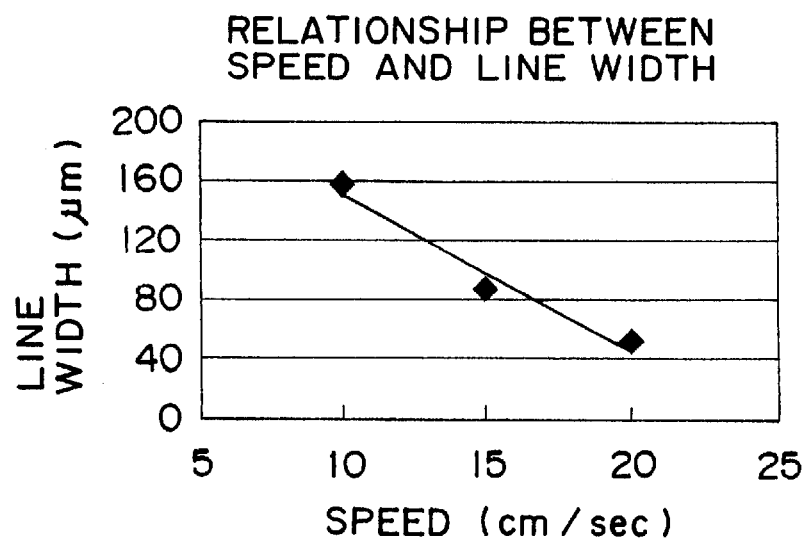
FIG. 26 is a chart showing the relationship between the nozzle's application speed and the line width.

Further, as shown in FIG. 25, in the relationship between the speed (cm/sec.) and the line thickness, as the speed varies from 10 to 20 (cm/sec.), the line thickness decreases from 9.5 μm to 3 μm, showing that an inversely proportional relation holds. As shown in FIG. 26, in the relationship between the speed and the line width, as the speed varies from 10 to 20 (cm/sec.), the line width decreases from 158 μm to 45 μm, showing that an inversely proportional relation holds.

Figure 27:
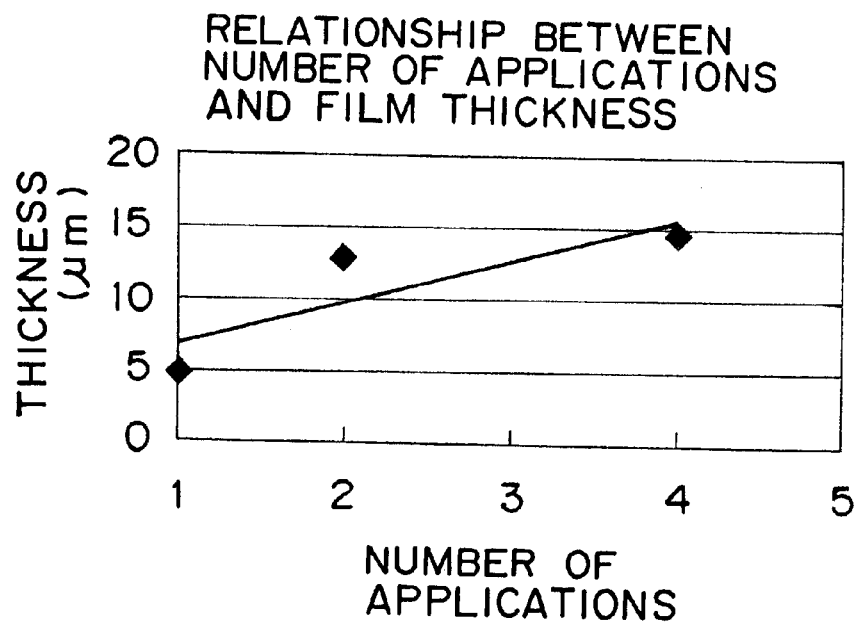
FIG. 27 is a chart showing the relationship between the number of applications and the line thickness.
Figure 28:
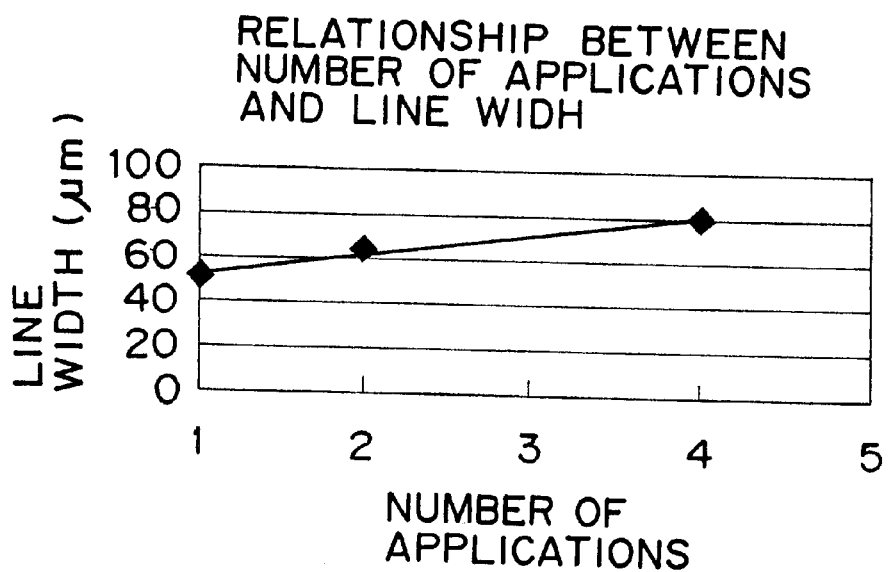
FIG. 28 is a chart showing the relationship between the number of applications and the line width.

Further, as shown in FIG. 27, in the relationship between the number of times of application and the line thickness, as the number of times of application varies from 1 to 4 times, the line thickness increases from 7 μm to 15.2 μm, showing that a directly proportional relation holds. As shown in FIG. 28, in the relationship between the number of times of application and the line width, as the number of times of application varies from 1 to 4 times, the line width increases from 50 μm to 80 μm, showing that a directly proportional relation holds.

As an example, conditions for the formation of electrodes as PDP electrodes are as follows. After a pattern is formed on the panel substrate 3 with the pattern-forming material particles 1, the pattern is fixed at 120° C. and baked at 600° C., by which electrodes for PDP use can be completed. In this conjunction, for the formation of PDP-use electrodes, first, it is necessary that resin components within the pattern-forming material particles 1 do not remain on the panel substrate 3 after the baking at 600° C. If the resin components remain, the electrodes would increase in resistance value so as to be unusable as electrodes. It is also necessary that the electrodes have a resistivity of 4 μΩ/cm or less as PDP electrodes. Further, it is impermissible that irregularities are present on the electrode surface. This is because irregularities would cause a voltage to be needed for discharge, where the voltage would be concentrated to protrusive irregular portions, resulting in dielectric breakdown. In order to achieve the conditions as PDP electrodes including no remaining of resin components, electrode resistivities of 4 μΩ/cm or less, and absence of irregularities on the electrode surfaces, it is recommendable to lower the fixing and melting temperatures by using low-molecular weight resins as a component of the pattern-forming material particles 1, in which case the pattern configuration becomes round and the resin components become easier to pull out by baking.

The pattern forming method incorporating a direct patterning in the first embodiment is completed basically by the two steps of the application step and the baking step. By contrast, the conventional ink jet pattern method is completed by the three steps of an application step, a drying step, and a baking step, while the die-coat photographic method requires the six steps of an application step with a die coating nozzle, a drying step, an exposure step, a developing step, a drying step, and a baking step, and the printing photographic method requires the six steps of an application step with a squeegee, a drying step, an exposure step, a developing step, a drying step, and a baking step. Therefore, as compared with other conventional methods, the pattern forming method of the first embodiment as described above requires fewer steps.

According to the method and apparatus for forming a pattern onto a panel substrate in the first embodiment of the present invention, since the process for forming a desired pattern onto a substrate constituting a large-scale panel for PDPs (Plasma Display Panels), liquid crystal panels, circuit boards, or the like is simplified, a panel on which a pattern is formed can be manufactured with low price, and yet a high-precision fine pattern can be formed on the panel substrate.

In the following description, similar members or apparatuses or similar functions or operations in conjunction with the pattern forming apparatus and method of the first embodiment are designated by the same names or reference numerals for easier cross-reference.

(Second Embodiment)

Next, a second embodiment of the present invention relates to pattern-forming material particles to be used in a pattern forming apparatus for forming a desired pattern onto a panel substrate constituting a large-scale panel for PDPs, liquid crystal panels, circuit boards, or the like, as well as a pattern forming method with the pattern-forming material particles.

The method of the first embodiment has a potentiality that the following issues related to pattern-forming material particles may occur.

① Since pattern-forming material particles are deposited onto the surface of the panel substrate by means of electrostatic force, it is necessary that the pattern-forming material particles be insulative particles to be electrically charged. As a result, for some panel substrates, it may become difficult to make electrically conductive electrode material particles deposited directly onto the panel substrate.

In preparing charged particles by coating conductive particles with an insulating material, there are some cases, depending on the material, where the conductive particles cannot be completely covered with resin. As a result, the pattern-forming material particles may deteriorate in insulating property, lowering in charging amount, so that the pattern-forming material particles in some cases cannot be applied by electrostatic force.

② For some materials, it may become difficult to obtain a film thickness necessary for a pattern.

Assuming that the content of conductive particles to be contained in the pattern-forming material particles which are to be electrically charged is about 20 vol % as an example, a necessary pattern film thickness is obtained by applying an insulator of a film thickness five times the necessary pattern film thickness and by performing a baking process to evaporate the insulator. Since the diameter of common pattern-forming material particles is about 10 μm, forming a pattern from one layer of pattern-forming material particles arrayed in the one-particle height results in a film thickness of 2 μm after baking. Given a 6 μm diameter of pattern-forming material particles with a view to enhancing the pattern precision, a film thickness of 1.2 μm is obtained after the baking. If the target film thickness is 5 μm, the pattern-forming material particles need to be stacked to four layers. Increased numbers of stacked layers could cause the particles to go out of the pattern, resulting in deteriorated pattern precision.

The object of the second embodiment of the present invention is to solve these and other issues and provide pattern-forming material particles, for use in the pattern forming apparatus, which are usable for the foregoing first embodiment or other embodiments and which have enough insulation characteristic to be applicable by electrostatic force, as well as a pattern forming method, with the use of the pattern-forming material particles, which allows enough precision to be obtained in the resultant pattern even if the pattern-forming material particles are stacked into a plurality of layers.

As a solution to the above object, in the second embodiment of the present invention, the pattern-forming material particles to be used in the pattern forming apparatus are pattern-forming material particles, for use in a pattern forming apparatus, which are, after electrically charged, jetted out by electrostatic force so as to be deposited onto the surface of the panel substrate directly or via an intermediate body, thereby forming a pattern, where the pattern-forming material particles are constituted of a resin material evaporated by baking, and a constituent material particle disposed in this resin material and functioning to form a pattern.

With this constitution, since the constituent material particle made from an electrically conductive material for use of electrode formation or a material that cannot stably hold a stable electrostatic amount is coated with the resin material that is evaporated by baking, a pattern-forming material particle having a good insulating property can stably be obtained so that a stable patterning onto the panel substrate can be achieved by means of electrostatic force. As a result of this, a desired pattern can be formed successfully with high precision on a substrate constituting a large-scale panel for PDPs, liquid crystal panels, circuit boards, or the like. Moreover, since the process for pattern formation is simplified, a panel substrate with a pattern formed thereon can be manufactured with low price.

In the pattern forming method with the pattern-forming material particles, for the process in which the pattern-forming material particles, after electrically charged, are jetted out by electrostatic force so as to be deposited onto the surface of the panel substrate, thereby forming a pattern, it is also possible that the pattern-forming material particles are stacked on the panel substrate in the form of a plurality of layers, so that the pattern-forming material particles will be deposited in a wide-bottom shape with the lower layers, or layers closer to the panel substrate, increasingly wider in width.

With this constitution, since the pattern-forming material particles, when patterned and deposited in a plurality of layers, are stacked in a wide-bottom shape top-to-bottom-divergent shape, the pattern-forming material particles of upper layers are less likely to drop downward at edge portions, thus eliminating the possibility that the dropped pattern-forming material particles are deposited onto non-pattern portions. Thus, any deterioration of pattern precision can be prevented beforehand.

Hereinbelow, the pattern-forming material particles to be used for the pattern forming apparatus according to the second embodiment of the present invention, as well as a pattern forming method with the pattern-forming material particles, are described in detail with reference to the accompanying drawings.

First, the pattern forming apparatus is described.

Figure 29:
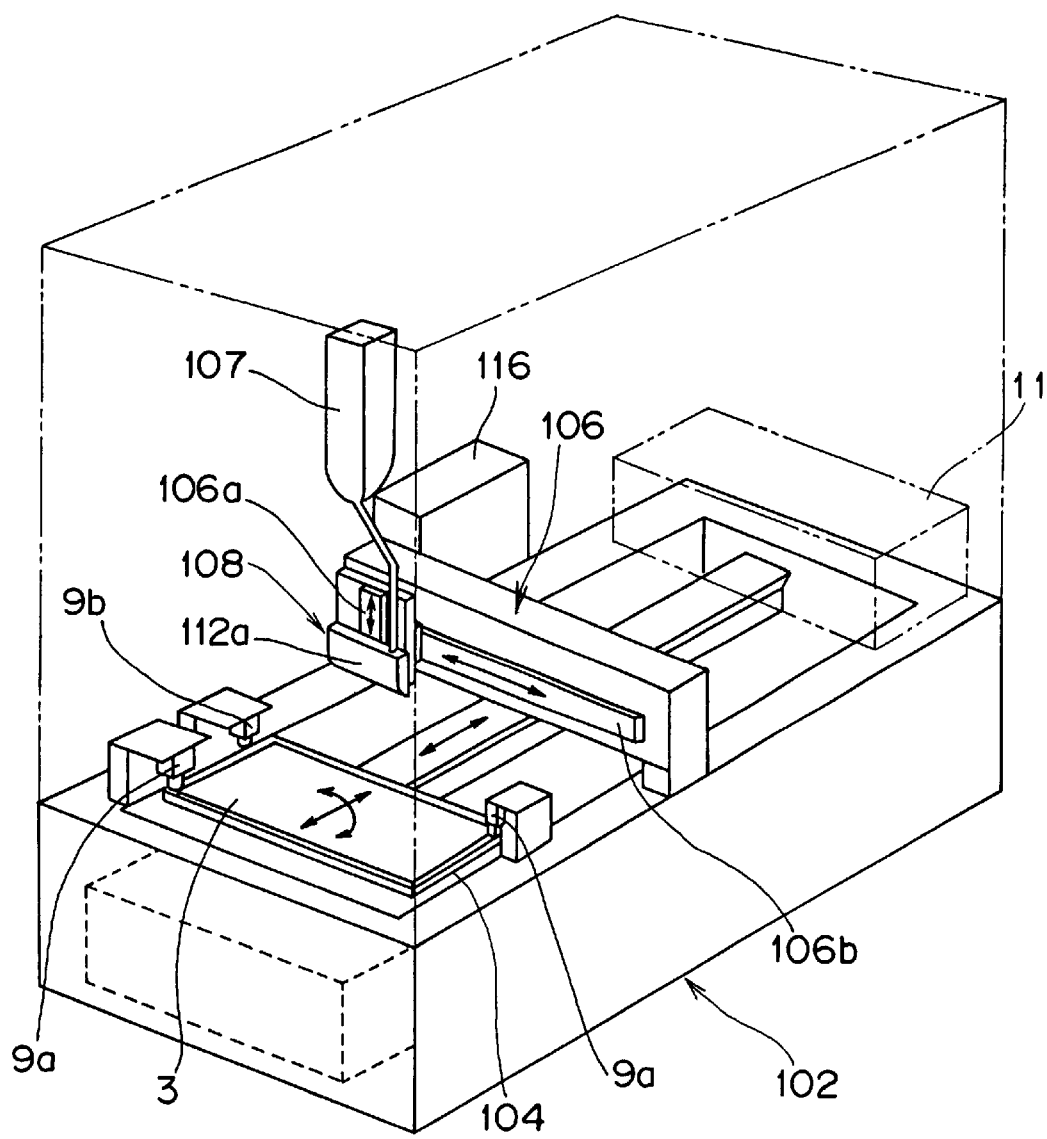
FIG. 29, showing an embodiment of the pattern-forming material particles according to a second embodiment of the present invention, is a perspective view of a pattern forming apparatus which uses these pattern-forming material particles.

The pattern forming apparatus, as shown in FIG. 29, is equipped with, on an apparatus base 102, a movable stage 104 movable in back-and-forth and right-and-left directions with a glass plate or other panel substrate 3 hold thereon, a support frame 105 stretched over a movable space of the movable stage 104, and a particle feeder 108 which is supported to the support frame 105 via a mover unit 106 having a horizontal rail 106b and a vertical rail 106a and which feeds pattern-forming material particles 1, fed from a particle tank 107, to the surface of the panel substrate 3.

Figure 30:
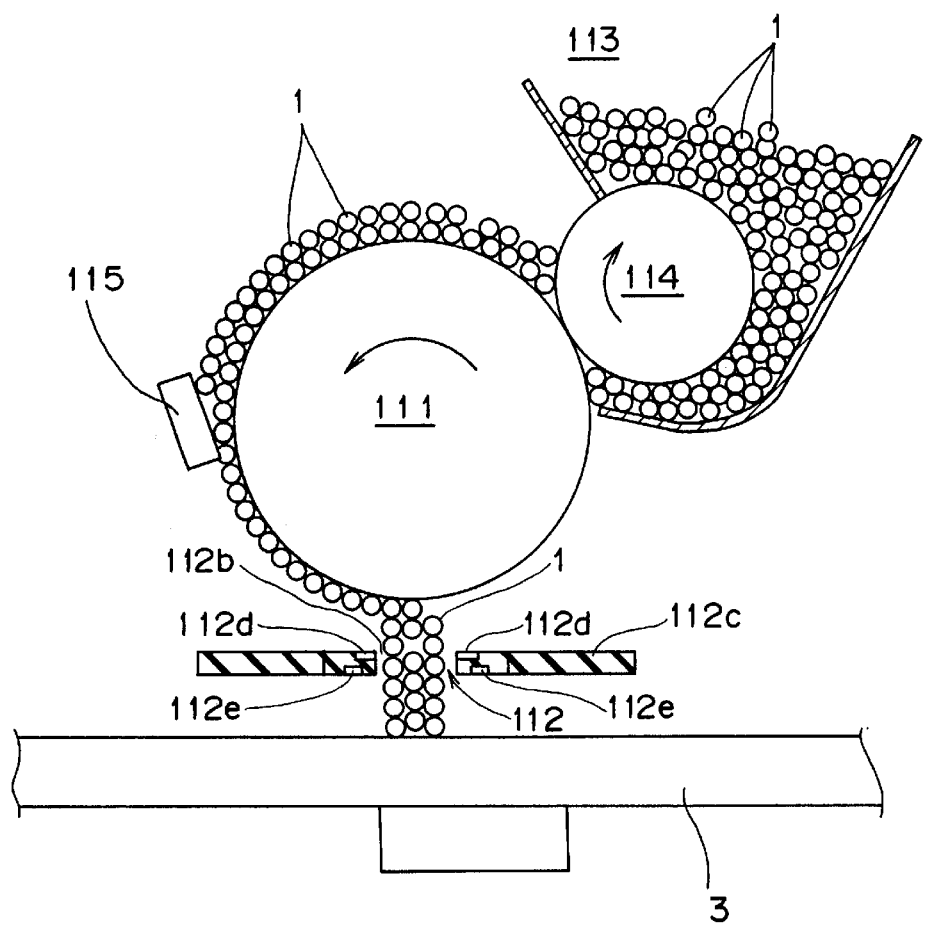
FIG. 30 is an enlarged side sectional view representing a part of the pattern forming apparatus according to second embodiment.

The particle feeder 108, as shown in FIG. 30, has a particle feeder 111 of, for example, a roller form for carrying and conveying the pattern-forming material particles 1, and a nozzle 112 disposed between the particle feeder 111 and the panel substrate 3, the nozzle 112 being housed in a casing 112a. Within a hopper 113 for storing therein the pattern-forming material particles 1, is a particle feed roller 114 which rotates to transfer the pattern-forming material particles 1 stored in the hopper 113 to the particle feeder 111. The pattern-forming material particles 1 carried from the particle feed roller 114 onto the outer peripheral surface of the particle feeder 111 are transferred as they are stacked in a plurality of layers on the outer peripheral surface, on the way of which the pattern-forming material particles 1 are rubbed against a blade 115 so as to be negatively charged and moreover regulated to a thickness of one to three layers. Then, upon reaching the nozzle 112 in which a nozzle hole 112b that allows the pattern-forming material particles 1 to pass through is formed in an FPC (Flexible Printed Circuit) 112c, the pattern-forming material particles 1 that have reached the position of the nozzle 112 are jetted out from the particle feeder 111 to the surface of the panel substrate 3 via the nozzle hole 112b under the voltage control by a control electrode 112d provided in the FPC 112c.

The panel substrate 3 is under a voltage application so that its surface becomes +1000 V with respect to the particle feeder 111, while the control electrode 112d, out of the jet state, is under a voltage application of −100 to −200 V with respect to the particle feeder 111. Then, at the jet state, the voltage of the control electrode 112d is brought to 0 V, by which the negatively charged pattern-forming material particles 1 are jetted out to the surface of the panel substrate 3 by electrostatic force.

In addition to the control electrode 112d for turning on/off the jet-out of the pattern-forming material particles 1, a deflecting electrode 112e is buried around the nozzle hole 112b, so that the pattern-forming material particles 1 are controlled in their jet-out angle by the action of the deflecting electrode 112e. The deflecting electrode 112e serving for such action is normally placed at opposing positions in four directions with the nozzle hole 112b interposed therebetween, so that the jet stream of the pattern-forming material particles 1 can be deflected toward one direction of the back-and-forth direction or the right-and-left direction. Accordingly, the nozzle 112 and the panel substrate 3 are relatively moved by the movable stage 104 and the mover unit 106, so that a desired pattern (not shown) can be formed with the pattern-forming material particles 1 jetted out from the nozzle 112 by appropriately combining the control of the jet-out angle of the pattern-forming material particles 1 and the change of the position of the panel substrate 3. The ON/OFF operations of the move and the pattern formation are controlled by a control board 116.

Figure 36A:
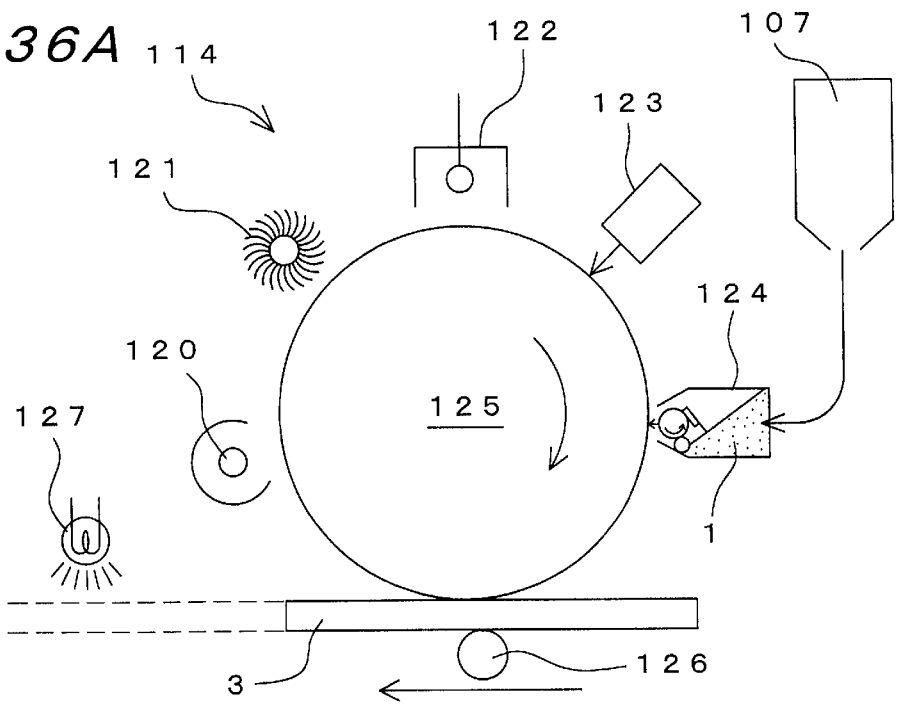
FIG. 36A is a structural view showing the basic unit of another pattern forming apparatus according to the second embodiment.
Figure 36B:
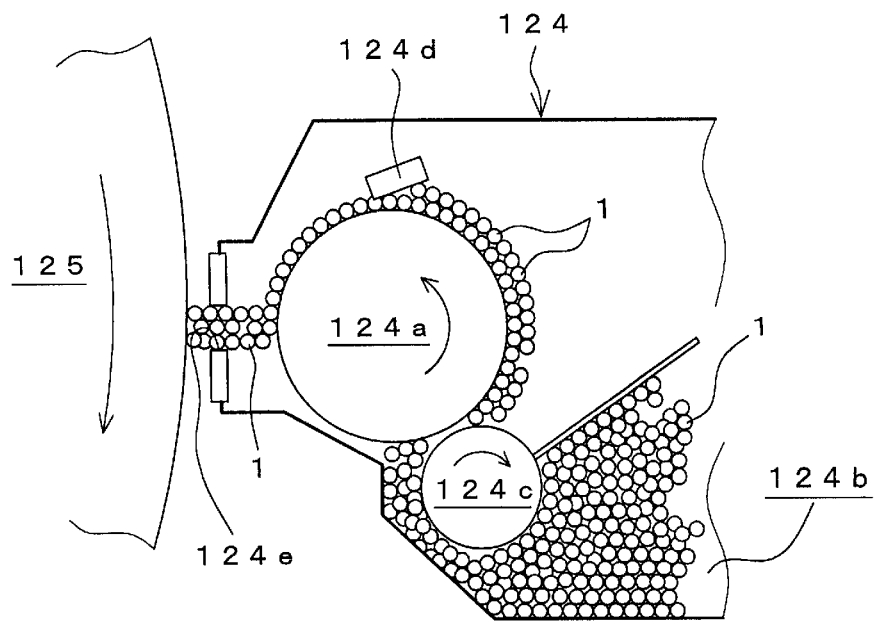
FIG. 36B is an enlarged sectional view showing a developing device of the basic unit.
Figure 37A:
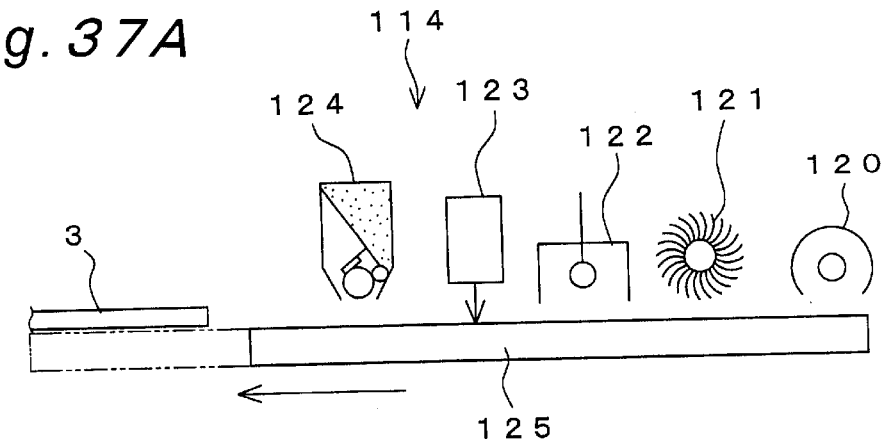
FIGS. 37A and 37B are structural views showing still another pattern forming apparatus according to the second embodiment.
Figure 37B:
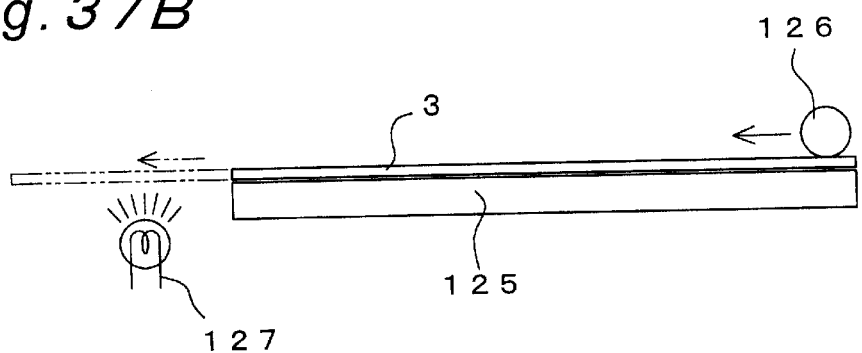
Figure 38:
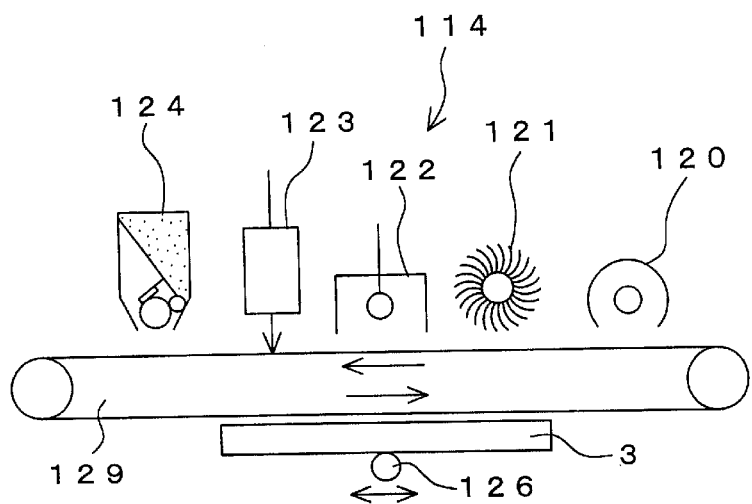
FIG. 38 is a structural view showing the basic unit of yet another pattern forming apparatus according to the second embodiment.

In this pattern forming apparatus, the pattern-forming material particles 1 are deposited from the nozzle 112 of the particle tank 107 directly onto the surface of the panel substrate 3. Otherwise, it is also possible that, as shown in FIGS. 36, 37, and 38, an intermediate body 125, 128, or 129 of a columnar, platy, or endless-band shape having a photoconductor or an electrostatic-pattern forming member and capable of forming an electrostatic pattern is placed between a developing unit (particle-feeding developing device) 124 having a nozzle, and the panel substrate 3, where the pattern is transferred from the intermediate body 125, 128, or 129 onto the surface of the panel substrate 3 by electrostatic force. It is noted that a basic unit 114 shown in the figure is provided with an eraser (erasing device) 120, a cleaner (cleaning device) 121, an electric charger (electrostatic-pattern forming device) 122, an exposure device (electrostatic-pattern forming device) 123, the developing unit 124, and the intermediate body 125, while the apparatus base 102 is provided with a voltage generator (transfer device) 126 and a fixing unit (fixing device) 127. Also, the developing unit 124 is provided with a metallic roller 124a, a storage section 124b, a particle feed roller 124c, a blade 124d, and a nozzle opening 124e.

The pattern-forming material particles 1 to be used in the above pattern forming apparatus contain a resin material for holding static electricity and a constituent material for constituting the pattern, where the resin will be evaporated by baking after the pattern formation.

Next, the structure of the pattern-forming material particles 1 for the use of PDP electrode formation, as well as the manufacturing method for the pattern-forming material particles 1, are described with reference to FIGS. 31 to 34.

Figure 31A:
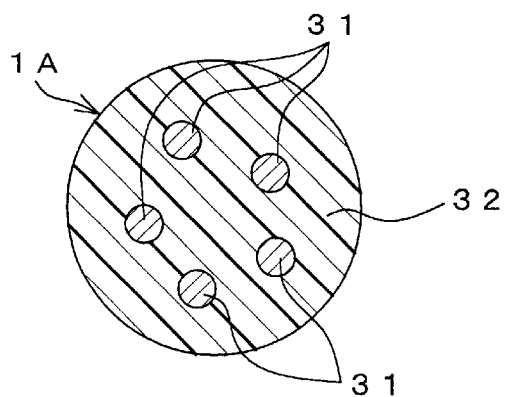
FIGS. 31A, 31B, and 31C are sectional views for explaining a structure of the pattern-forming material particles according to the second embodiment.

FIG. 31A shows a pattern-forming material particle 1A having a structure that a plurality of pieces of one kind of electrode-constituting material particles, e.g., small-diameter silver particles 31 are dispersed uniformly in a resin material 32.

The pattern-forming material particle 1A, having a diameter of 6 μm, is so structured that the silver particles 31, which are pattern-constituting material particles, for forming pattern electrodes are dispersed uniformly in the resin material 32, which is an insulating material. As to the manufacturing method therefor, first, polyethylene resin is heated to 250° C. so as to be melted, and a specified amount of silver particles, which are constituent material particles, are mixed thereinto and kneaded, rolled, and cooled. The resulting mass is ground into several mm squares with a hammer mill or cutter mill, further ground into 0.5 to 15 μm with a grinding mill, classified so that coarse particles of 20 μm or more particle sizes are excluded, by which particle bodies are obtained. Then, about 0.1 μm-diameter-fine particles of colloidal silica, titanium oxide, alumina, or the like are deposited on the surfaces of the particle bodies with a fast fluidizing mixer. The reason of using these particles is to enhance the fluidity of the pattern-forming material particle 1A for their higher mobility.

In this method, since the silver particles 31 are dispersed uniformly in the resin material 32 and thereafter the mass is ground, the silver particles 31 develop on the surfaces of the ground resin, with the result that the insulating property of the pattern-forming material particle 1A is lowered. The diameter of the silver particles 31 to be mixed and the resistance value of the pattern-forming material particle 1A manufactured are shown in Table 1:

TABLE 1

| Diameter of forming particles (μm) | Diameter of silver particles (μm) | Forming particles/ silver particles | Resistance (Ωm) |
| --- | --- | --- | --- |
| 6 | 0.2 | 30 | $4.0 \times 10^{10}$ |
| 6 | 0.4 | 15 | $3.0 \times 10^{10}$ |
| 6 | 0.6 | 10 | $2.0 \times 10^{10}$ |
| 6 | 0.8 | 7.5 | $1.0 \times 10^{10}$ |
| 6 | 1.0 | 6 | $1.0 \times 10^{9}$ |
| 6 | 1.2 | 5 | $1.0 \times 10^{8}$ |

To control the pattern-forming material particles 1A by electrostatic force, the resistance value needs to be at least $1.0 \times 10^8$ Ωcm. Diameters of the silver particles 31 larger than 1.2 μm would cause the resistance value to be so small that the pattern-forming material particles 1A would be unusable. Accordingly, the ratio of the diameter of the silver particles 31 to the diameter of the pattern-forming material particle 1A needs to be 1:5 or more.

Figure 31B:
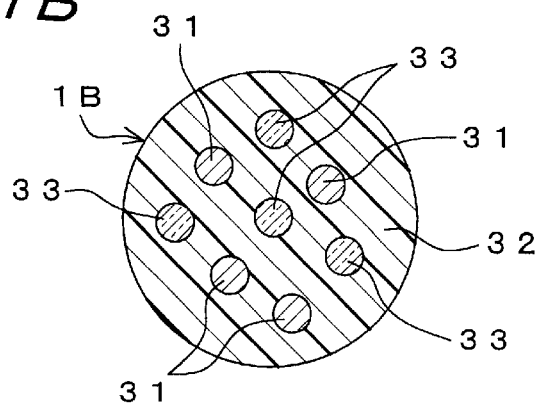

FIG. 31B shows a pattern-forming material particles 1B having a structure that a plurality of pieces an adhesive material particles 33, e.g., glass-frit powder particles, which are constituent material particles, together with the silver particles 31, which are constituent material particle, are dispersed uniformly in the resin material 32.

In this connection, in the case of PDP electrode formation, since the resin 9 is all evaporated at 600° C. in the baking step after the pattern formation, it is necessary for the pattern-forming material particle 1A to contain an adhesive material in order that the silver particles 31 are fixed to the panel substrate 3. Therefore, 0.5 μm-dia. powder of glass frit was used as the adhesive material. Glass frit powder melts at 590° C. to become glass, making the silver particles 31 adhering to the surface of the panel substrate 3.

As to the manufacturing method therefor, first, the silver particles 31 and the adhesive material particles 33 made of glass frit are preliminarily mixed together, and thereafter in the same way as above, thrown into the molten resin material 32, dispersed and ground, by which the pattern-forming material particles 1B are manufactured. It is noted that when a third component is mixed in addition to the adhesive material particles 33, it is also appropriate to do similar mixture firstly. Although those components may be mixed in the resin material 32 separately for the manufacture of the pattern-forming material particles 1B, it is difficult to attain uniform dispersion, where homogeneous pattern-forming material particles 1B could not obtained. Also, independently of the adhesive material, a characteristic controlling agent is added to enhance the chargeability of the pattern-forming material particles 1B. This is intended to control the material properties of the pattern-forming material particles 1B so that the particles are more likely to be negatively charged, where monoazo dyes or their chromium complexes, salicylic metal salts, or the like are usable therefor. The content of the characteristic controlling agent is not more than 3 wt %.

Figure 31C:
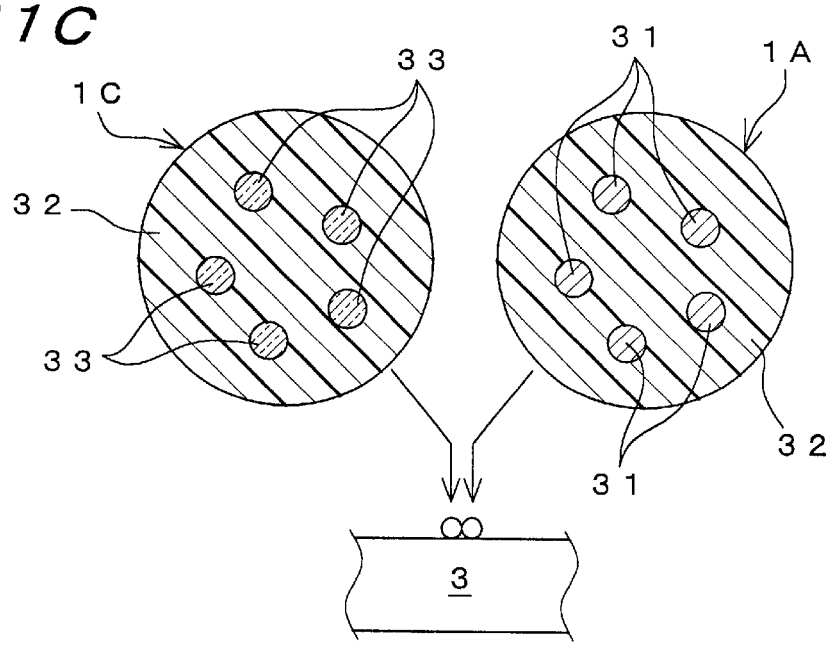

FIG. 31C shows a case in which a plurality of pattern-forming material particles 1A, 1C respectively containing different kinds of constituent materials are deposited onto the same sites to form a pattern, other than the case in which plural kinds of constituent material particles are present in one pattern-forming material particle 1.

More specifically, pattern-forming material particles 1C containing the adhesive material particles 33 alone are manufactured in the same way as above, pattern-forming material particles 1A containing the silver particles 31 are manufactured separately, and these two kinds of pattern-forming material particles 1A, 1C are patterned separately, applied to the same place and baked. As a result, the adhesive material of the pattern-forming material particles 1C is melted so as to be mixed with the silver particles 31 of the pattern-forming material particle 1A, by which the silver particles 31 are adhesively bonded to the surface of the panel substrate 3 so that a pattern can be formed.

Figure 32A:
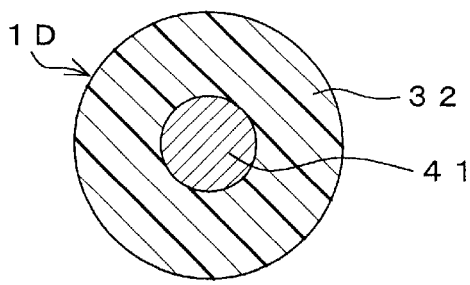
FIGS. 32A, 32B, 32C, and 32D are sectional views for explaining another structure of the pattern-forming material particles according to the second embodiment.

FIG. 32A shows a pattern-forming material particle 1D in which one silver particle 41, which is a large-diameter constituent material particle, is placed at a central portion of the layer of the resin material 32, with the silver particle 41 peripherally coated with the layer of the resin material 32.

In the case of this structure, the silver particle 41 does not appear on the surface of the pattern-forming material particle 1D, so that a high resistance value can be obtained stably, allowing a sufficient amount of static electricity to be accumulated and enabling an easier control by electrostatic force. The resulted particle has no above-described relation between the size and the resistance value of the silver particle but has high resistance value. A first manufacturing method therefor makes use of the solvent drying method. More specifically, polyethylene, a polymeric resin, is dissolved in trichloroethylene, a solvent, and the silver particles 41 are dispersed therein. Thereafter, with the solvent evaporated, the surface of the silver particle 41 is coated with the layer of the resin material 32. Since allowing the solvent to stay at rest during the evaporation of the solvent would result in a particle with nonuniform layer of the resin material 32, the solvent should be dried while being stirred or dried while being given ultrasonic vibrations, where a pattern-forming material particle 1D with uniform layer thickness of the resin material 32 can be obtained. This film thickness depends on the resin concentration in the solvent, its evaporation rate and the like.

Figure 32B:
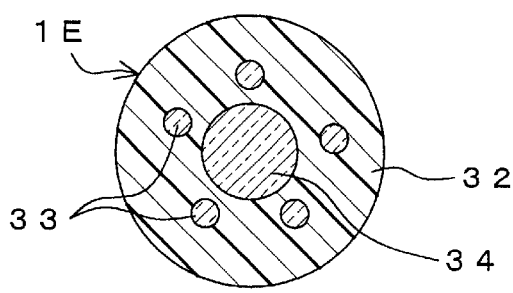

FIG. 32B shows a pattern-forming material particle 1E in which one silver particle 41, which is a large-diameter constituent material particle, is placed at a central portion of the resin material, while adhesive material particles 33, which are small-diameter constituent material particles of a different kind, are uniformly dispersed in the layer of the resin material 32 in peripheral part of the silver particle 41.

In order to obtain such a structure that the adhesive material particles 33 are contained in the pattern-forming material particle 1D, it is appropriate that the adhesive material particles 33 together with the silver particle 41 are dispersed in a solution in which the resin material 32 has been dissolved, where the large-diameter silver particle 41 is centered.

Figure 32C:
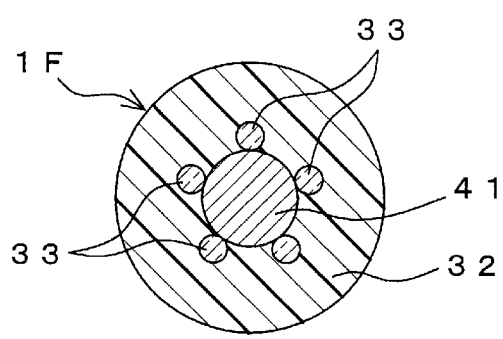

FIG. 32C shows a pattern-forming material particle 1F in which one silver particle 41, which is a large-diameter constituent material particle, is placed at a central portion of the resin material 32, while adhesive material particles 33, which are small-diameter constituent material particles of a different kind, are deposited in contact on the peripheral surface of the silver particle 41.

This pattern-forming material particle 1F can be manufactured by dryly mixing the silver particle 41 and the adhesive material particles 33 together with a high-breather mixer, and thereafter forming a layer of the resin material 32 therearound by the same process as above.

Figure 32D:
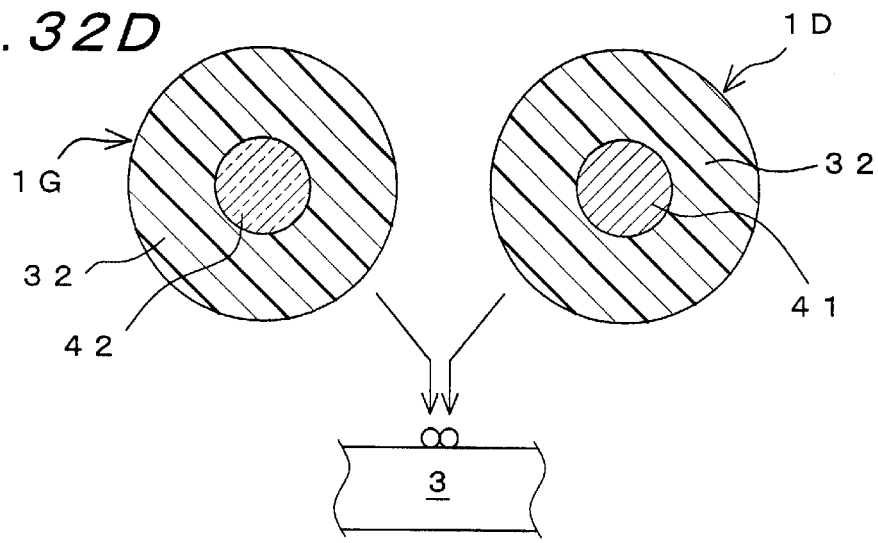

FIG. 32D shows a case in which a plural kinds of pattern-forming material particles 1D, 1G are deposited to the same sites and baked, thereby forming a pattern, where the plural kinds of pattern-forming material particles 1 include the aforementioned pattern-forming material particle 1D, a pattern-forming material particle 1G in which one large-diameter constituent material particle substitutive for the silver particle 41 and different in kind therefrom, e.g., an adhesive material particle 42 is placed at a central portion of the resin material 32 so as to be peripherally coated.

As a second manufacturing method for manufacturing the pattern-forming material particles 1D to 1G of FIGS. 32A–32D, resin polyethylene is dissolved in methylene chloride, and the silver particles 41 are dispersed therein. This dispersion is emulsified and dispersed in a polyvinyl alcohol solution and then heated to 40° C. while being stirred, so that methylene chloride is evaporated. With filtering and drying subsequently done, particles can be fabricated.

As a third manufacturing method, spray drying equipment may be used. This is a method that the constituent material particle and trichloroethylene, which is a solvent having the resin material 32 of polyethylene dissolved therein, the resin material 32 being intended to coat the constituent material particle therewith, are discharged simultaneously in a spray-like manner into the air, so that the particles are peripherally coated with resin. For obtainment of homogeneous particles, the solution to be sprayed needs to be continuously stirred so that the homogeneity is maintained. The thickness of the coating film can be controlled by the resin concentration in the solvent, the temperature (about 50° C.) and humidity of air to be jetted, the vapor pressure of the solvent, the diameter of the spray nozzle, and the discharge pressure.

As a fourth manufacturing method, 0.5 g of a 10:1 mixture of styrene-divinylbenzene monomer as a monomer, 0.5 g of benzoyl peroxide as a catalyst, and 20 g of silver particles 41 are added into dichlorodiphenyl. This solution is emulsified into 500 ml of an aqueous solution with 0.5 g of persulfuric acid potash and 5.5 g of gum arabic dissolved therein. This dispersion system is continuously heated, while being stirred, at 80° C. for about 6 hours. Polymerized high polymer, being insoluble in the dichlorodiphenyl, is extracted on the surfaces of the droplets. At the time when the polymerization is completed, a seamless coating results, so that dichlorodiphenyl-containing polystyrene particles with the silver particles 41 dispersed are obtained.

As a fifth manufacturing method, 5 ml of 9% ethyl cellulose dichloromethane is added to silver particles 41, and with 20 ml of n-hexane added, the solution is continuously stirred at 25° C. for 1 hour. Thereafter, the solution is allowed to stand at 4° C. for 24 hours and, with the supernatant removed, this solution is cleaned with n-hexane. After the curing of the film, the resultant solution is dried under reduced pressure so as to be powdered, by which the manufacturing process is completed. The concentration of ethyl cellulose and the thickness of the film are proportional to each other, where 8 wt % results in a 6 $\mu$m thickness and 4 wt % results in 3 $\mu$m thickness.

Figure 33A:
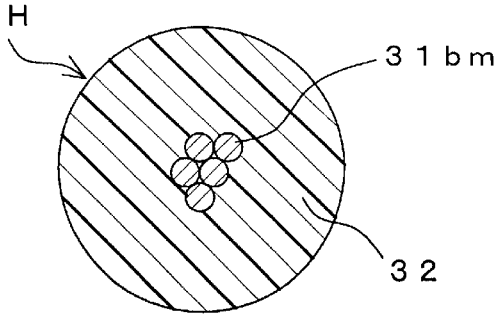
FIGS. 33A, 33B, and 33C are sectional views for explaining another structure of the pattern-forming material particles according to the second embodiment.

FIG. 33A shows a pattern-forming material particle 1H in which an aggregate 31bm formed from aggregation of a plurality of small-diameter silver particles 31, which are constituent material particles of the same kind, is placed at a central portion of the resin material 32. In this case, a multiplicity of silver particles 31 are present at the central portion and peripherally coated with the layer of the resin material 32. In this structure, the silver particles 31 do not appear on the surfaces of the pattern-forming material particles 1H, so that the resistance value does not decrease.

As to the manufacturing method therefor, the small-diameter silver particles 31 are dryly mixed so as to come to a certain size, and aggregates 31bm of necessary sizes are selected with a filter. Thereafter, the silver-particle aggregates 31bm are coated with the resin material 32 by the method shown above.

Figure 33B:
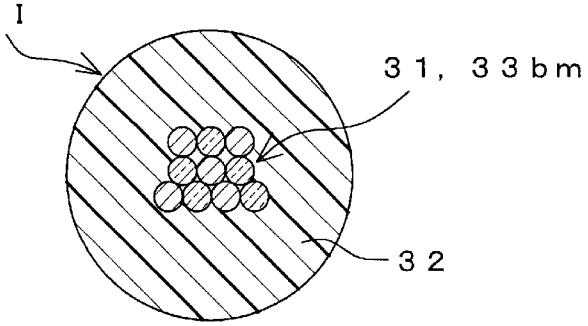

FIG. 33B shows a pattern-forming material particle 1I in which a plurality of small-diameter constituent material particles of a plurality of kinds, for example, aggregates 31bm and 33bm of silver particles 31 and adhesive material particles 33 are placed at central portions of the resin material 32 so as to be peripherally coated with the resin material 32. In this manufacturing method, as in the above case, the adhesive material particles 33 and the silver particles 31 are dryly mixed, and massed aggregates 31bm and 33bm of certain sizes are coated with the resin material 32 as in the above method, by which the particles are manufactured.

Figure 33C:
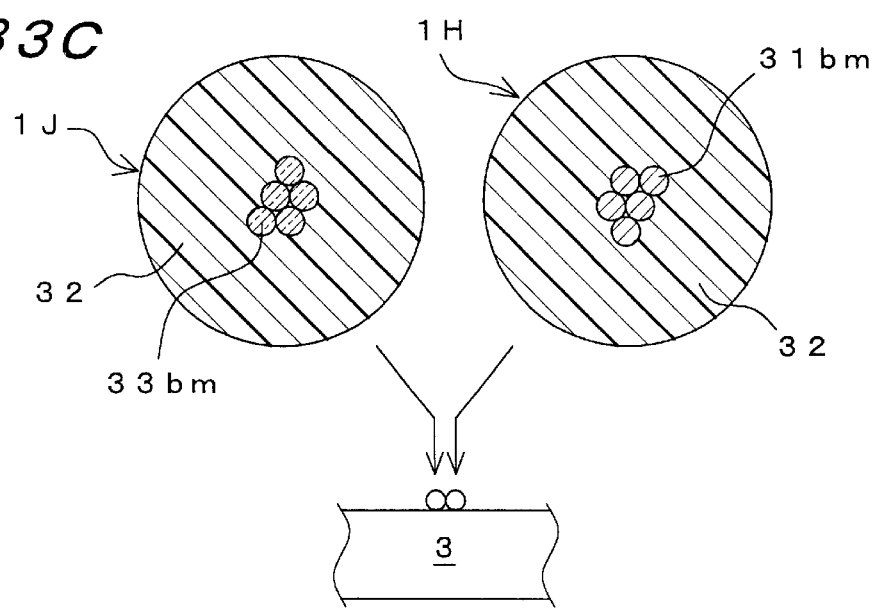

FIG. 33C shows a case in which different kinds of pattern-forming material particles 1H with a plurality of aggregates of constituent material particles of the same kind placed at central portions of the resin material 32 are deposited to the same site, and further baked, to form a pattern.

More specifically, pattern-forming material particles 1J having the aggregates 33bm of the adhesive material particles 33 internally present at central portions, and pattern-forming material particles 1H having the aggregates 31bm of the silver particles 31 internally present at central portions, are manufactured, and these two or more kinds of pattern-forming material particles 1H are patterned at the same site of the panel substrate 3, independently, and baked, by which a pattern is formed.

Figure 34A:
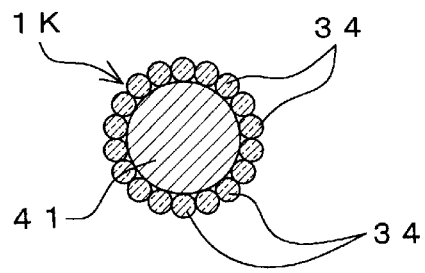
FIGS. 34A, 34B, and 34C are sectional views for explaining another structure of the pattern-forming material particles according to the second embodiment.

FIG. 34A shows a pattern-forming material particle 1K formed by depositing a multiplicity of small-diameter resin material particles on the outer peripheral surface of a large-diameter constituent material particle larger than the small-diameter resin material particles. As to the manufacturing method for this pattern-forming material particle 1K, small-diameter resin material particles 34 and large-diameter silver particles 41 are mixed together in a centrifugal tumbling ball mill, by which the pattern-forming material particles 1J are obtained.

Figure 34B:
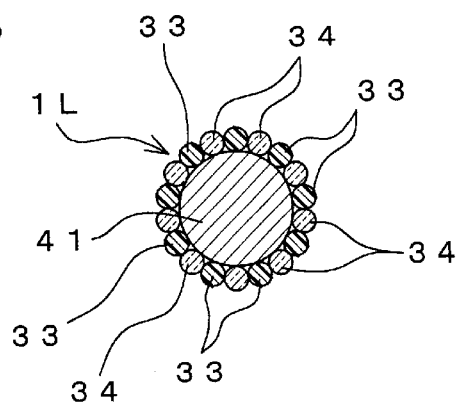

FIG. 34B shows a pattern-forming material particle 1L in which a multiplicity of small-diameter constituent material particles of different kinds such adhesive material particles 33, and a multiplicity of small-diameter resin material particles 34, are deposited on the outer peripheral surface of a large-diameter silver particle 41, which is a constituent material particle. This pattern-forming material particle 1L can be manufactured by mixing the large-diameter silver particle 41, the small-diameter resin material particles 34, and the small-diameter adhesive material particles 33 together in a centrifugal tumbling ball mill.

Figure 34C:
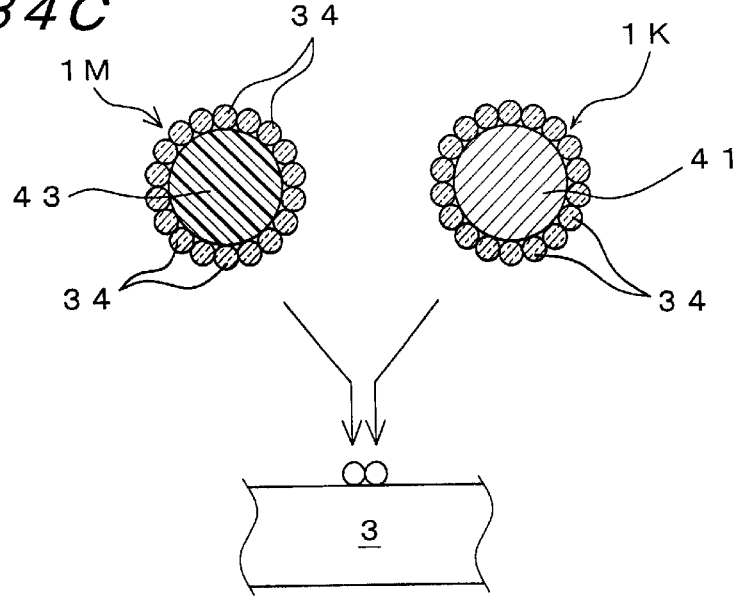

FIG. 34C shows a pattern-forming material particle 1M in which a multiplicity of small-diameter resin material particles 34 are deposited on the outer peripheral surfaces of large-diameter constituent material particles of different kinds, for example, adhesive material particles 42, respectively. The pattern-forming material particles 1M and the pattern-forming material particles 1K are patterned independently of each other to the same site, and baked, by which a pattern can be formed.

In the case of the pattern-forming material particle 1L, the small-diameter resin material particles 34 and large-diameter adhesive material particles 43 are mixed together, where mixing these in a centrifugal tumbling ball mill makes the large-diameter adhesive material particles 43 located to the center with the different small-diameter resin material particles 34 present around.

In the manufacturing methods for all the pattern-forming material particle 1A to 1M, necessary particle sizes can be obtained depending on condition settings. However, if the particle size has become too large because of wrong conditions, the particle size can be made into a required one with a grinder. Also, it is necessary to deposit a mold releasing agent on the surfaces of all the particles. Characteristic controlling agents are also necessary.

The pattern-forming material particles 1A to 1L were manufactured with their diameter not more than 10 $\mu$m. The ratios of the constituent-particle silver particles 31, 41 to the adhesive material particles 33, 42 in the pattern-forming material particles 1A to 1L were set to not more than 30 vol % (not more than 80 wt %). It is possible to develop the silver particles on the surfaces of the particles of FIG. 31. It is possible that the ratio of the silver is 70 vol % and 99 wt % because the particles of FIG. 32 are completely covered with resin. In this case, increasing the ratio would cause the particles to tend to be nonuniform in diameter. The mold releasing agents and the characteristic controlling agents are at ratios of not more than a few vol %. However, those agents, if close in density to the resin, are allowed to be increased in their ratios.

Figure 45:
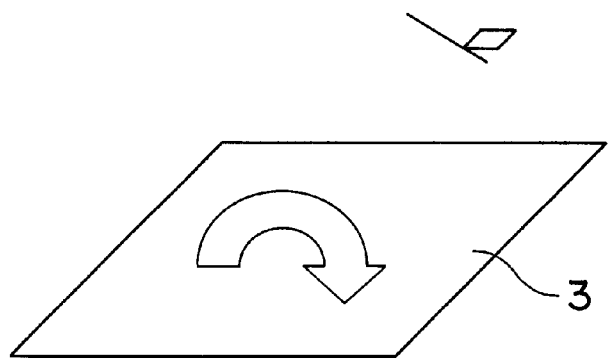
FIG. 45 is a view for explaining a state where position and thickness of a panel surface are detected by a laser displacement gauge.
Figure 46:
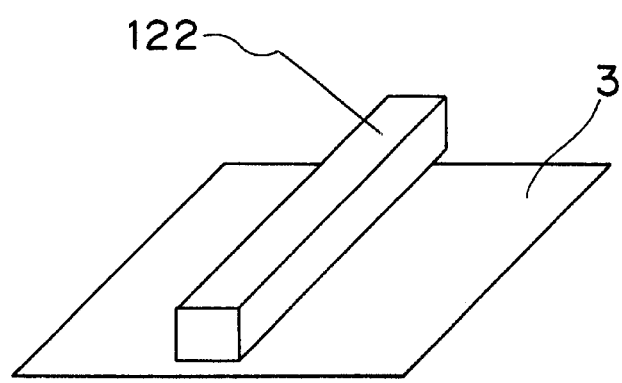
FIG. 46 is a view for explaining a state where corona charging is performed with an electric charger.

Next, pattern forming methods with the pattern-forming material particles 1A to 1L (hereinafter, designated by numeral 1) are explained with reference to FIGS. 35, 36 and others. It is noted that before the patterning of the pattern-forming material particles 1, position and thickness of the panel surface are detected by a laser displacement gauge 9b as shown in FIG. 45, followed by making preparations for operation control of the panel substrate 3 and the nozzle 112 as in the first embodiment, while corona charging is performed with an electric charger 122 as shown in FIG. 46 as in the first embodiment.

Figure 35A:
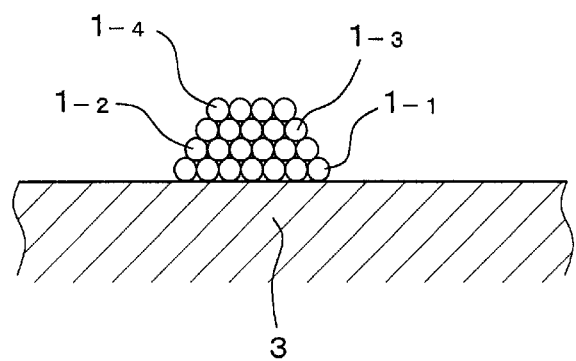
FIGS. 35A and 35B are sectional views showing a pattern forming method with the pattern-forming material particles according to the second embodiment of the invention.

In a forming method shown in FIG. 35A, in the patterning of the pattern-forming material particles 1 with the pattern forming apparatus shown in FIGS. 29 and 30 or FIGS. 37 and 38, the pattern-forming material particles 1 are deposited and patterned under the control that particle layers are overlaid one on another toward a wide-bottom shape in which first-layer pattern-forming material particles 1—1 are wider, and second- and third-layer pattern-forming material particles 1-2, 1-3 become increasingly narrower, at the edge portions. By doing so, the pattern-forming material particles 1-2 to 1-4 of upper layers can be prevented from falling down at the edge portions and expanding to non-pattern portions, which makes the pattern formation to be attained at high precision. In the case where the pattern-forming material particles 1 are of generally the same diameter, the above effect could not be fulfilled unless the lowermost layer 1—1 is two-piece or more smaller than its upper layers 1-2 to 1-4 as seen in the cross-sectional view of these particle layers.

Figure 35B:
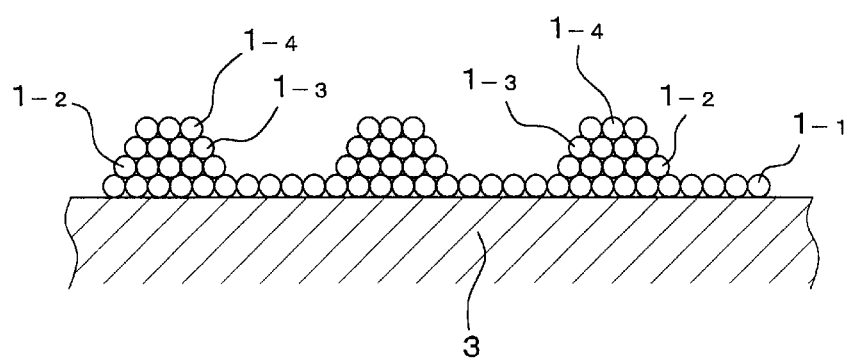

In a pattern forming method of FIG. 35B, in the patterning of the pattern-forming material particles 1, pattern-forming material particles 1—1 having adhesive material particles 33, 42 as constituent materials are applied all over the first layer, and pattern-forming material particles 1-2 to 1-4 containing silver particles 31, 41 are stacked and deposited on top of the first layer, thus going on the pattern formation. In this case, the upper-layer pattern-forming material particles 1-2 to 1-4, even if overflowed, will be definitely restricted by the first-layer pattern-forming material particles 1—1 containing the adhesive material particles 33, 42, thus leading to enhanced pattern precision.

Figure 47:
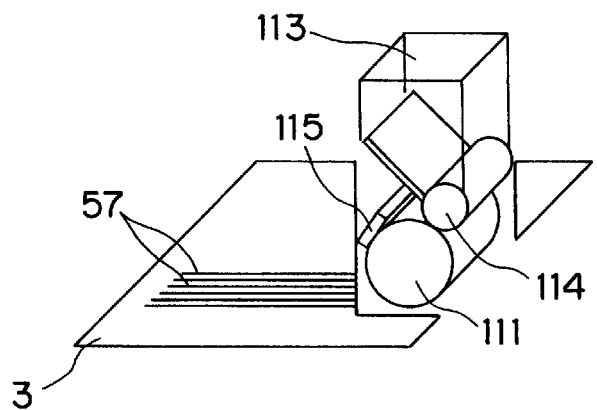
FIG. 47 is a view for explaining a state where pattern drawing with the pattern-forming material particles is accomplished.
Figure 48:
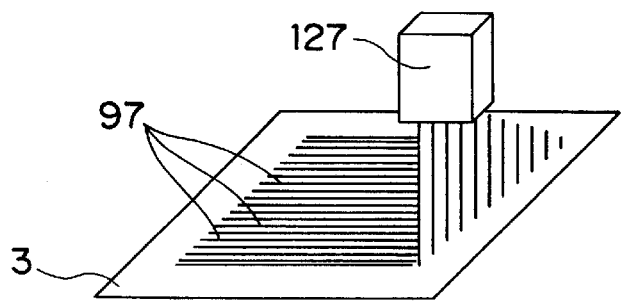
FIG. 48 is a view for explaining a state where the pattern-forming material particles are fixed to a glass panel.
Figure 49:
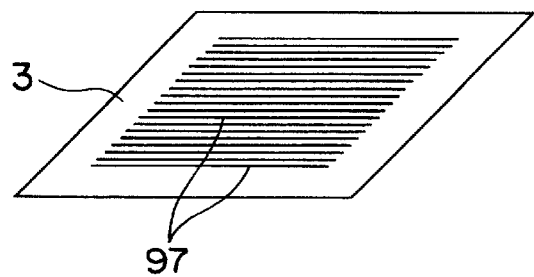
FIG. 49 is a view for explaining a state where a 600° C. heat treatment is performed to evaporate resins, thereby baking the pattern-forming material particles, by which silver electrodes are fabricated.
Figure 50:
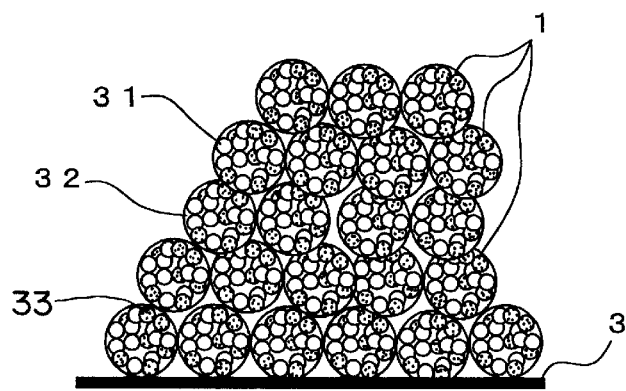
FIG. 50 is an enlarged schematic view for explaining a state of pattern-forming material particles when pattern drawing with the pattern-forming material particles is accomplished.
Figure 51:
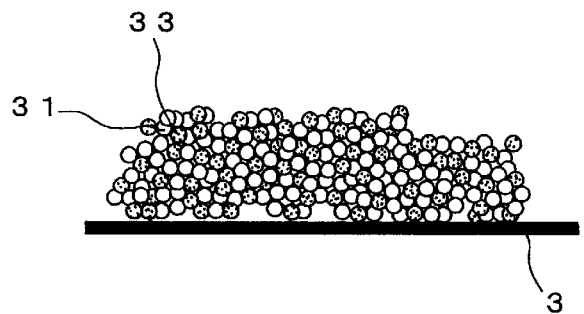
FIG. 51 is an enlarged schematic view for explaining a state of pattern-forming material particles when the pattern-forming material particles are fixed to a glass panel.
Figure 52:
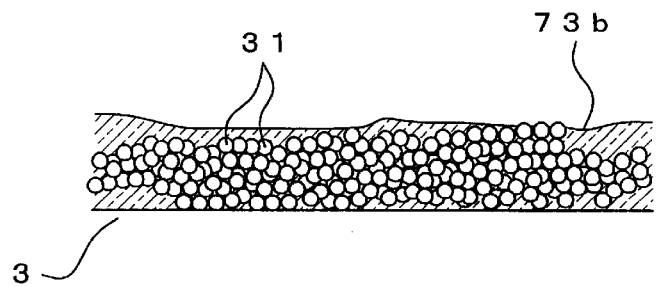
FIG. 52 is an enlarged schematic view for explaining a state of pattern-forming material particles when a 600° C. heat treatment is performed to evaporate resins, thereby baking the pattern-forming material particles, by which silver electrodes are fabricated.

After the pattern drawing with the pattern-forming material particles 1 in this way (see FIGS. 47 and 50), the glass panel 3 was heat treated on a hot plate at 180° C. for 10 min., by which the pattern-forming material particles 1 were fixed to the glass panel 3 (see FIGS. 48 and 51). Thereafter, a 600° C. heat treatment was performed to evaporate resins, thereby baking the pattern-forming material particles 1, by which silver electrodes were fabricated (see FIGS. 49 and 52).

The above second embodiment has been described on pattern formation of electrodes. However, the material of the pattern-forming material particles 1 to be used in the second embodiment of the present invention, although varying depending on the kind of pattern formation objects such as PDPs, liquid crystal panels, and circuit boards, may be given by electrode materials of silver, gold, copper, silver-palladium, or others as the metal for electrode use. Also, as the adhesive material, such fine particles or adhesive materials as resins, alumina, titanium oxide, and glass frits are usable. Also, the resin material 32 to cover the constituent materials is exemplified by thermoplastic resins including: polyethylene, polypropylene, polyvinyl chloride, styrene, ethylene vinyl acetate copolymer, polyester, and polystyrene; cellulose resins such as methyl cellulose, ethyl cellulose, nitrocellulose, cellulose acetate, cellulose propionate, and cellulose butyrate; or methacrylic resins such as methyl methacrylate, ethyl methacrylate, normal butyl methacrylate, isobutyl methacrylate, and isopropyl methacrylate.

As described above, with the use of the pattern-forming material particles of the second embodiment of the present invention, since constituent material particles are covered with resin material, which is to be evaporated in large amount by baking process, a pattern-forming material particle having good insulating property can be obtained, so that the pattern-forming material particle can be patterned stably onto the panel substrate by means of electrostatic force. As a result of this, a desired pattern can be formed successfully with high precision on a substrate constituting a large-scale panel for PDPs, liquid crystal panels, circuit boards, or the like. Moreover, since the process for pattern formation is simplified, a panel substrate with a pattern formed thereon can be manufactured with low price.

Also, with the use of the pattern forming method with the pattern-forming material particles of the second embodiment of the present invention, since the pattern-forming material particles, when patterned and deposited in a plurality of layers, are stacked in a wide-bottom shape, pattern-forming material particles of upper layers are less likely to fall down at the edge portions, preventing the possibility that fallen pattern-forming material particles are deposited to the non-pattern portions. As a result of this, any deterioration of pattern precision can be prevented beforehand.

Here is explained a comparison between conventional common toners and the pattern-forming material particles of the second embodiment.

Figure 39:
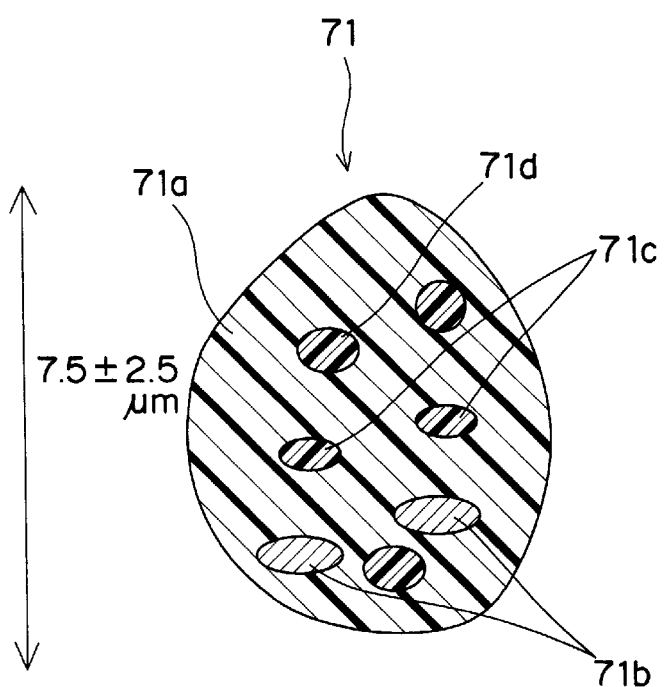
FIG. 39 is a sectional view of conventional common toner.
Figure 40:
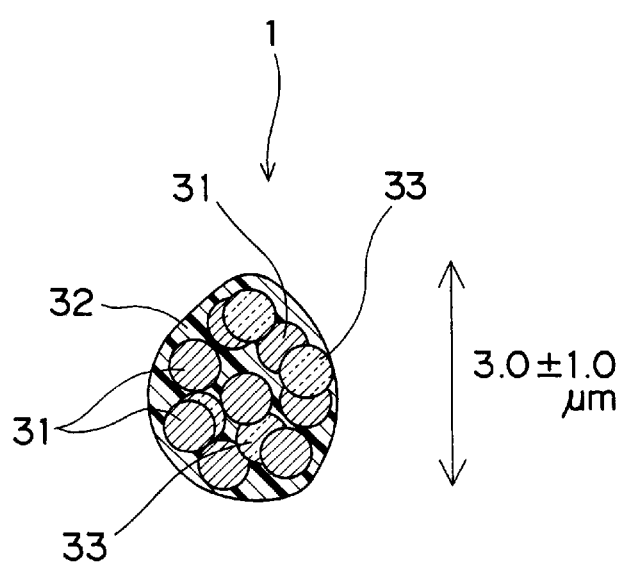
FIG. 40 is a sectional view of a pattern-forming material particle according to the second embodiment.

A conventional common toner 71 is so structured that, as shown in FIG. 39, a charge controlling agent 71b (1–5%), a mold releasing agent 71c (–5%), and a coloring matter 71d (pigments or dyes; 5–15%) are contained at about 20–10% in a resin 71a (80–90%), the particle size being 7.5±2.5 µm. In contrast to this, the pattern-forming material particle 1 of the second embodiment is an electrode material, e.g. silver toner, in which, as shown in FIG. 40, silver particles 31 and glass-frit powder particles 33 are contained at about 20% in a resin material 32, where the particle size is 3.0±1.0 µm.

For common toners, the particle size is 5 to 10 µm, the major component is resin, the resistance value is $10^{12}$ to $10^{18}$ Ωcm. In contrast to this, the silver toner, which is an example of the pattern-forming material particles of the second embodiment, has a particle size of 2 to 4 µm, a major component of resin, and a resistance value of $10^{12}$ to $10^{18}$ Ωcm. White silver that is an electrical conductor of this silver toner has a particle size of 0.2 to 2.0 µm, a major component of silver and a resistance value of $2\times10^{-6}$ Ωcm, and black silver that is an electrical conductor of the silver toner has a particle size of 0.5 to 1.0 µm, a major component of ruthenium oxide and a resistance value of $10^4$ Ωcm. BS that is an insulator of the silver toner has a particle size of 0.01 to 0.1 µm, a major component of CoCrCuO and a resistance value of $10^{10}$ Ωcm, and a fluorescent substance that is an insulator has a particle size of 2 to 3 µm, a major component of metal oxide and a resistance value of $10^{13}$ Ωcm. The white silver of the silver toner has, in terms of its characteristics, a resistance value of 4 µΩcm and a baking temperature of 593° C., the black silver of the silver toner has, in its characteristics, an L value <10, a reflectivity <10% and a baking temperature of 593° C., and the BS has, in its characteristics, an L value <10, a reflectivity <10% and a baking temperature of 593° C. Here, the L value means a reflection coefficient indicating a ratio of a reflected light to a projected visible light (ratio of 1).

Figure 41:
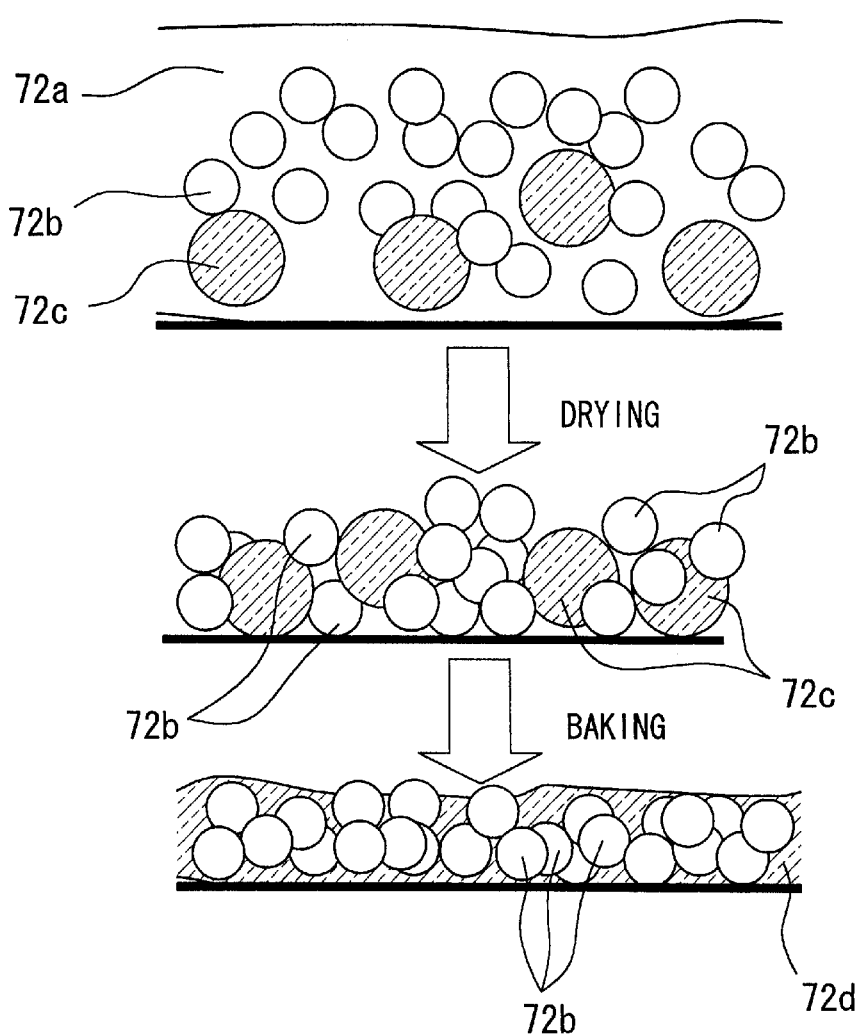
FIG. 41 is an explanatory view of a conventional printing process.

Further, differences between conventional screen printing process and the pattern forming method of the second embodiment are also described. In the conventional screen printing process, as shown in FIG. 41, silver particles 72b and glass-frit particles 72c are present and mixed in a solvent 72a, where evaporating the solvent 72a with drying process causes a multiplicity of the silver particles 72b to stick to around the glass-frit particles 72c, and thereafter performing baking process causes the glass-frit particles 72c to form a glass-frit layer 72d, resulting in a state that the silver particles 72b are contained within the glass-frit layer 72d.

Figure 42:
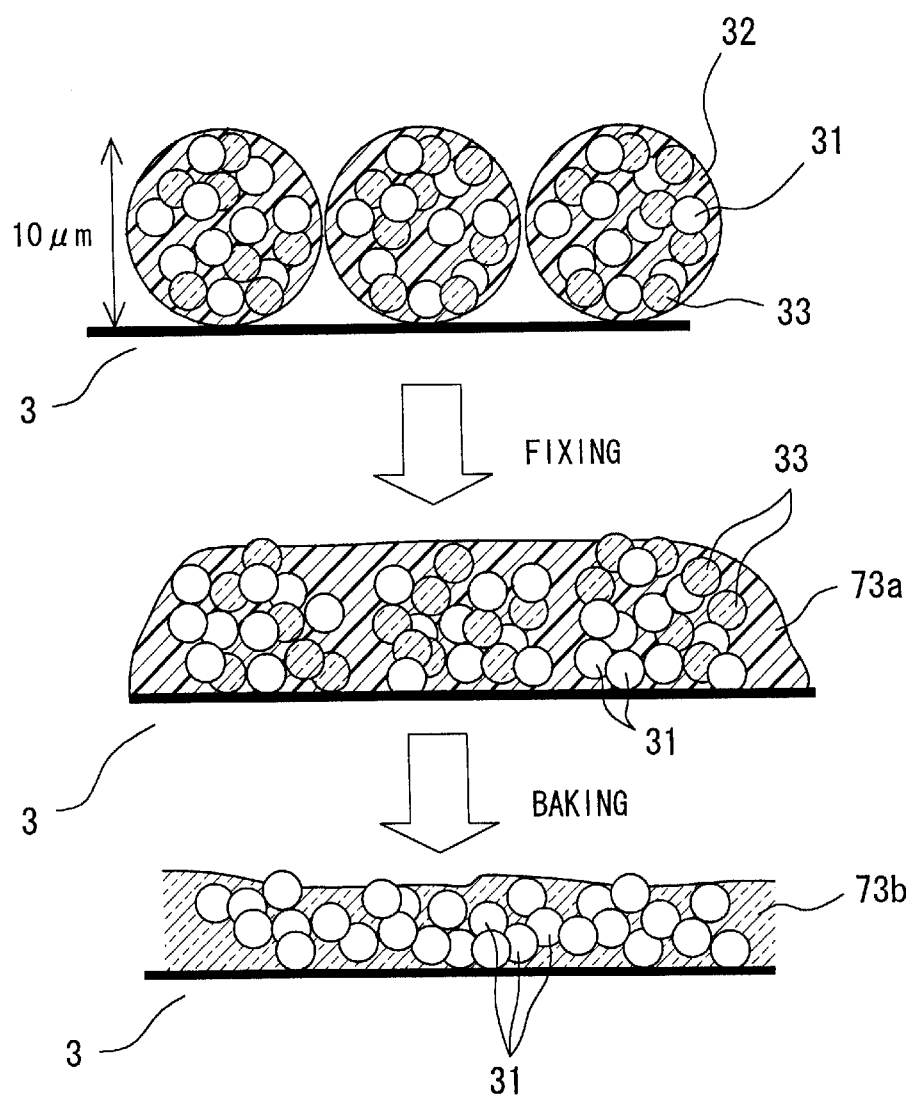
FIG. 42 is an explanatory view of the pattern forming method according to the second embodiment.

In contrast to this, in the pattern forming method of the second embodiment, as shown in FIG. 42, in the state that a pattern has been formed with the pattern-forming material particles 1 placed in a 10 µm layer, performing fixing operation causes the resin material 32 to be fused, resulting in a resin layer 73a. In this state, the silver particles 31 and the glass-frit powder particles 33 are similar in arrangement to each other within the pattern-forming material particles 1. After the fixing operation, performing baking operation causes the resin material to be flown away and removed, while the glass-frit powder particles 33 form a glass-frit layer 73b, resulting in a state that the silver particles 31 are contained in the glass-frit layer 73b. The difference between the conventional printing process and the second embodiment is that, similar to the other embodiment, (1) no solvent is used, its handling is easy, and it is friendly to the environment; (2) in printing, cleaning of a plate and a screen are needed, and its working is complicated at a manufacturing location; (3) the amount of the using material can be reduced because application is performed on only necessary portions; (4) because of no solvent, it is unnecessary to do dry process and there is no problem such as dry unevenness in process, the object can be quickly transferred to a subsequent process because of no dry process, and waiting space is unnecessary; and (5) the pattern precision can be maintained for a long time (since a plate or screen for printing tend to expand, it is necessary to frequently exchange it with a new one for maintaining the pattern precision, resulting in high cost).

Further, the grinding method and the microcapsulation method out of the above methods are compared to each other as a method for forming pattern-forming material particles.

Figure 43:
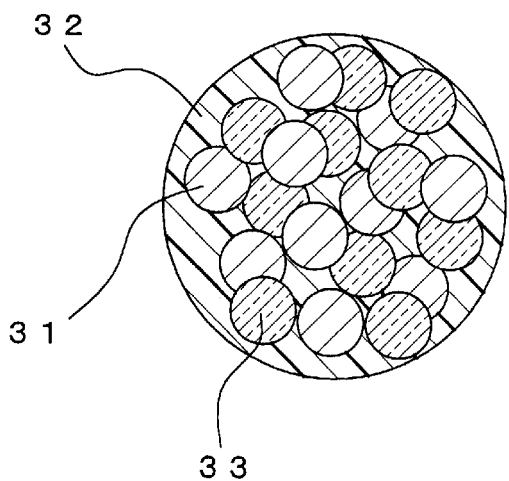
FIG. 43 is a sectional view of a pattern-forming material particle manufactured by the grinding method out of the pattern forming methods of the second embodiment.

As shown in FIG. 43, the silver particles 31 of the pattern-forming material particles manufactured by the grinding method have a diameter of 0.2 µm, and the glass-frit powder particles 33 so manufactured have a diameter of 0.6 µm. In the manufacturing method by grinding process, the powder is dispersed in a resin solution, solidified and ground.

Figure 44:
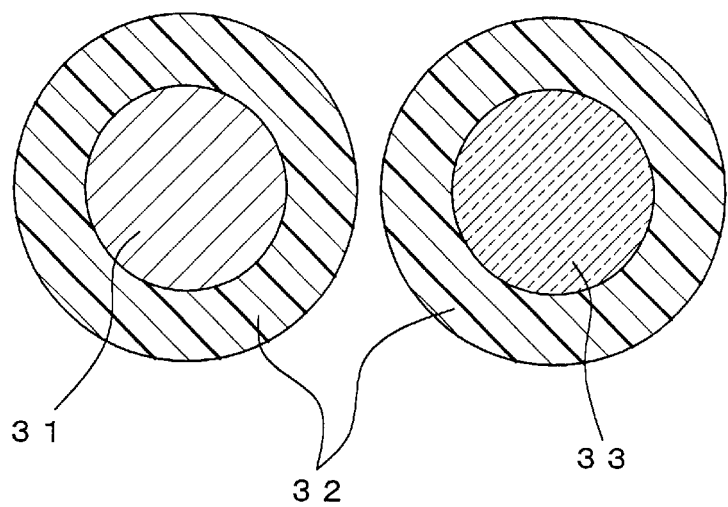
FIG. 44 is a sectional view of pattern-forming material particles manufactured by the microcapsulation method out of the pattern forming methods of the second embodiment.

As shown in FIG. 44, the silver particles 31 of the pattern-forming material particles manufactured by the microcapsulation method have a diameter of 0.6–5 µm, and the glass-frit powder particles 33 so manufactured have a diameter of 0.6–5 µm. In the manufacturing method by microcapsulation process, the powder to serve as nuclei is mixed with the solvent, sprayed, and rapidly dried. As to the method of controlling the particle size, the grinding method allows the control to be fulfilled according to the degree of grinding, while the microcapsulation method is capable of controlling the particle size of the nuclei and the thickness of the resin layer. As to the method of controlling the resistance value, the grinding method is capable of the control by controlling the amount of the silver particles 31 and changing the kind of the resin material, the microcapsulation method is capable of the control by controlling the film thickness of the resin and changing the kind of the resin.

Figure 53:
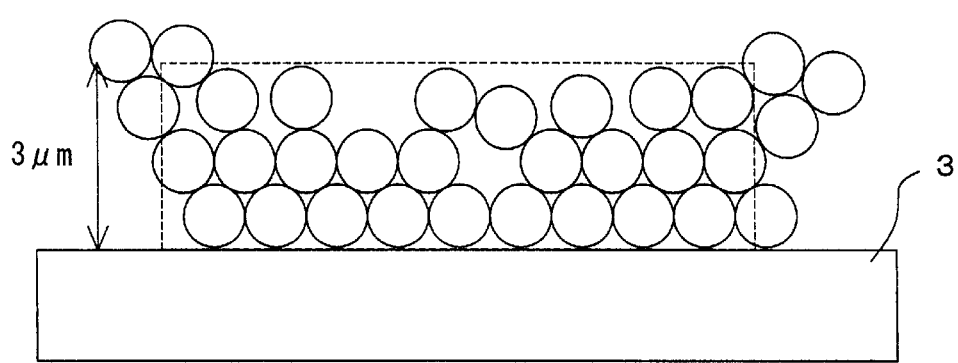
FIG. 53 is a detailed sectional view of PDP electrodes formed by a conventional method.
Figure 54:
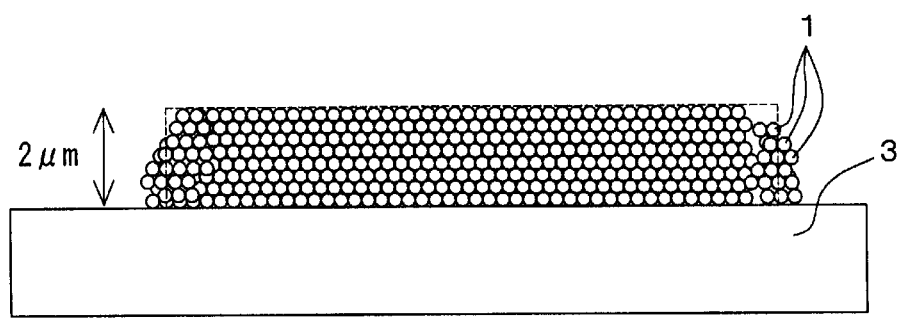
FIG. 54 is a detailed sectional view of electrodes formed by the pattern forming method of the second embodiment.

Whereas the electrode formed by the conventional method has a line width of 80±10 μm, the PDP electrode as a concrete example of the pattern formed by the pattern forming method in the second embodiment can be thinned in line width as small as 30±10 μm as a result of the arrangements of the second embodiment including a smaller diameter of the nozzle head, a smaller diameter of the toner, and a more nearness between the nozzle and the panel as well as the placement of the deflecting electrode 4e. When the width of the nozzle is about 20 cm and the size of the panel is about 80 cm×60 cm, four-time movement over the back plate-use panel allows the application of the whole surface of the back plate-use panel while three-time movement over the front plate-use panel allows the application of the whole surface of the front plate-use panel. As a result, when the nozzle speed is 10 cm/sec, the application can be performed within thirty seconds, and the total process including the panel setting, adjustment, and taking-out can be finished within one minute. The fixing process is a next step. It is noted that the formation of the terminal portion 98 shown in FIG. 12 can be achieved by performing operation control with rotational movement or ON/OFF control of the nozzle head, while one line can be formed with a plurality of nozzles by control operation of the deflecting electrode 4e. More specifically, as FIG. 53 shows a detailed sectional view of a PDP electrode formed by a conventional method and having toner particles stacked on a panel substrate, and as FIG. 54 shows a detailed sectional view of an electrode formed by the pattern forming method of the second embodiment, according to the second embodiment, the line width of the silver electrode can be thinned to 30±10 μm by reducing the toner diameter from 7 μm to 3 μm and moreover reducing the width from 60 μm to 40 μm by reduction in the nozzle diameter, and furthermore the width of the silver electrode can be thinned to 30±2 μm by using in combination the processing of electrode terminal portions by scribing or with laser, and with resist. Also, the resistivity, which would be 4 μΩm by the conventional method, can be reduced to 2.7 μΩm by the second embodiment. Further, the withstand voltage, which would be 2.5 keV or more conventionally, can be reduced to 0 to 2.5 keV by the second embodiment, allowing a high withstand voltage to be ensured with a low resistance value.

Further, in a comparison between conventional electrophotographic method and the pattern forming method of the second embodiment, there is a large difference between the second embodiment in which toner is transferred directly to an object, and the conventional electrophotographic method in which an image is once formed on a photoconductive drum and thereafter transferred. Since an image is temporarily formed on the photoconductive drum like this, the conventional electrophotographic method would involve a loss of toner due to transfer. Also, as to the density (i.e., thickness), while the density can be enriched electrically according to the second embodiment, the conventional method can only achieve up to 10 μm as the deposition level on the photoconductor. As to the precision, the second embodiment can achieve a precision of 30±10 μm, the conventional electrophotographic method is indeed capable of control to 30±10 μm depending on the laser and the degree of light convergence, which is but unstable.

(Third Embodiment)

There may be some issues in actually working the method of the first embodiment:

① In electrophotography, in which a pattern image is once formed on the photoconductor and Further transferred to the panel, there is a possibility that a change in the distance between the photoconductor and the panel may cause the image to be smeared during the transfer, resulting in a deterioration of pattern precision;

② The surface of the photoconductor may be damaged, resulting in a lack of stability;

③ Because of a difficulty in completely cleaning the photoconductor surface, there is a possibility that a part of the pattern may remain, resulting in a smeared image;

④ The photoconductor may be high in price and has a difficulty in obtaining a high planar precision;

⑤ It may be difficult to fabricate a toner containing the pattern-forming material particles; and ⑥ Electrical chargeability may change under the effects of humidity and temperature, resulting in a smeared image.

Accordingly, the object of a third embodiment of the present invention is to provide a pattern forming method and apparatus which solves the above issues and which is simple in process and yet good at the precision of fine pattern formation.

In order to achieve the above object, in the third embodiment of the present invention, there is provided a pattern forming method including, for forming a pattern on a surface of a panel substrate: a step (a) of electrically charging pattern-forming material particles; a step (b) of forming an electrostatic pattern on an intermediate body; a step (c) of depositing the pattern-forming material particles onto the electrostatic pattern of the intermediate body formed at the step (b); a step (d) of transferring the pattern-forming material particles deposited on the intermediate body onto the panel substrate; a step (e) of fixing the pattern-forming material particles transferred at the step (d) onto the panel substrate; and a step (f) of cleaning the intermediate body after the transfer to remove remaining pattern-forming material particles.

In the third embodiment, there is also provided a pattern forming apparatus for panel substrates, for forming a pattern on a surface of a panel substrate, the apparatus comprising: a panel holder for supporting the panel substrate; and a basic unit placed opposite to the surface of the panel substrate, at least either one of the panel holder or the basic unit is constituted movable and liftable within horizontal plane, wherein the basic unit comprises: an intermediate body for transferring pattern-forming material particles onto the panel substrate; an electrostatic pattern forming device for forming an electrostatic pattern on the intermediate body; a particle charging device for electrically charging the pattern-forming material particles; and a developing device for depositing the electrically charged pattern-forming material particles onto the electrostatic pattern of the intermediate body, and wherein the apparatus further comprises a transfer device for transferring the pattern-forming material particles onto the surface of the intermediate body by applying an electrostatic force to the panel substrate.

With these constitutions, since the process for forming a desired pattern onto a substrate constituting a large-scale panel for PDPs, liquid crystal panels, circuit boards, or the like is simplified, and since the pattern-forming material particles are not deposited directly onto the panel substrate but once deposited onto the electrostatic pattern of the intermediate body and subsequently transferred to the panel substrate, the deposition and transfer-and-feed of the pattern-forming material particles can be accomplished smoothly so that the pattern formation on the panel substrate can be accomplished stably with high precision. As a result of this, a panel on which a pattern is formed can be manufactured with low price, and yet a high-precision fine pattern can be formed on the panel substrate.

The pattern forming apparatus for panel substrates according to the third embodiment of the present invention is now explained in detail.

Figure 55:
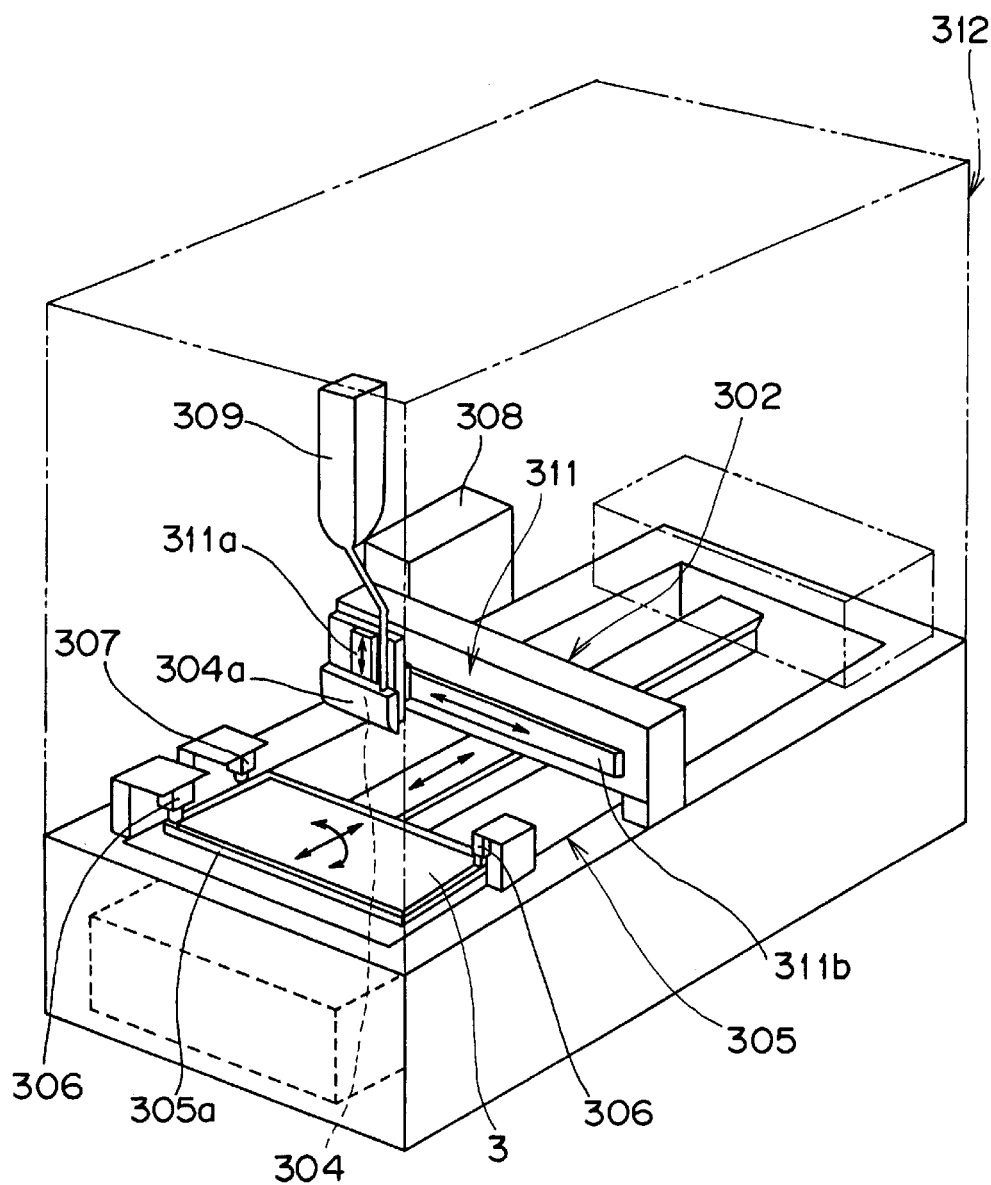
FIG. 55, showing a pattern forming apparatus according to a third embodiment of the present invention, is a perspective view of the pattern forming apparatus.

FIG. 55 shows a pattern forming apparatus for drawing a pattern onto a panel substrate 3. The panel substrate 3 is fixed to a flat stage 305a of an X-Y stage device (panel holder) 305 set on an apparatus base 301, by a suction holding device (not shown) serving for vacuum suction, and the panel substrate 3 is held by a built-in panel moving device so as to be movable back and forth, right and left. Also, the panel substrate 3 on the stage 305a is detected for its position by a position detection unit (e.g., CCD camera) 306 for detecting a position, and detected for its thickness by a laser displacement gauge 307, which is a distance detector for measuring a thickness, and their detection signals are outputted to a control board (transfer distance control device) 308.

To a guide frame 302 placed on both sides of the X-Y stage device 305 on the apparatus base 301, a basic unit 304 which is supported so as to be movable by a mover device 311 in the right-and-left direction via a horizontal rail 311b and which is also supported via a vertical rail 311a so as to be liftable is set as it is covered with a unit cover 304a. Then, based on an operation signal from the control board 308, the basic unit 304 is moved horizontally and vertically by the mover device 311. Also, based on the detection signal from the laser displacement gauge 307, an operation signal is transmitted from the control board 308 to the mover device 311, by which the distance between the basic unit 304 (intermediate body) and the panel substrate 3 is controlled. Further, upon reaching a predetermined position of the panel substrate 3, the electrically charged pattern-forming material particles 1 containing forming materials are discharged from a particle tank 309 onto the panel substrate 3 via the basic unit 304, and a pattern is drawn on the surface of the panel substrate 3. This pattern forming apparatus is entirely covered with a cover 312, and maintained at constant temperature and humidity appropriate for transfer by an unshown atmosphere controller such as temperature controller or air-conditioning device.

Figure 56A:
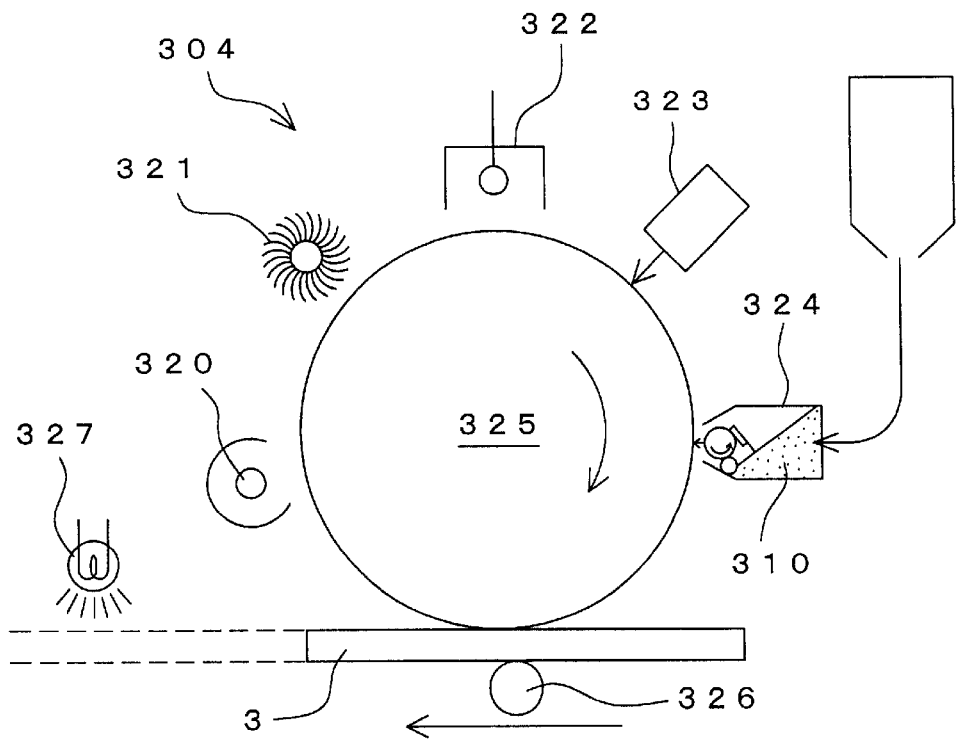
FIG. 56A is a structural view of the basic unit of a pattern forming apparatus having a columnar intermediate body.
Figure 56B:
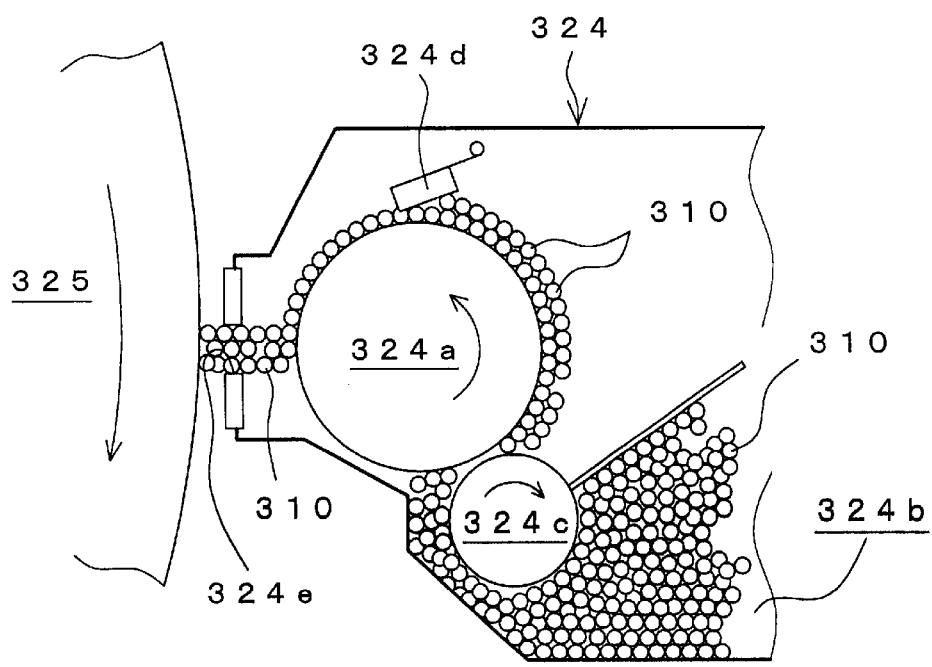
FIG. 56B is an enlarged sectional view of the developing device of the pattern forming apparatus.

Next, the structure of the basic unit 304 housed within the casing 304a is explained with reference to FIGS. 56 and 57. FIGS. 56A and 56B shows a case in which an intermediate body 325 for transferring the pattern-forming material particles 1 to the panel substrate 3 is formed of a columnar photoconductor, and FIGS. 57A and 57B show a case in which the intermediate body 325 is formed of a platy photoconductor, where the basic unit in either case includes an eraser (erasing device) 320, a cleaner 321, an electric charger (electrostatic-pattern forming device) 322, an exposure device (electrostatic-pattern forming device) 323, a developing unit (developing device) 324, and the intermediate body 325. The apparatus base 301 is provided with a voltage generator 326 and a fixing unit 327.

Accordingly, the cleaner 321 is intended to remove pattern-forming material particles 1 left on the surface of the intermediate body 325, where physical removal by a brush is simple. A sponge-like cleaner formed of a nylon thin-bristle brush, urethane, or the like, which is periodically replaceable, is used. Further, erasing the electric charges before the physical removal with the cleaner 321 allows an efficient removal to be accomplished.

The charger 322 is one making use of corona discharge as an example, and the intermediate body 325 is electrically charged to a polarity opposite to the polarity of the pattern-forming material particles 1. Otherwise, it is also possible that the intermediate body 325 is charged to the same polarity as the pattern-forming material particles 1, where a bias voltage of the same polarity as the pattern-forming material particles 1 is applied to a metallic roller 324a provided within the later-described developing unit 324.

The exposure device 323, which digitally irradiates a laser beam to remove electric charges present at portions unnecessary for the pattern according to the pattern, generates electricity partly on the photoconductor at the surface of the intermediate body 325 to thereby remove the electric charges, thus forming an electrostatic pattern.

The developing unit 324 electrically charges the pattern-forming material particles 1 and feeds them to the surface of the intermediate body 325. As shown in FIG. 56B, a 20 mm-dia. metallic roller 324a made of aluminum is internally provided, while a sponge-like particle feed roller 324c is provided at an outlet of a storage section 324b where the pattern-forming material particles 1 are stored. The particle feed roller 324c, by its rotating, feeds the pattern-forming material particles 1 placed in the developing unit 324 toward the metallic roller 324a. The carried pattern-forming material particles 1, as laid in a stack on the peripheral surface of the metallic roller 324a, are negatively charged by a blade 324d rubbing thereagainst, besides restricted in thickness to one to three layers, and further electrostatically transferred from the metallic roller 324a to the electrostatic-pattern portions of the intermediate body 325. The blade 324d is formed by fitting silicone rubber to a fore end portion of a metallic sheet material having elasticity, where the pattern-forming material particles 1, when put into frictional contact with the silicone rubber, are electrically charged.

Although pattern-forming material particles 1 which are negatively charged are used in this case, the pattern-forming material particles 1 may be those which are positively charged, in which case a positive voltage or potential needs to be applied to the intermediate body 325.

With this constitution, first, the entire surface of the intermediate body 325 is electrically erased by the eraser 320, and then the surface of the intermediate body 325 is cleaned by the cleaner 321 so that remaining pattern-forming material particles 1 are removed, and thereafter the entire surface of the intermediate body 325 is electrically charged by the charger 322. Further, electric charges at non-pattern portions of the surface of the intermediate body 325 are removed by the exposure device 323, by which an electrostatic pattern is formed at necessary portions. Furthermore, the charged pattern-forming material particles 1 are deposited from the developing unit 324 onto the pattern on the surface of the intermediate body 325. Thereafter, the surface of the intermediate body 325 and the panel substrate 3 are opposed to each other in a non-contact state, where the pattern-forming material particles 1 on the surface of the intermediate body 325 are transferred onto the panel substrate 3 by an electrostatic force due to the voltage applied to the panel substrate 3 by the voltage generator 326. After that, the pattern-forming material particles 1 on the panel substrate 3 are fixed with heat or light or the like by the fixing unit 327, by which the pattern is completed. Then, as required, the transfer of the pattern-forming material particles 1 is repeated to a plurality of times, and thereafter the panel substrate 3 is baked.

The transfer of the pattern-forming material particles from the intermediate body 325 to the panel substrate 3 is implemented by electrical transfer fulfilled by the voltage generator 326 from the back side of the panel substrate 3 to the panel substrate 3, where an electrical potential of 10000 V is applied to the back side of the panel substrate 3, causing an electrical potential of about 1000 V to be generated at the surface of the panel substrate 3.

However, when a back-side voltage is applied, the voltage is partitioned by the capacitor component of the panel substrate 3, resulting in a reduced electrical potential difference between the particle feeder and the panel substrate. Also, when the thickness of the panel substrate 3 varies, the electrical potential difference between the intermediate body 325 and the panel substrate 3 also varies, resulting in an unstable electric field therebetween. For this reason, it is preferable to directly charge the surface of the panel substrate 3 so that a constant electric field is formed. Therefore, preferably, the voltage of 1000 V is applied directly to the surface of the panel substrate 3 so that the pattern-forming material particles 1 are transferred from the intermediate body 325. The charger 322 for directly charging the surface of the panel substrate 3 is exemplified by a corona charger or a contact charger.

Figure 57A:
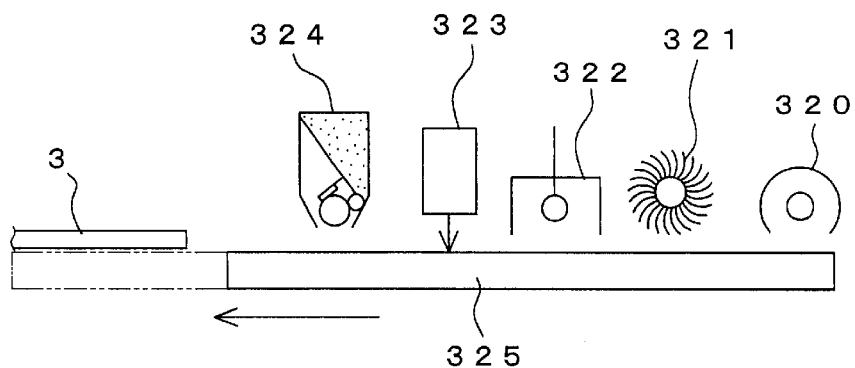
FIG. 57A is a structural view of the basic unit of a pattern forming apparatus having a platy intermediate body.
Figure 57B:
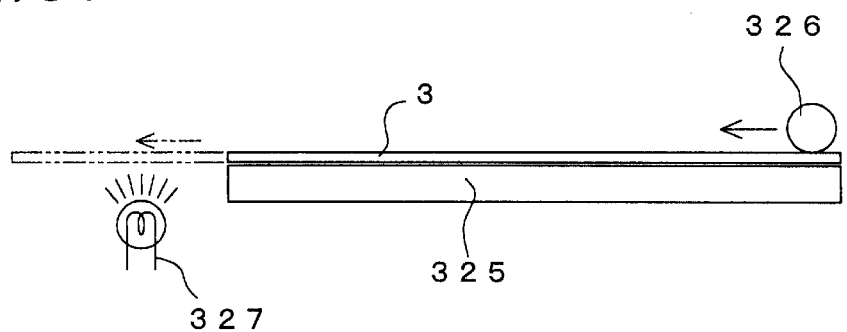
FIG. 57B is an explanatory view of the transfer part of the pattern forming apparatus.

In the case where the intermediate body 325 is given by a platy photoconductor, as shown in FIGS. 57A and 57B, the intermediate body 325 with the pattern-forming material particles 1 deposited on the top surface is moved, while the panel substrate 3 is brought to the top surface in a non-contact state, where the pattern-forming material particles 1 are transferred to the bottom surface of the panel substrate 3.

The photoconductor constituting the intermediate body 325 uses for example, an organic photoconductor in which a photoconductive layer is formed on an aluminum plate serving as a substrate. As to the kind of the photoconductor, either amorphous photoconductors or selenium based photoconductors are adoptable.

The panel substrate 3 is placed on the stage surface 305a of the X-Y stage device 305, the placement position being changeable back and forth, right and left. In the X-Y stage device 305, the suction holding device for holding the panel substrate 3 to the stage surface 305a includes a positioning device (not shown) for determining a position taken as the basic point for pattern formation.

The pattern transferred from the intermediate body 325 onto the surface of the panel substrate 3 in this way will be temporarily set (fixed) stably on the panel substrate 3, even as it is, by the energy at the collision of the jet stream of the pattern-forming material particles against the surface of the panel substrate 3 or by the pressing force at the transfer. However, in order to strengthen this temporary setting force, another pressing force may be applied by the fixing unit 327, or the adhesion force may be increased by, for example, melting resin components of the pattern-forming material particles 1.

The pattern-forming material particles 1 colliding with the surface of the panel substrate 3 or the intermediate body 325, when having no strong adhesive force or sticking force in themselves, may be scattered in dots beyond the pattern-forming area as a result of reaction against the collision. For prevention of this, it is preferred to apply oil, an adhesive, or a solvent to the pattern-forming surface of the intermediate body 325, so that the collision energy of the pattern-forming material particles 1 is absorbed or that the adhesion force onto the panel substrate 3 is increased, thereby preventing the pattern-forming material particles 1 from being scattered.

Further, the pattern formed on the surface of the panel substrate 3 or the intermediate body 325 is good at precision, even as it is. However, in the case where the precision needs to be further enhanced, it is also possible to provide a step (h) for performing an exposure and development process, where a screen (not shown) having an opening pattern corresponding to a desired pattern is placed on the pattern formed on the surface of the panel substrate 3, and an exposure and development process is performed. In this case, the resins constituting the pattern-forming material particles 1 are preferably thermosetting ones that allow the exposure and development processes to be accomplished.

Also, referring to FIG. 55, the panel substrate 3 is detected for its position by the position detection unit 306, and detected for its thickness by the laser displacement gauge 307, by which the distance between the panel substrate 3 and the intermediate body 325 is detected. The basic unit 304 is constituted so as to be movable by the mover device 311 horizontally and vertically via the vertical rail 311a and the horizontal rail 311b. Therefore, the mover device 311 is driven by the control board 308 to control the distance between the intermediate body 325 and the panel substrate 3 to 0.3 mm or less. The addition of this action allows a further finer, higher-precision pattern formation to be accomplished with the pattern-forming material particles 1 transferred from the intermediate body 325 onto the panel substrate 3.

Next, the pattern forming method for forming a desired pattern on the surface of the panel substrate 3 by using this pattern forming apparatus is explained in a clarified order.

This method includes the following seven steps (a) to (g), for forming a pattern on the surface of the panel substrate 3, that is:

- a step (a) of electrically charging the pattern-forming material particles 1;
- a step (b) of forming an electrostatic pattern on the intermediate body 325;
- a step (c) of depositing the pattern-forming material particles 1 to the electrostatic pattern of the intermediate body 325 formed at the step (b);
- a step (d) of transferring the pattern-forming material particles 1 deposited on the intermediate body 325 at the step (c) onto the panel substrate 3;
- a step (e) of fixing the pattern-forming material particles 1, which have been transferred onto the pattern at the step (d), onto the panel substrate 3;
- a step (f) of cleaning the intermediate body 325 after the transfer of the step (e); and
- a step (g) of baking the panel substrate 3 having the pattern-forming material particles 1 fixed thereon, thereby forming a pattern.

It is noted that the step (g) may include repeating the steps (a) to (f) to a plurality of times to form a plurality of patterns on the panel substrate 3 and then baking these patterns collectively, where the fixing of the step (d) may also be performed collectively. The plurality of patterns are obtained, for example, by forming on the panel substrate 3 a silver pattern, thereafter forming a pattern of oxide and further forming a pattern of ceramics. Other than this example, in some cases where a pattern of a thickness cannot be formed at one time, several times of pattern formation may be performed to obtain the thickness. When a plurality of times of pattern formation are involved, such a collective baking process as shown above will be convenient.

The step (a) is a step for electrically charging the pattern-forming material particles 1 with the blade 324d of the developing unit 324. The blade 324d has silicone rubber fitted to a fore end of a springy metallic sheet member, and putting the silicone rubber into frictional contact with the pattern-forming material particles 1 allows the pattern-forming material particles 1 to be electrically charged.

The step (b) is a step for forming an electrostatic pattern on the intermediate body 325, where many methods are available. An adoptable method is, for example, one including: electrically charging the intermediate body 325 all over its surface with the charger 322, thereafter applying a laser beam to unnecessary non-pattern portions with the exposure device 323 to generate electricity to the photoconductor, thereby removing the electric charges of the non-pattern portions.

The step (c) is a step for depositing the pattern-forming material particles 1 onto the electrostatic pattern of the intermediate body 325 formed at the foregoing step. The pattern-forming material particles 1 electrically charged at the step (a) are fallen onto the electrostatic pattern, or transferred from the developing unit 324 onto the intermediate body 325.

The step (d) is a step for transferring the pattern-forming material particles 1 deposited on the intermediate body 325 onto the panel substrate 3. A voltage is applied from the back side of the panel substrate 3 with the voltage generator 326, by which the pattern-forming material particles 1 are transferred onto the surface in the form of a pattern as it is.

The step (e) is a step for fixing the pattern to glass. Heat, light or the like is emitted by the fixing unit 327, so that a part of the resin components contained in the pattern-forming material particles 1 is fused so that the pattern is fixed to the surface of the panel substrate 3.

The step (f) is a step for removing pattern-forming material particles left on the intermediate body 325 with the cleaner 321. In the case where the intermediate body 325 is provided by a photoconductor, the pattern will not be drawn at the same position, and therefore a failure to completely remove such pattern-forming material particles 1 with the cleaner 321 would cause patterns to be drawn at unnecessary places. In the case of a photoconductor, since firstly performing the cleaning physically would damage the surface of the photoconductor, causing a deterioration in patterning precision, the cleaning should be done by firstly erasing the charges with the eraser 320, then applying the cleaning process with the sponge-like cleaner 321 formed of a soft, nylon thin-bristle brush or urethane. The cleaner 321 is periodically replaced. Otherwise, it is even more effective to remove the left pattern-forming material particles with a voltage higher than the voltage used for the patterning.

In the case of a platy intermediate body 325 (including later-described first and second modifications), the cleaning may also be done by sucking up the pattern-forming material particles 1 from the intermediate body 325 with the use of a vacuum suction nozzle or the like. In addition to such methods utilizing air stream, methods utilizing ultrasonic vibrations are also available for the removal of the left pattern-forming material particles 1, and further those methods may be performed in combination. This removal operation for the pattern-forming material particles 1 is, preferably, periodically done also at times other than the pattern formation.

Further, the step (g) is a step for baking the panel substrate 3 having the pattern. By this baking, the resin components of the pattern-forming material particles 1 are evaporated, by which a pattern composed mainly of metal or glass components is formed.

The pattern-forming material particles 1 have only to be electrically chargeable. Therefore, electrically conductive materials need to be buried in the resin so as to be insulators, or covered with insulating particles. Material and structure of the pattern-forming material particles 1 have only to be those which allow the particles to be fixedly set onto the panel substrate 3 by the fixing or baking process. The material and the structure depend on the kind of the object on which the pattern is to be formed, i.e., on the kind of the panel substrate 3 such as a PDP, liquid crystal panel, circuit board, or the like. For example, the pattern-forming material particles are particles having a particle size of 0.5 to 15 $\mu$m formed from a compound material which contains particle bodies and hard inorganic fine particles deposited on the surfaces of the particle bodies, the particle bodies containing one or more kinds of inorganic material selected from a group consisting of metal, metal oxide, ceramics, and glass, and a binder resin with a ratio of the inorganic material to the total amount of the inorganic material and the binder resin being 30 to 99 wt %. With the ratio of the inorganic material less than 30 wt % or beyond 99 wt %, it would be impossible to control the charge amount of the particles. Also, with the particle size less than 0.5 $\mu$m or beyond 15 $\mu$m, it would be impossible to control the charge amount per unit volume.

As the metal for obtaining the particle bodies, are usable electrode materials such as silver, gold, copper, or silver-palladium. As the metal oxide, are usable barrier materials such as alumina, titanium oxide, and glass frit, or fixing agents. The binder resin is exemplified by thermoplastic resins including: polyethylene, polypropylene, polyvinyl chloride, styrene, ethylene vinyl acetate copolymer, polyester, and polystyrene; cellulose resins such as methyl cellulose, ethyl cellulose, nitrocellulose, cellulose acetate, cellulose propionate, and cellulose butyrate; or methacrylic resins such as methyl methacrylate, ethyl methacrylate, normal butyl methacrylate, isobutyl methacrylate, and isopropyl methacrylate.

As to the manufacturing method of the pattern-forming material particles 1, for example, the above materials are melted and kneaded, rolled and cooled, ground into several mm squares with a hammer mill or cutter mill, further ground into 0.5 to 15 $\mu$m with a grinding mill, classified so that coarse particles of 20 $\mu$m or more particle sizes as well as fine particles of 5 $\mu$m or less particle sizes are excluded, by which particle bodies are obtained. Then, fine particles of colloidal silica, titanium oxide, alumina, or the like can be deposited on the surfaces of the particle bodies with a fast fluidizing mixer. Further, a spheroidizing process may be performed by making the particles into a sprayed state in a high-temperature thermal air stream.

The pattern-forming material particles 1 can also be obtained by microcapsulation methods, polymerization methods, spray dry methods, or the like.

The pattern-forming material particles 1 may be particles of 0.5 to 20 $\mu$m particle sizes formed of metal particles or ceramic particles coated with resin. It is also possible to coat metal particles and ceramics or glass with resin respectively as different particles, and to feed the individual particles onto the pattern, followed by fixing and baking process, thereby forming a pattern.

The third embodiment has an issue in the control of the distance between the intermediate body 325 and the panel substrate 3. A change in the distance causes the pattern to be smeared. Changes in temperature and humidity also cause the change of the charging amount of the particles, which in turn cause the pattern to be smeared.

In this third embodiment, the panel substrate 3 is held by a flat stage surface 308a of the X-Y table 308 and the panel substrate 3 is vacuum-sucked on the flat stage surface 308a by a suction holding device. Therefore, even if the panel substrate 3 is so thin as to tend to undulate or warp, these tendencies can be solved by vacuum suction, which makes the panel substrate 3 aligned along the plane of the stage surface 308a, so that the distance between the panel substrate 3 and the intermediate body 325 can be maintained constant.

In this third embodiment, the thickness of the panel substrate 3 is continuously measured with the laser displacement gauge 307, and the distance between the intermediate body 325 and the panel substrate 3 can be controlled by moving the basic unit 304 up and down with the mover device 311 according to the detection signal obtained by the measurement with the laser displacement gauge 307. Thus, more or less undulations and warps of the panel substrate 3 can be solved. Further, the precision can be further improved by setting the laser displacement gauge 307 at two places on the right and left of the basic unit 304 and by finely moving the basic unit 304 according to detection data therefrom to thereby control the distance between the intermediate body 325 and the panel substrate 3.

In the working of the pattern forming method, the charging state and transfer state of the pattern-forming material particles 1 need to be maintained constant by maintaining constant the ambient temperature and humidity of the interior of the basic unit 304, particularly, the peripheries of the developing unit 324 or the vicinities of the transfer section or the like by an atmosphere controller such as temperature controller or air-conditioning device, within the cover 312.

After the pattern formation, electric charges are preferably removed as soon as possible from the pattern-forming surfaces of the panel substrate 3 and the intermediate body 325. Therefore, it is preferable that parts involved in the pattern formation are covered with the cover 312, for example as shown in FIG. 55, so that an electrostatic stream or air stream is directed from inside to outside of the cover 312 so as to be applied to the pattern-forming surface of the panel substrate 3 or intermediate body 325, thus erasing electric charges.

Further, in the third embodiment, the distance between the intermediate body 325 and the panel substrate 3 and the distance between the intermediate body 325 and the developing unit 324 are appropriately 0.3 mm or less, and preferably suppressed to 0.150±0.025 mm for better precision of patterning. For easier fulfillment of this, it is recommendable to increase the surface precision so that the intermediate body 325 is held at high precision. In addition, making the distance smaller allows even better precision of patterning to be achieved. Also, the smaller the width of the intermediate body 325 is made, the smaller the distance can be made. This width of the intermediate body 325 is preferably 200 mm or less and, more preferably, 100 mm or less.

Scattering of the pattern-forming material particles 1 on the surface of the panel substrate 3 can be prevented by applying an adhesive solvent such as polyvinyl alcohol and turpentine oil to the surface of the panel substrate 3.

According to the third embodiment, process and equipment for forming a desired pattern onto a substrate constituting a large-scale panel for PDPs, liquid crystal panels, circuit boards, or the like are simplified, and the pattern-forming material particles 1 are not deposited directly onto the panel substrate 3 but once deposited onto the electrostatic pattern of the intermediate body 325 and subsequently transferred to the panel substrate 3. Therefore, the deposition and transfer-and-feed of the pattern-forming material particles 1 can be accomplished smoothly, and the pattern formation on the panel substrate 3 can be accomplished stably with high precision. As a result of this, the panel substrate 3 on which a pattern is formed can be manufactured with low price.

In the third embodiment, a photoconductor has been employed as the intermediate body 325. However, the photoconductor, in some cases, cannot maintain the pattern precision for a long time because of deterioration of its surface, planarity or the like. Further, toner formed of the forming material and left on the photoconductor surface without being transferred may cause the pattern precision to be deteriorated, while the photoconductor is expensive, disadvantageously.

Figure 58:
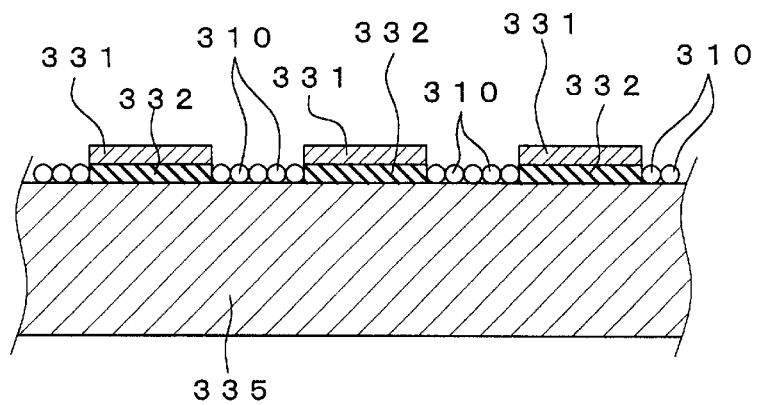
FIG. 58 is a partly enlarged sectional view showing a first modification of the pattern forming apparatus according to the third embodiment of the present invention.

FIG. 58 shows a first modification of the third embodiment as a solution to those issues, proposing an intermediate body without any photoconductor.

More specifically, an electrically conductive layer 331 is formed so as to be stacked on non-pattern portions of the surface of a drum-like or platy intermediate body 335 with an insulating layer 332 interposed therebetween. Given a positive voltage applied to the intermediate body 335, electrically charging the conductive layer 331 with a negative voltage causes negatively charged pattern-forming material particles 1 to be deposited onto places to be patterned between the layers 331, 332 by the attractive force and repulsive force of static electricity. Thereafter, electrical transfer may be done onto the panel substrate 3 by a voltage generator 326 from the back side of the panel substrate 3. The conductive layer 331 is given by, for example, a pattern of copper. In addition, in some cases, three or more layers may be provided by forming a layer of a fixing agent or the like at the interface of the intermediate body 335 and the insulating layer 332, or between the insulating layer 332 and the conductive layer 331.

Figure 59:
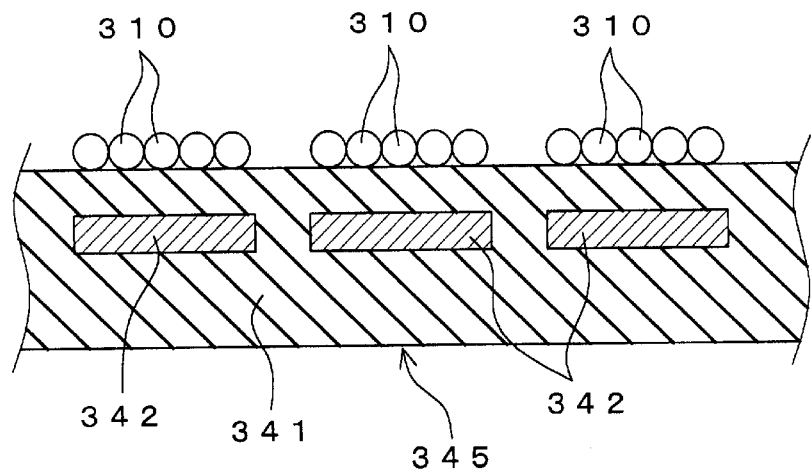
FIG. 59 is a partly enlarged sectional view showing a second modification of the pattern forming apparatus according to the third embodiment of the present invention.

FIG. 59 proposes a second modification of the intermediate body which stands stable for further longer time.

More specifically, in this modification, a metallic conductor 342 is buried along pattern portions in a substrate 341 made of an insulator such as glass or ceramics, by which a drum-like or platy intermediate body 345 is formed. The pattern-forming material particles 1 are deposited onto the intermediate body 345 with the developing unit 324 by applying a voltage of about 800 V to the conductor 342, and then these deposited pattern-forming material particles 1 are transferred onto the panel substrate 3 electrically by applying a higher voltage with the voltage generator 326 from the back side of the panel substrate 3, where this transfer is done with a voltage of 1500 V, higher than that of deposition of the pattern-forming material particles 1. Therefore, in this method, the charger 322 and the exposure device 323 are no longer necessary, and the pattern forming apparatus constructed by an electrical conductor 333 buried in the intermediate body 325, and a voltage applying device (not shown) for electrically charging the conductor 333.

In both first and second modifications, it is also possible to sprinkle the electrically charged pattern-forming material particles 1 onto the surface of the intermediate body 335, 345 and recover unnecessary portions thereof. Preferably, non-pattern portions of upper part of the conductive layer 331 or non-pattern portions of its top surface where the conductor 342 is not buried are coated with a non-adhesive material such as fluorine coat or silicon. Further, even if the operation of removing the remaining pattern-forming material particles 1 is periodically performed also at times other than the pattern formation in the step (f) for cleaning the intermediate body 335, 345, the intermediate body is less deteriorated as compared with the case where a photoconductor is used as the intermediate body 335, 345.

Figure 60:
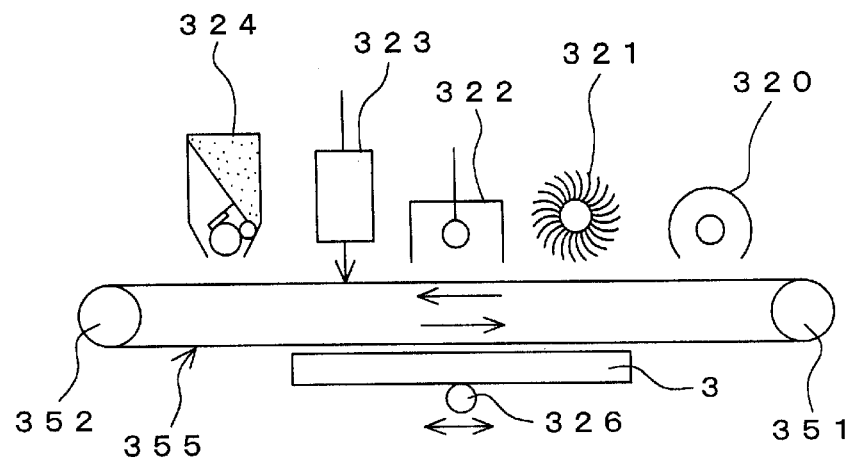
FIG. 60 is a structural view showing the basic unit of a pattern forming apparatus according to the third embodiment of the present invention and which has a sheet-like intermediate body.

FIG. 60 shows a third modification in which the intermediate body 325 is formed into an endless belt shape, where the same members are designated by the same reference numerals as in the foregoing embodiments or modifications and their description is omitted.

This intermediate body 355, in which a photoconductor is formed on, for example, a silicon sheet, has a thickness of 2 mm and an endless belt shape with softness and flexibility, and is wound around two guide rollers 351, 352 placed horizontally with a specified spacing so as to be moved in arrow directions. An eraser 320 removes static electricity left on the surface of the intermediate body 355, where the eraser 320 may be replaced with an erasing fan.

Although a photoconductor is used as the sheet-like intermediate body 355 in this case, using the intermediate body 335, 345 of the first or second modification eliminates the use of the photoconductor.

With the pattern forming method and apparatus for panel substrates according to the third embodiment of the present invention, since the process for forming a desired pattern onto a substrate constituting a large-scale panel for PDPs, liquid crystal panels, circuit boards, or the like is simplified, and since the pattern-forming material particles are not deposited directly onto the panel substrate but once deposited onto the electrostatic pattern of the intermediate body and subsequently transferred to the panel substrate, the deposition and transfer-and-feed of the pattern-forming material particles can be accomplished smoothly so that the pattern formation on the panel substrate can be accomplished stably with high precision. As a result of this, a panel on which a pattern is formed can be manufactured with low price, and yet a high-precision fine pattern can be formed on the panel substrate.

(Fourth Embodiment)

Methods exploiting the electrostatic force as in the first embodiment have the following issues.

Since the patterning is done with electrostatic force, the particles need to be insulative particles. However, for fabrication of electrode patterns, it is necessary that electrically conductive particles be contained in the particles. Containment of electrically conductive particles may cause the resultant particles to decrease in resistance value and decrease in charging amount. As a result, there is a possibility that control is impossible and patterning is impossible.

Some materials may be impossible to electrically charge by simple methods such as friction, or may be electrically charged only nonuniformly. Otherwise, in some particles, because of their nonuniformity in particles and therefore uniformity in charging amount, easier-to-pattern particles will be used for pattern formation, which may result in nonuniform composition. Otherwise, because of nonuniform charge holding time, particles may change in patternability with time.

In the fourth embodiment of the present invention, there is provided a pattern forming method for panel substrates which solves these and other issues and which is simple in process and yet good at precision of fine pattern formation.

In order to solve the above issues, in the fourth embodiment of the present invention, in a pattern forming apparatus in which pattern-forming material particles are electrically charged and then jetted out by electrostatic force so as to be deposited onto the surface of the panel substrate directly or via an intermediate body, thereby forming a pattern, a method of charging the pattern-forming material particles directly with an electric charger is used.

As the electric charger, one exploiting the corona discharge phenomenon is used.

As the method of electric charging, one of electrically charging the pattern-forming material particles with a roller is used.

Further, a method of measuring the charging amount of pattern-forming material particles and then, based on the measured value, controlling the charging amount is used.

As another method, in a pattern forming apparatus in which pattern-forming material particles are electrically charged and then jetted out by electrostatic force so as to be deposited onto the surface of the panel substrate directly or via an intermediate body, thereby forming a pattern, a method of jetting out a mixture of the pattern-forming material particles and highly chargeable particles with the mixture electrically charged is used.

As the highly chargeable particles to be mixed, particles containing 80 to 100% of resin are used. Here, the pattern-forming material particles in which the charging amount of the pattern-forming material particles per mass (Q/A) is not less than 8, preferably 10 are used.

As another method, in a pattern forming apparatus in which pattern-forming material particles are electrically charged and then jetted out by electrostatic force so as to be deposited onto the surface of the panel substrate directly or via an intermediate body, thereby forming a pattern, a method of mixing the pattern-forming material particles with highly chargeable particles, electrically charging the mixture, and then jetting out the pattern-forming material particles is used.

As the highly chargeable particles to be mixed with the pattern-forming material particles, any one of ferrite particles, magnetite particles, glass beads, iron oxide particles, and resin particles is used.

As to the particle size of the highly chargeable particles to be mixed with the pattern-forming material particles, particles having a particle size of 5 $\mu$m to 100 $\mu$m are used.

As another method, in a pattern forming apparatus in which pattern-forming material particles are electrically charged and then jetted out by electrostatic force so as to be deposited onto the surface of the panel substrate directly or via an intermediate body, thereby forming a pattern, a method of electrically charging the intermediate body and electrically charging the pattern-forming material particles at the surface of the intermediate body is used.

As another method, in a pattern forming apparatus in which pattern-forming material particles are electrically charged and then jetted out by electrostatic force so as to be deposited onto the surface of the panel substrate directly or via an intermediate body, thereby forming a pattern, a pattern forming method for panel substrates including electrically charging the particles by friction between a blade and the pattern-forming material particles is used.

A method of coating a surface of the blade with highly chargeable particles is used.

A method of applying a voltage to the blade is used.

As another method, in which pattern-forming material particles are electrically charged and then jetted out by electrostatic force so as to be deposited onto the surface of the panel substrate directly or via an intermediate body, thereby forming a pattern, a method including, in electrically charging the pattern-forming material particles with a roller, controlling the rotational speed of the roller is used.

As another method, in a pattern forming apparatus in which pattern-forming material particles are electrically charged and then jetted out by electrostatic force so as to be deposited onto the surface of the panel substrate directly or via an intermediate body, thereby forming a pattern, a method of processing the pattern-forming material particles in plasma is used.

For the processing in plasma, a method of introducing an inert gas or oxygen into a vacuum is used for plasma processing.

Hereinbelow, a pattern forming apparatus as well as its attached mechanisms according to the fourth embodiment of the present invention are described in detail with reference to the accompanying drawings.

First, the pattern forming apparatus is explained.

Figure 61:
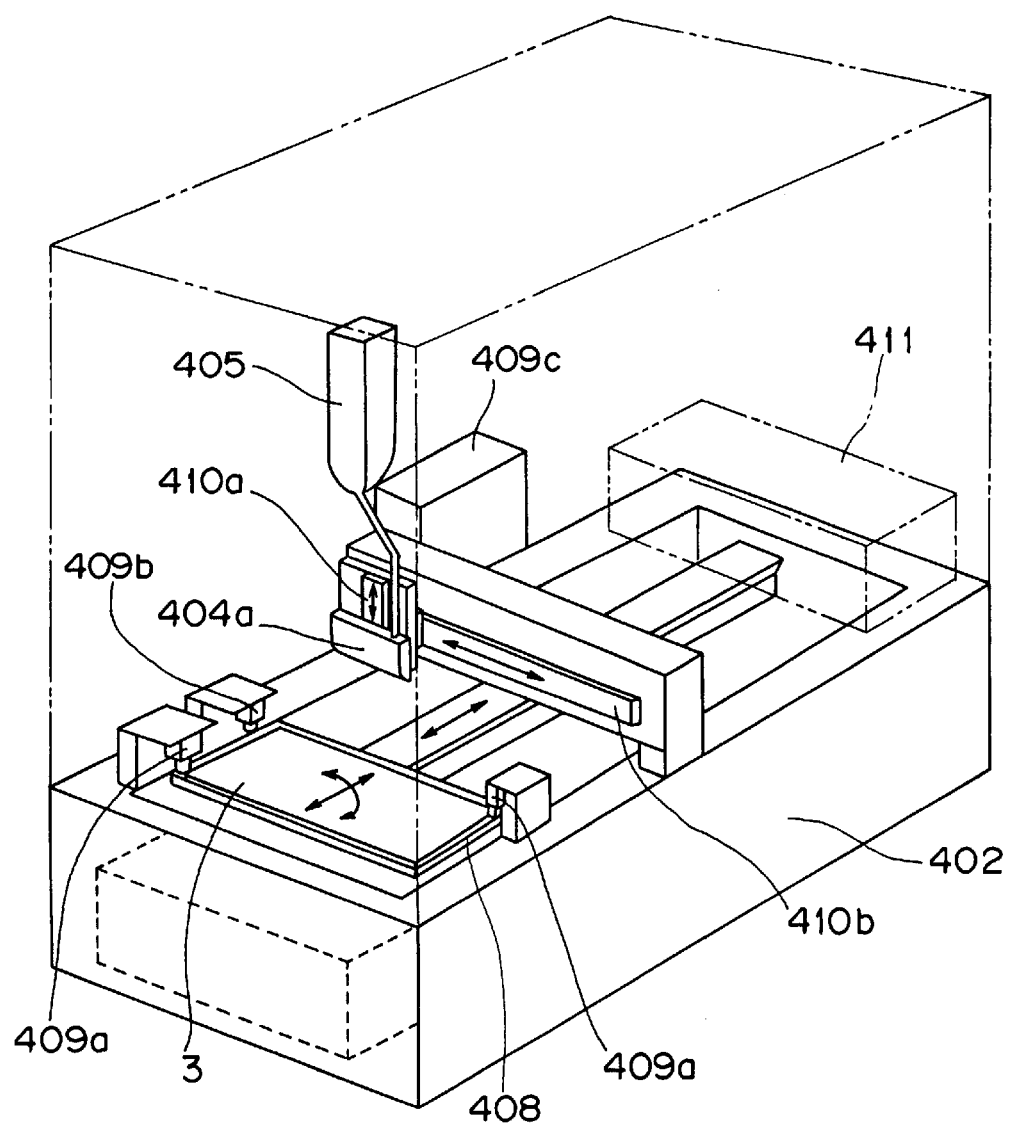
FIG. 61 is a perspective view representing a pattern forming apparatus according to a fourth embodiment of the present invention.
Figure 62:
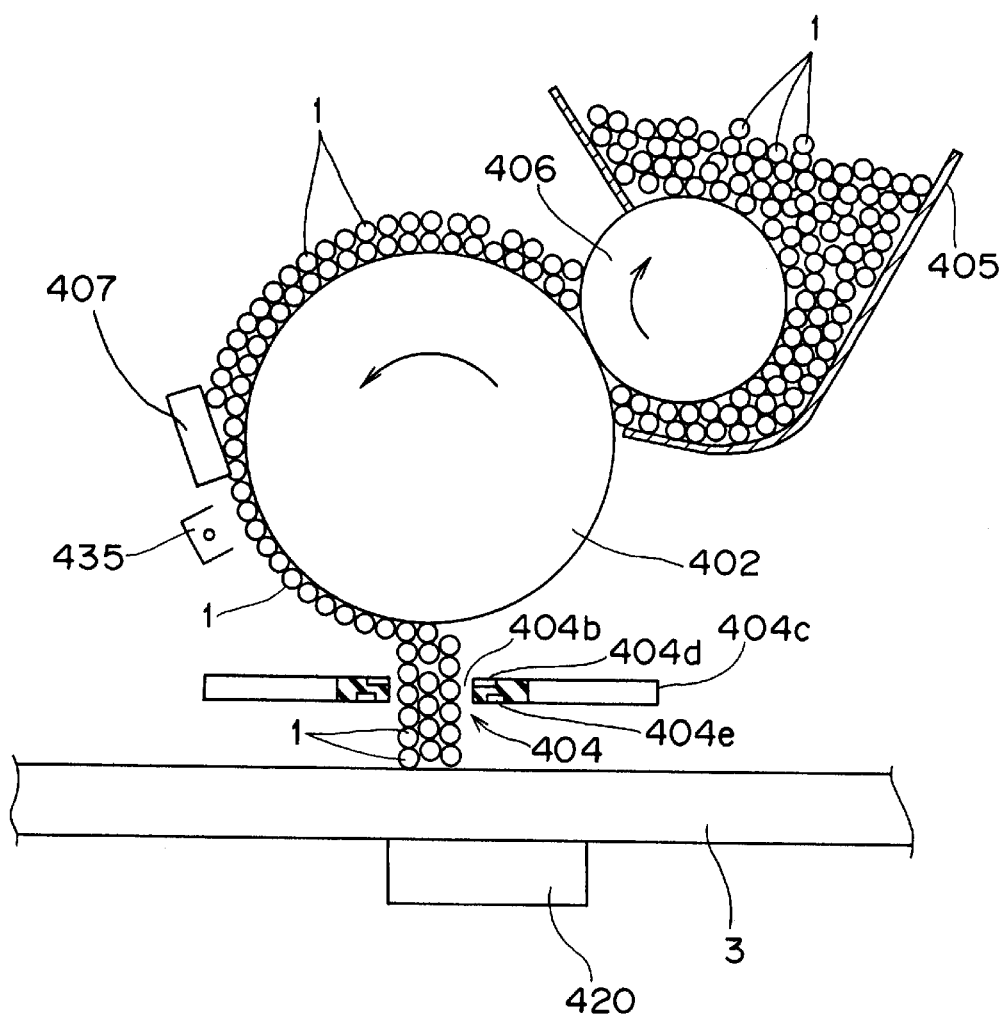
FIG. 62 is an enlarged sectional view representing a part of the pattern forming apparatus according to the fourth embodiment.

FIGS. 61 and 62 shows a pattern forming apparatus for panel substrates according to the fourth embodiment of the present invention.

This panel substrate is equipped with a particle feeder 402 for carrying and conveying pattern-forming material particles 1, and moreover a nozzle 404 placed between the particle feeder 402 and a panel substrate 3. In addition, although a roller-like particle feeder 402 is shown in FIGS. 61 and 62, the particle feeder 402 is not limited to this, and may be belt-like shaped, for example. The panel substrate 3 is given by a glass plate or the like. The nozzle 4, housed in a nozzle casing 404a, is provided by an FPC (Flexible Printed Circuit board) 404c having holes 404b that allow the pattern-forming material particles 1 to pass therethrough. In a hopper 405 for housing therein the pattern-forming material particles 1, a particle feed roller 406 is provided and, when rotating, feeds the pattern-forming material particles 1 within the hopper 405 toward the particle feeder 402. The carried pattern-forming material particles 1, which are placed and stacked on the peripheral surface of the particle feeder 402, are negatively charged by a blade 407 rubbing thereagainst, and regulated in thickness to one-three layers. The pattern-forming material particles 1 having reached the position of the nozzle 404 are jetted out from the particle feeder 402 to the surface of the panel substrate 3 under voltage control by a control electrode 404d.

The panel substrate 3 is supplied with a voltage application of about +1000 V with respect to the particle feeder 402. The control electrode, under a non-jet state, is supplied with a voltage application of −100 to −200 V with respect to the particle feeder 402. In a jet state, the control electrode is set to 0 V, causing the negatively charged pattern-forming material particles 1 to be jetted out to the panel substrate 3 by electrostatic force.

A charger 435 for electrically charging the panel substrate 3 may be given in the charging system that the panel substrate 3 is charged from its top surface side such as in a corona charger or contact charger, or in the back charging system that the panel substrate 3 is given a voltage from its back, as in a voltage generator 426. However, when a back-side voltage is applied, the voltage is partitioned by the capacitor component of the panel substrate 3, resulting in a reduced voltage difference between the particle feeder 402 and the panel substrate 3. Also, when the thickness of the panel substrate 3 varies, the voltage difference between the particle feeder 402 and the panel substrate 3 also varies, resulting in an unstable electric field therebetween. For this reason, it is preferable to directly charge the surface of the panel substrate so that a constant electric field is formed.

Around the nozzle hole 404b, in addition to the control electrode 404d for turning on and off the jet-out of the pattern-forming material particles 1, a deflecting electrode 404e is also buried on the panel substrate 3 side, so that the pattern-forming material particles 1 are controlled in their jet-out angle by the action of the deflecting electrode 404e. The deflecting electrode 404e performing such an action is, generally, placed at a position opposite to the control electrode 404d around the nozzle hole 404b, so as to deflect the jet stream of the pattern-forming material particles 1 toward one direction such as the back-and-forth direction or the right-and-left direction. Otherwise, the deflecting electrode may be a ring-shaped one for converging and throttling the jet stream of the pattern-forming material particles 1, other than such a deflecting electrode as shown above.

The panel substrate 3 is placed on an X-Y table 408, with the placement position of the panel substrate 3 changeable back and forth, right and left, by the movable functions of the X-Y table 408 in the X direction and the Y direction. The holder for the panel substrate 3 like the X-Y table 408 includes a positioning device (not shown) for determining a position taken as the basic point for pattern formation.

By appropriately combining the control of the jet-out angle of the pattern-forming material particles 1 and the change of the position of the panel substrate 3, the pattern-forming material particles 1 jetted out from the nozzle 404 are enabled to form a desired pattern (not shown). Such a pattern is generally formed directly on the surface of the panel substrate 3, but in some cases, as described later, may be temporarily formed on intermediate bodies 425, 428, 429 and then transferred from the intermediate bodies 425, 428, 429 onto the panel substrate 3. When such intermediate bodies 425, 428, 429 are used, it is needless to say that the jet stream of the pattern-forming material particles 1 is made by electrically charging these intermediate bodies 425, 428, 429.

The pattern directly formed on the surface of the panel substrate 3 or transferred from intermediate members or the intermediate bodies 425, 428, 429 in this way will be temporarily set (fixed) stably on the panel substrate 3, even as it is, by the energy at the collision of the jet stream of the pattern-forming material particles 1 against the surface of the panel substrate 3 or by the pressing force at the transfer. However, in order to strengthen this temporary setting force, another pressing force may be applied, or the adhesion force may be increased by, for example, melting resin components of the pattern-forming material particles 1.

The nozzle casing 404a, in which the charging feeder 402 and the particle feed roller 406 are housed, is attached to a horizontal rail 410b via a vertical rail 410a, and thus being movable right and left, up and down. The addition of this action allows a further finer pattern formation to be accomplished with the pattern-forming material particles 1 jetted out from the nozzle 404.

With this pattern forming apparatus, a desired pattern is formed on the surface of the panel substrate 3, where the method for this formation includes the following four steps (a) to (d), and generally, further includes the following baking step (e):

Step (a): a step of electrically charging the pattern-forming material particles 1 with the blade 407 of the particle feeder 402;

Step (b): a step of applying electrostatic force generated between the particles 1 and the panel substrate 3 to the electrically charged pattern-forming material particles 1 to thereby jet out the particles 1 from the hole 404b of the nozzle 404;

Step (c): a step of forming a desired pattern with the jetted-out pattern-forming material particles 1;

Step (d): a step of fixing the pattern onto the panel substrate 3, where the pattern may be either formed and fixed directly onto the panel substrate 3 or temporarily formed on the intermediate bodies 425, 428, 429 and then transferred and fixed onto the panel substrate 3 as described before; and Step (e): a step of baking the panel substrate 3 having the fixed pattern with a kiln 411, where resin components are evaporated by baking, by which a pattern composed mainly of metal or glass components is formed.

Material and structure of the pattern-forming material particles to be used in the fourth embodiment of the present invention have only to be those which allow the particles to be fixedly set onto the panel substrate by the fixing or baking process. In brief, the material and the structure depend on the kind of the object on which the pattern is to be formed, such as a PDP, liquid crystal panel, circuit board. For example, the pattern-forming material particles are particles each having a particle size of 0.5 to 15 μm formed from a compound material which contains particle bodies and hard inorganic fine particles deposited on the surfaces of the particle bodies, the particle bodies containing one or more kinds of inorganic material selected from a group consisting of metal, metal oxide, ceramics, and glass, and a binder resin with a ratio of the inorganic material to the total amount of the inorganic material and the binder resin being 30 to 99 wt %. With the ratio of the inorganic material less than 30 wt % or beyond 99 wt %, it would be impossible to control the charge amount of the particles. Also, with the particle size less than 0.5 μm or beyond 15 μm, it would be impossible to control the charge amount per unit volume, resulting in impossibility to control the particles.

As the metal for obtaining the particle bodies, are usable electrode materials such as silver, gold, copper, or silver-palladium. As the metal oxide, are usable barrier materials such as alumina, titanium oxide, and glass frit, or fixing agents. The binder resin is exemplified by thermoplastic resins including: polyethylene, polypropylene, polyvinyl chloride, styrene, ethylene vinyl acetate copolymer, polyester, and polystyrene; cellulose resins such as methyl cellulose, ethyl cellulose, nitrocellulose, cellulose acetate, cellulose propionate, and cellulose butyrate; or methacrylic resins such as methyl methacrylate, ethyl methacrylate, normal butyl methacrylate, isobutyl methacrylate, and isopropyl methacrylate.

For the obtainment of the pattern-forming material particles 1, for example, the above materials are melted and kneaded, rolled and cooled, ground into several mm squares with a hammer mill or cutter mill, further ground into 0.5 to 15 μm with a grinding mill, classified so that coarse particles of 20 μm or more particle sizes as well as fine particles of 5 μm or less particle sizes are excluded, by which particle bodies are obtained. Then, fine particles of colloidal silica, titanium oxide, alumina, or the like can be deposited on the surfaces of the particle bodies with a fast fluidizing mixer. Further, a spheroidizing process may be performed by making the particles into a sprayed state in a high-temperature thermal air stream.

The pattern-forming material particles 1 can also be obtained by microcapsulation methods, polymerization methods, spray dry methods, or the like.

The pattern-forming material particles 1 may be particles of 0.5 to 20 μm particle sizes formed of metal particles or ceramic particles coated with resin. It is also possible to coat metal particles and ceramics or glass with resin respectively as different particles, and to form a pattern by nozzles corresponding to the individual particles.

In the pattern forming method according to the fourth embodiment of the present invention, it is also possible that the above steps (a) to (c) are repeated to form a plurality of patterns on the surface of the panel substrate and thereafter the fixing step (d) is performed, or that the steps (a) to (d) are repeated to form a plurality of patterns on the surface of the panel substrate and thereafter the baking step (e) is performed, so that the fixing step or the baking step has to be done only once. The plurality of patterns are, for example, those obtained by forming on the panel substrate 3 a pattern of silver, then a pattern of oxide and a pattern of ceramics. Unlike this example, there are some cases where when a thick pattern cannot be formed at once, the pattern formation is performed several times to obtain a thickness. When several times of pattern formation are involved, such a collective baking as shown above is convenient.

In the fourth embodiment of the present invention, in the case where the panel substrate 3 is held by a flat surface and the flat surface sucks up the panel substrate 3 by vacuum, even if the panel substrate 3 is so thin as to tend to undulate or warp, these tendencies can be solved by vacuum suction so that the distance between the panel substrate 3 and the nozzle 404 can be maintained constant.

In the case where the thickness of the panel substrate 3 is constantly measured by the laser displacement gauge 409*b* shown in FIG. 61, the distance between the nozzle 404 and the panel substrate 3 can be adjusted by making up-and-down movement of the nozzle casing 404*a* based on detection information derived from the measurement, so that some extent of undulation or warp of the panel substrate 3 can be solved.

Figure 73A:
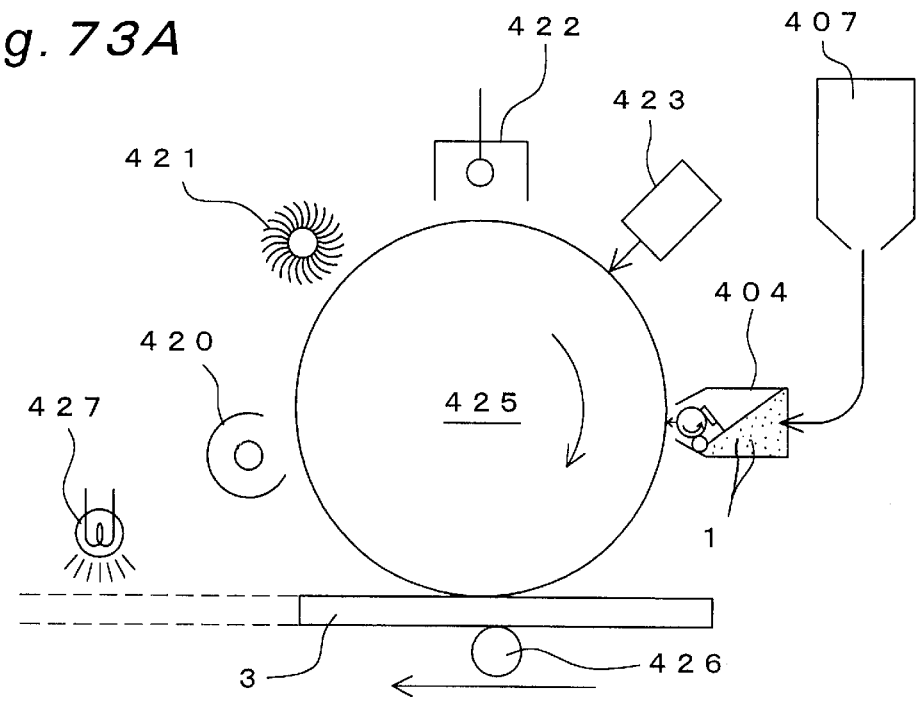
FIGS. 73A and 73B are a structural view representing a pattern forming apparatus according to the fourth embodiment of the present invention and an enlarged view of a part of the pattern forming apparatus of FIG. 73A.
Figure 73B:
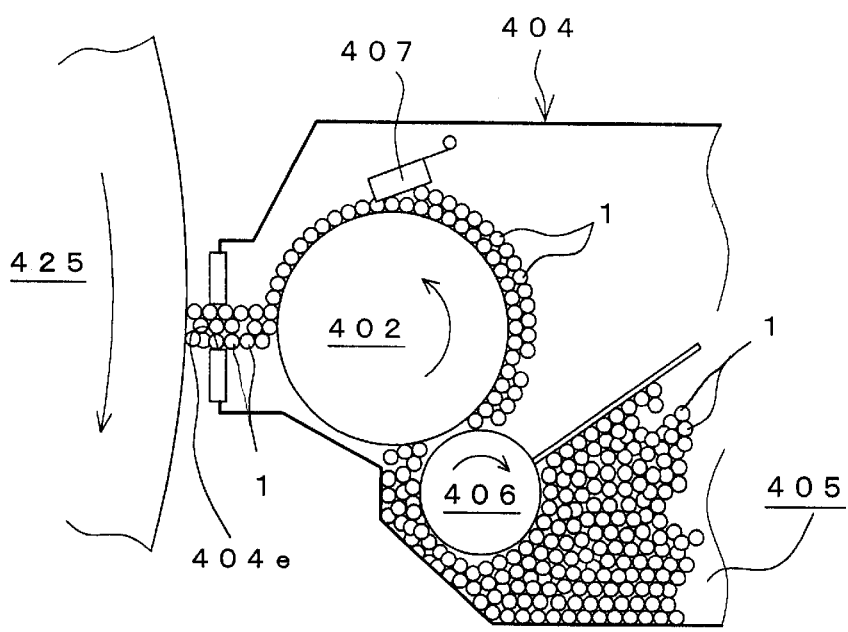
Figure 74A:
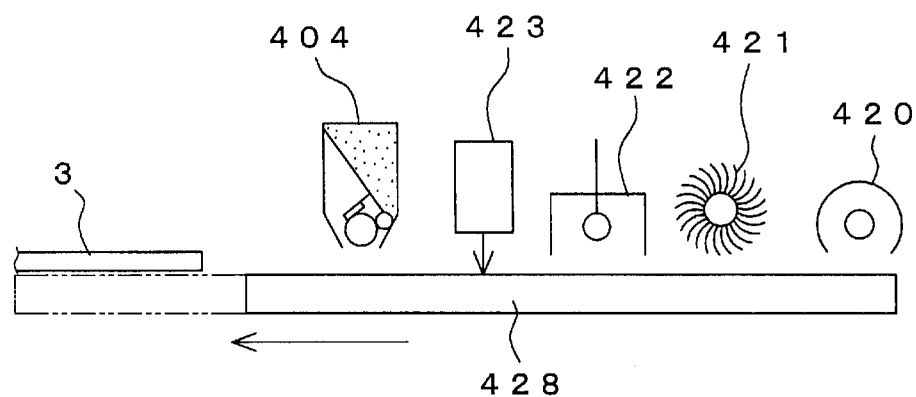
FIGS. 74A and 74B are a structural view representing a pattern forming apparatus according to the fourth embodiment of the present invention and an explanatory view of the transfer part of the pattern forming apparatus of FIG. 74A.
Figure 74B:
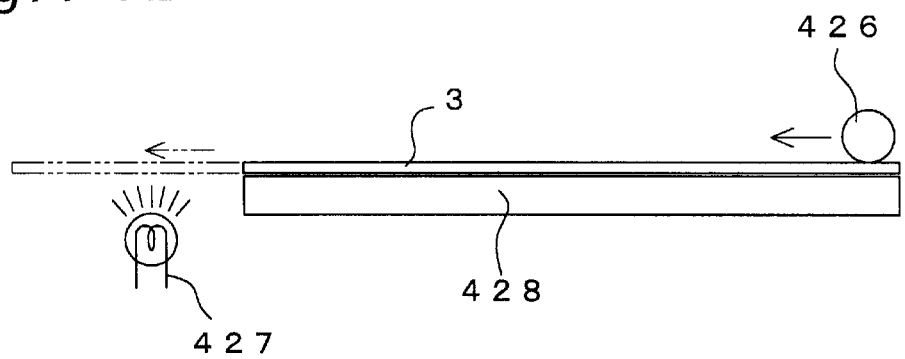
Figure 75:
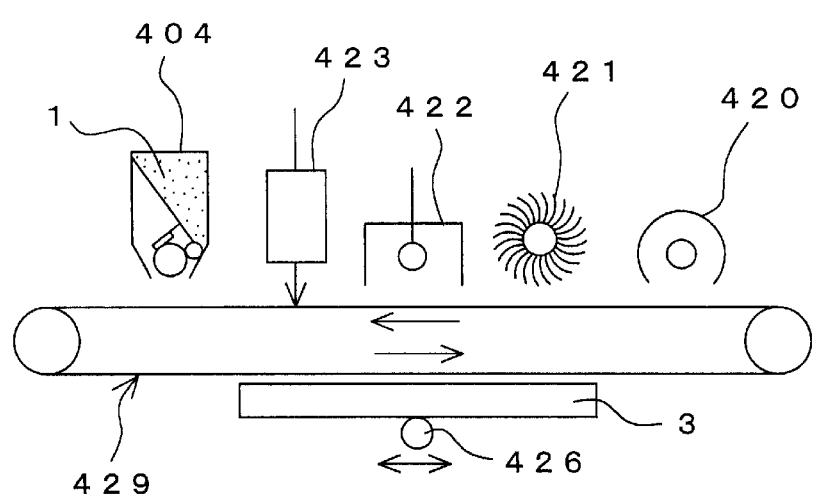
FIG. 75 is a perspective view representing a pattern forming apparatus according to the fourth embodiment of the present invention.

The above-described forming apparatus is so designed that a pattern is formed on the surface of the panel substrate 3 directly or indirectly from the nozzle 404 of the particle feeding device. Otherwise, it is also possible that, as shown in FIGS. 73, 74, and 75, intermediate bodies 425, 428, 429 of a columnar, platy, or endless-band shape having a photoconductor and an electrostatic-pattern forming member and capable of forming an electrostatic pattern are placed between a developing unit 424 and the panel substrate 3, where the pattern is transferred from the intermediate bodies 425, 428, 429 onto the surface of the panel substrate 3 by electrostatic force. In this case, these members may be provided as a unit and housed in the nozzle casing 404*a* of FIG. 61. The unit members including the eraser (erasing device) 420, a cleaner (cleaning device) 421, an exposure device (electrostatic-pattern forming device) 422, and a developing unit 423 are placed so as to be opposed to the intermediate body 425, while the apparatus base 402 is provided with a voltage generator (transfer device) 426 and a fixing unit (fixing device) 427.

In this pattern forming apparatus, the pattern-forming material particles 1 are patterned by electrostatic force onto the panel substrate 3 or the like. In this patterning, with the pattern-forming material particles 1 incapable of holding enough charging amount for control, the following methods need to be taken:

For the control of the pattern-forming material particles 1, it is known that "electrostatic force =charges×electric field =particle mass×particle acceleration," according to the equation of electromagnetics. This equation can be transformed into another, "acceleration =(charges/particle mass)×electric field."

For the control in the patterning of particles, the value of (charges/particle mass) is of importance.

Therefore, it is necessary to increase the charging amount and thereby increase the charges of particles. Increasing the electric field would make the control impossible, where the pattern-forming material particles 1 may be applied all in amount or to unnecessary places, resulting in occurrence of fogging.

Modifications of the fourth embodiment of the present invention for increasing the charging amount of the pattern-forming material particles 1 and electrically charging the particles uniformly are shown below.

A first modification of the fourth embodiment is explained. Referring to FIG. 62, a mixture of highly chargeable particles 431 together with pattern-forming material particles 1 to be used are introduced to the hopper 405, moved together to the particle feeder 402 and then the particle feed roller 406, and jetted out from the nozzle 404 under control so as to be patterned on the panel substrate 3. Even if the pattern-forming material particles 1 are less easy to electrically charge or nonuniform in charging, the charging of the highly chargeable particles 431 to be mixed allows the pattern-forming material particles 1 to be charged uniformly and increased in charging amount. As a result, a stable pattern can be achieved.

The highly chargeable particles 431 are particles containing a primary component of resin material and a component for controlling the charging and a component for increasing the mold releasability. An example thereof is particles composed of 98 wt % of polyethylene resin, 1 wt % of a charging-amount controlling agent such as chromium complex, which is high in charging amount, and 1 wt % of an external additive such as silica, which is highly chargeable.

Figure 63:
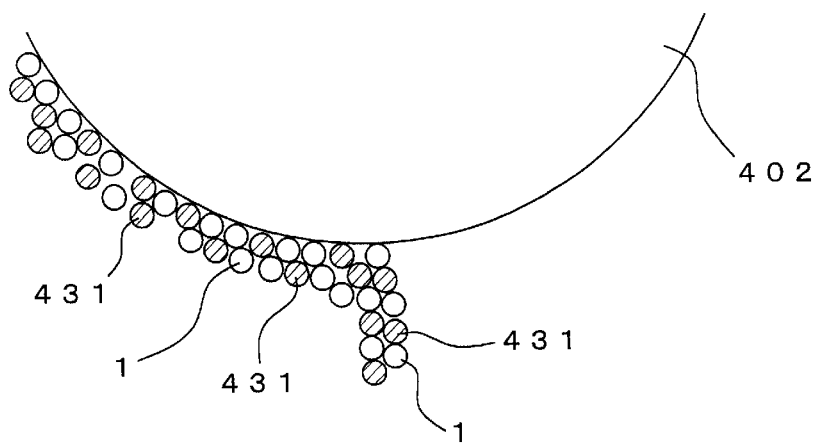
FIG. 63 is a view for explaining the mixing of easily chargeable particles according to a first modification of the fourth embodiment with pattern-forming material particles.

FIG. 63 is an enlarged view of the particle feeder 402. The highly chargeable particles 431, which make the pattern-forming material particles 1 charged, need to be mixed uniformly. A poor mixing of the pattern-forming material particles 1 and the highly chargeable particles 431 results in nonuniform charging. The mixing needs to be done with a mixer or the like until a uniformity is ensured visually. Further, although not shown in FIG. 62, a blade for mixing, a mechanism for ultrasonic vibration, and the like are attached within the hopper 405. As to the particle size, the particle size of the highly chargeable particles 431 may be set according to that of the pattern-forming material particles 1 so that a uniform mixing can be obtained.

Figure 64:
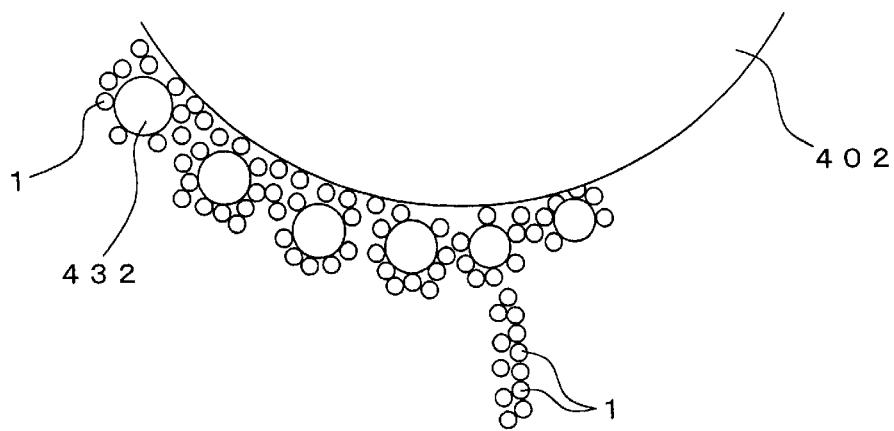
FIG. 64 is a view for explaining the mixing of particles easily chargeable to the opposite polarity according to a second modification of the fourth embodiment with pattern-forming material particles.

A second modification of the fourth embodiment is shown in FIG. 64. By using, as the particles to be mixed, particles 432 which are highly chargeable to a polarity opposite to the polarity necessary for the pattern-forming material particles 1, the highly chargeable particles 432 are mixed with the pattern-forming material particles 1, and introduced from the hopper 405. By these highly chargeable particles 432 highly chargeable to the opposite polarity, the pattern-forming material particles 1 are charged to their proper polarity. These particles 432 are not discharged from the nozzle 404 but deposited onto the particle feeder 402, coupled with the next-coming pattern-forming material particles 1. The polarity of charging depends on the material. Polyethylene resin is charged to be negative polarity, and glass or nylon is charged to the positive. As the highly chargeable particles 432, are usable iron oxide ferrite particles, magnetite particles, glass beads, iron oxide particles, and resin particles. The highly chargeable particles 432 are larger in diameter than the pattern-forming material particles 1, but, at most, up to several 100 $\mu$m. It is further preferable to coat the resin for increase in the charging amount.

Figure 65A:
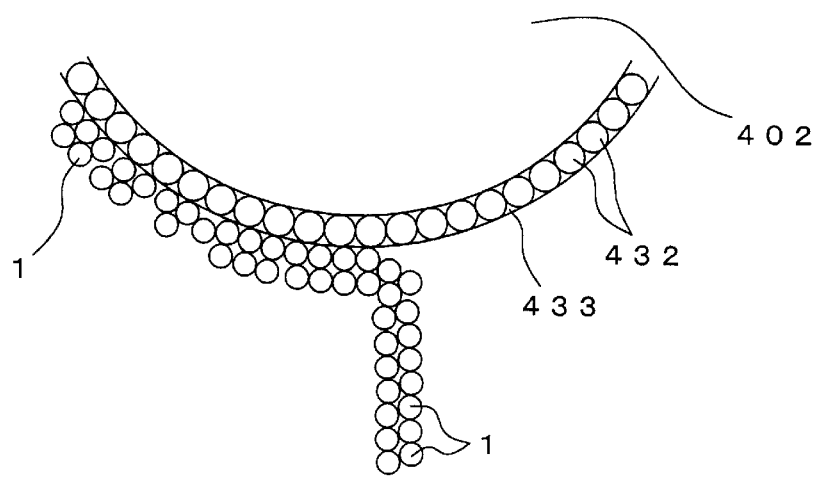
FIG. 65A is a view for explaining the charging method with the adhesion of the easily chargeable particles according to the third modification of the fourth embodiment.
Figure 65B:
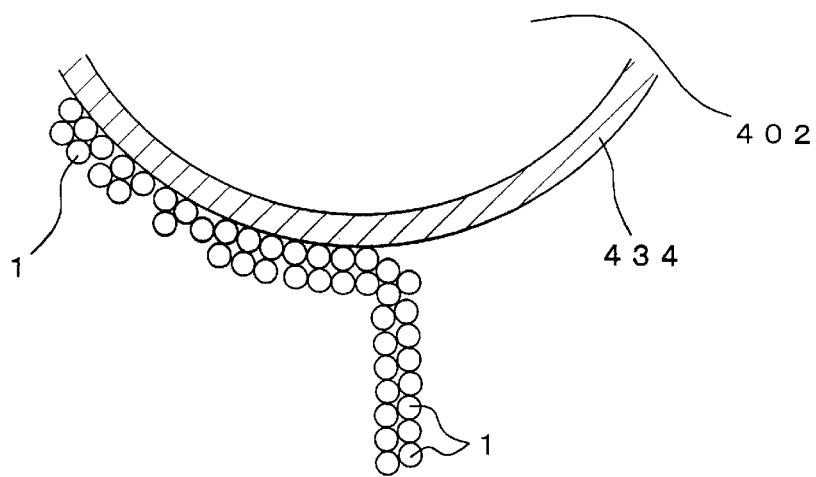
FIG. 65B is a view for explaining the chargeable method with an easily chargeable material according to the third modification of the fourth embodiment.

A third modification of the fourth embodiment is shown in FIGS. 65A and 65B, where the highly chargeable particles 432 are adhesively bonded to the particle feeder 402 to thereby form a layer 433. Otherwise, in FIG. 65B, the particle feeder 402 is coated with a highly chargeable material to form a layer 434. The pattern-forming material particles 1 fed to those layers 433, 434 are charged by the particle feeder 402 and discharged from the nozzle 404. The material and particles in this case need to be selected as those which are charged to a polarity opposite to the polarity necessary for the pattern-forming material particles 1.

A fourth modification of the fourth embodiment is explained with reference to FIG. 62. Increasing the rotational speed itself of the particle feeder 402 allows the pattern-forming material particles 1 to be increased in charging amount by friction with the blade 407. Otherwise, giving a difference in rotational speed between the particle feed roller 406 and the particle feeder 402 also allows the pattern-forming material particles 1 to be increased in charging amount by friction. With a highly chargeable material used as the material of the blade 407, elevating the pressure between, for example, the silicon or Teflon blade 407 ("Teflon" is the trademark for polytetrafluoroethylene) and the particle feeder 402 indeed allows the charging amount to be increased, but the number of particles to be fed decreases so that the pattern-forming material particles 1 can no longer be patterned.

A fifth modification of the fourth embodiment is explained with reference to FIG. 62. A charger 435 is provided between the blade 407 and the nozzle 404. Particles charged by the blade 407 are further charged by the charger 435, so that the pattern-forming material particles 1 are charged uniformly and highly so as to be jetted out by the nozzle 404 and patterned on the panel substrate 3 as described above. Even if the pattern-forming material particles 1 is less chargeable or if nonuniform in charging amount, the highly chargeable particles allow a uniform charging and a large amount of charges to be accomplished.

Figure 66:
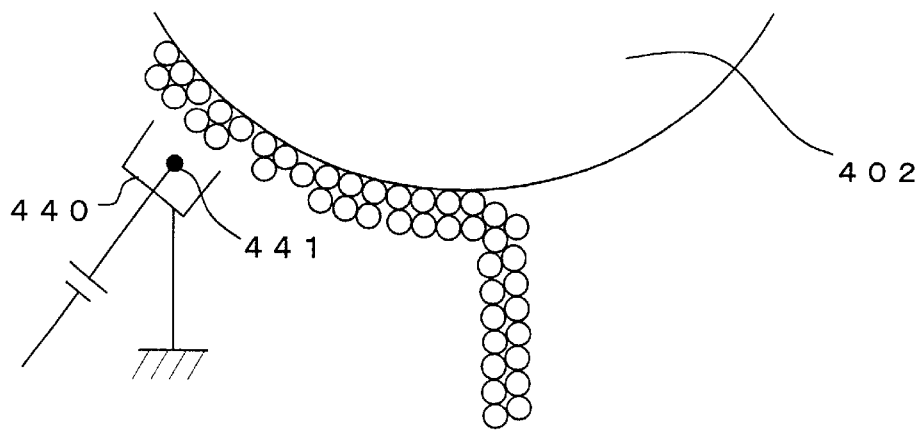
FIG. 66 is a view for explaining the charging with a charger using corona discharge according to a sixth modification of the fourth embodiment.
Figure 67:
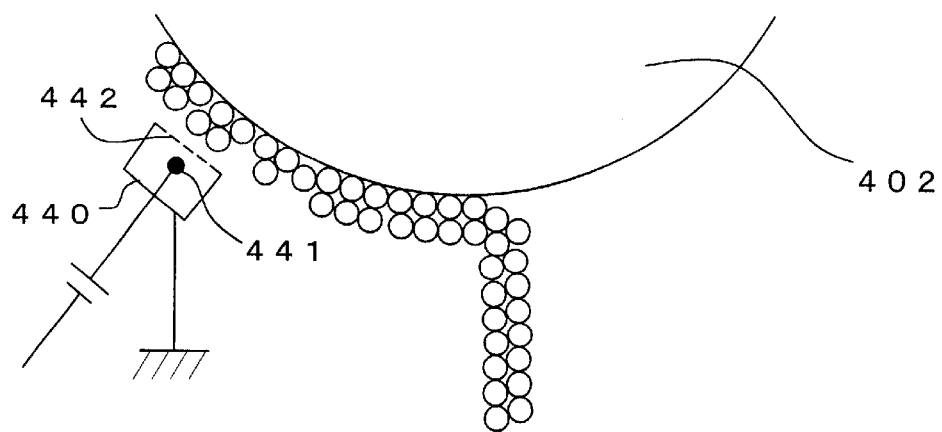
FIG. 67 is a view for explaining the charging with a charger using corona discharge according to the sixth modification of the fourth embodiment.

As a charger 435 according to a sixth modification of the fourth embodiment, one shown in FIGS. 66 and 67 can be used. About a tungsten wire 441 having a diameter of several tens of $\mu$m, a shield electrode 440 is provided so as to face the particle feeder 402, where a high voltage of 4 kV to 10 keV is applied to the tungsten wire 441, causing corona discharge and thereby charging the particle feeder 402. In the case of FIG. 67, a constant current is passed through the tungsten wire 441, giving rise to a voltage and causing a corona charging. In this case, a grid electrode 442 is also provided, where if the voltage of the particle feeder 402 is lower than the voltage applied to the grid electrode 442, corona discharge impinges against the particle feeder 402, continuing to be applied until the same voltage is reached. In either method, the tungsten wire 441 would be dirtied by the deposition of the pattern-forming material particles 1. For this reason, cleaning process by ultrasonic vibrations or air is provided periodically while the patterning is out of operation.

Figure 68:
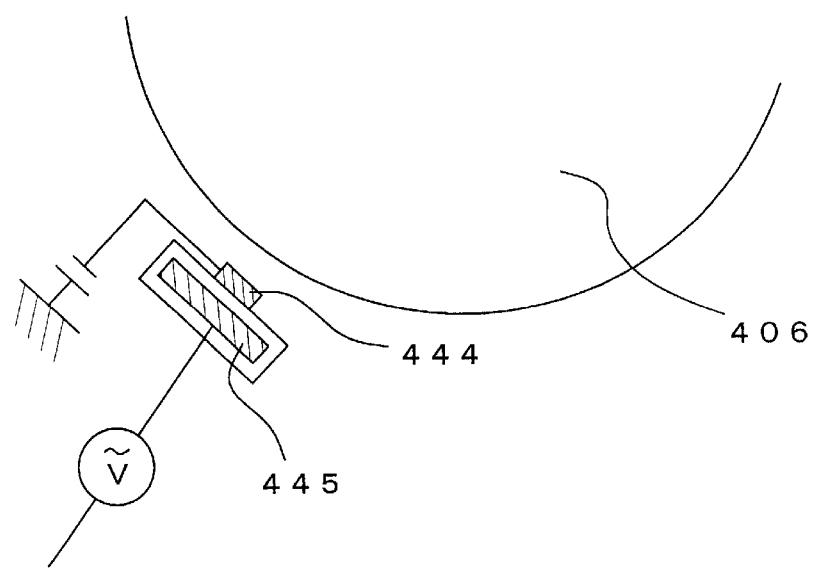
FIG. 68 is a view for explaining the charging with a solid charger according to a seventh modification of the fourth embodiment.

As a seventh modification of the fourth embodiment, a solid discharge device opposed to the particle feeder 402 as shown in FIG. 68 may also be used. The solid discharge device has a pair of belt-like electrodes provided with a dielectric interposed therebetween, which are an AC electrode 445 and a DC electrode 444. The AC electrode 445 serves to generate both positive and negative ions, while a DC applied electric field serves for ion discharge. This method offers such advantages as saved space, less proneness to deposition of the pattern-forming material particles 1, and an easy handling.

Figure 69:
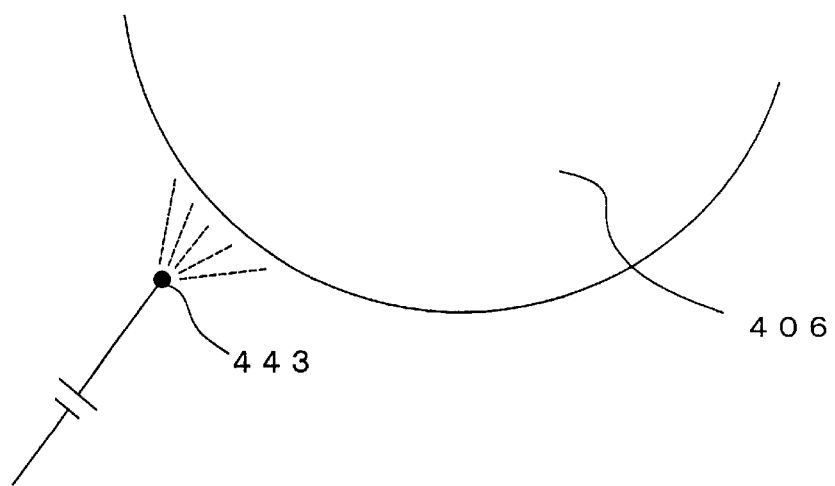
FIG. 69 is a view for explaining the charging with a needle-like electrode according to an eighth modification of the fourth embodiment.

As an eighth modification of the fourth embodiment, a voltage is applied to needle-like electrodes 443 shown in FIG. 69 so as to generate a corona discharge. The discharge can be generated with a voltage as low as about 100 V. A distance of about 20 to 30 mm allows a uniform charging to be obtained. A large number of needle-like electrodes 443 are arrayed, so that the whole particle feeder 402 is uniformly charged.

Figure 70:
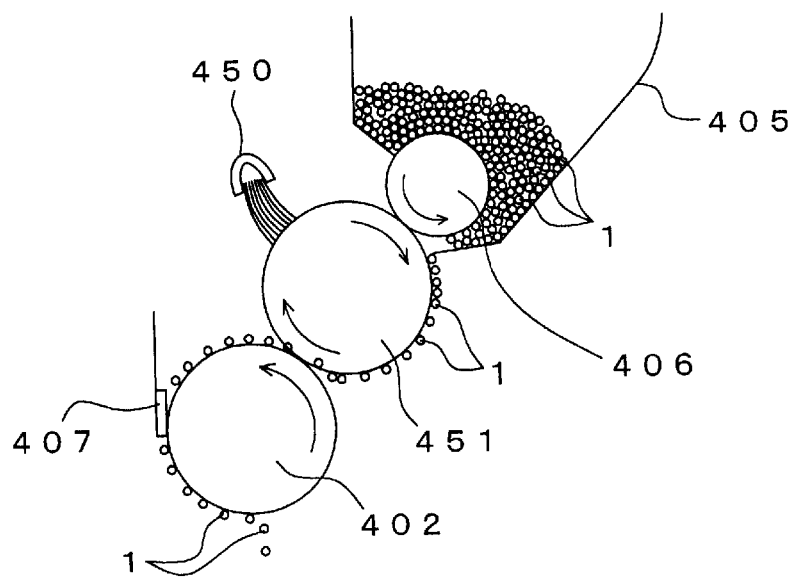
FIG. 70 is a view for explaining the charging method of charging the intermediate member with a brush in a ninth modification of the fourth embodiment.

In a ninth modification of the fourth embodiment, as shown in FIG. 70, an intermediate roller 451 is placed between the particle feeder 402 and the particle feed roller 406 so as to be in contact with each other. The intermediate roller 451 is charged by a brush 450, the pattern-forming material particles 1 are fed to the intermediate roller 451 by the particle feed roller 406, and the pattern-forming material particles 1 are fed to the particle feeder 402 via the intermediate roller 451. As a result of this, the pattern-forming material particles 1 are electrically charged. The brush 450, which is formed of a bundle of electrically conductive fibers like a paintbrush or a fibrous one of rayon or polyester or the like, is brought into contact with the intermediate roller 451, by which the intermediate roller 451 is charged.

Figure 71:
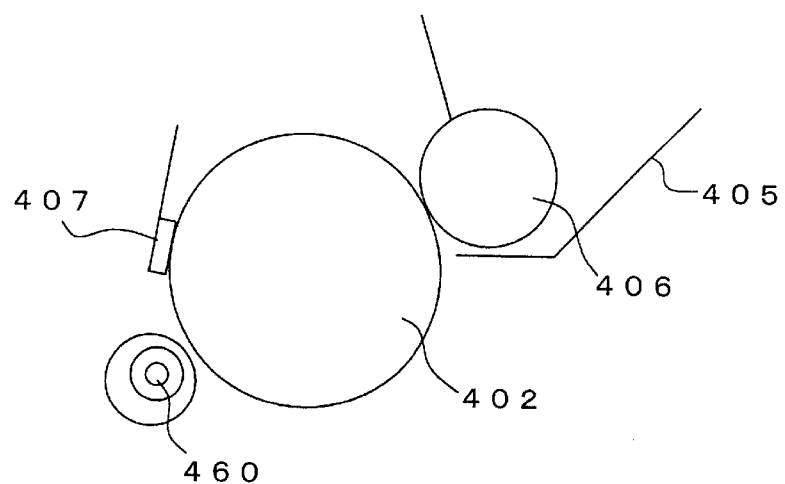
FIG. 71 is a view for explaining the charging with a charging roller in a tenth modification of the fourth embodiment.

In a tenth modification of the fourth embodiment, as shown in FIG. 71, it is also possible that with voltage applied to an iron or copper core, the particle feeder 402 is charged by a chargeable roller 460 coated with conductive rubber.

Figure 72:
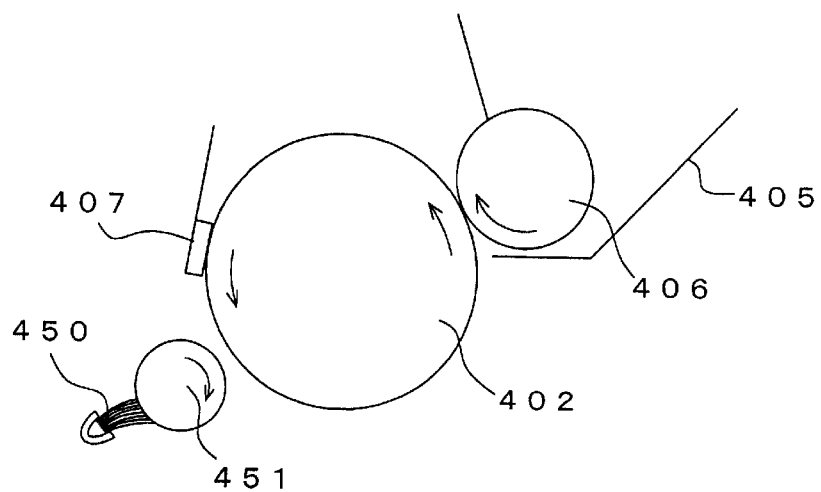
FIG. 72 is a view for explaining the charging method of charging the intermediate member with a brush in an eleventh modification of the fourth embodiment.

In an eleventh modification of the fourth embodiment, as shown in FIG. 72, it is also possible that the roller 451 is set in non-contact with the particle feeder 402 so as to induce electric charging, by which the pattern-forming material particles 1 are charged. The distance between the roller 451 and the particle feeder 402 needs to be within 50 $\mu$m.

In the above all cases, the charging amount can be maintained constant by motoring the charging amount of the pattern-forming material particles 1, recognizing the value of the motoring, and then controlling the output of the charger. As a result of this, a stable patterning can be achieved.

As a twelfth modification of the fourth embodiment, the pattern-forming material particles 1 are processed in plasma, in which case the pattern-forming material particles 1 are enhanced in chargeability. This is attributed to the introduction of OH groups or the like by the processing, and can be achieved by processing in argon or oxygen. Compared with cases where the processing is not done, the charging amount increases two- to ten-fold. For the plasma processing, a plasma state can be obtained by putting argon or oxygen into a vacuum, evacuating to 0.1 to 10 Pa and applying a high voltage, in which state the pattern-forming material particles 1 can be processed.

As a thirteenth modification of the fourth embodiment, in FIG. 62, an electric field is given between the blade 407 and the particle feeder 402, in which case the pattern-forming material particles 1 are increased in contact charging amount. This can be considered to be due to a difference in electron level between objects that are subject to contact charging. The electric field given from external creates a voltage difference between the surfaces of the objects in contact, by which the both objects in contact are forcedly moved in the positions of electron levels, thus changing in the move amount of electrons. It is shown also experimentally that the amount of generated charges in contact charging changes in proportion to the external electric field. The voltage to be applied to the blade 407 needs to be about 1 kV. Increasing the voltage allows the charging amount to be further increased. As to the material of the blade 407, for use of negatively charged pattern-forming material particles 1, coating the top surface of a metal plate with silicone resin or styrene acrylic resin allows the charging amount to be further increased. For positively charged pattern-forming material particles 1, the top surface of a metal plate is coated with fluorine, silicone, or styrene-acrylic resin.

As a fourteenth modification of the fourth embodiment, the particle size may be reduced for increasing the charging amount. The reason of this is explained below. According to the equation of electromagnetics, it holds that:

electrostatic force=charges×electric field=particle mass×particle acceleration.

This equation can be transformed into acceleration=(charges/particle mass)×electric field.

For the control in the patterning of particles, the value of (charges/particle mass) is of importance. The larger the value of (charges/particle mass), the better the resulting patternability. When the amount of charges cannot be increased, reducing the mass will do. Reducing the mass leads to reducing the particle size. Reduced particle size causes the mass to be decreased at a rate of the cube of the diameter. Since the surface area decreases at a ratio of the square of the diameter, the charging amount, which is proportional to the surface area, decreases at a ratio of the square. Resultantly, the value of (charges/particle mass) increases.

For example, actually measured results are shown in Table 2 below. Amount of charges was measured by collecting the pattern-forming material particles 1 on the particle feed roller 406 of FIG. 62 into a Faraday gauge, and then measuring charging amount and mass with a measuring instrument. The patterning requires 7 $\mu$c/g or more. The pattern-forming material particles used in this case are composed of 40 vol % of electrically conductive particles and 60 vol % of resins. The particle size is required to be at least not more than 15 $\mu$m, and more preferably, not more than 10 $\mu$m.

TABLE 2

Relationship between particle size and charges/particle mass

| Particle size ($\mu$m) | 20 | 15 | 10 | 7.5 | 5 |
|---|---|---|---|---|---|
| Charges/mass ($\mu$c/g) | 2.1 | 5 | 7 | 10 | 15 |

With the pattern forming method and apparatus for panel substrates according to the fourth embodiment of the present invention, since the process for forming a desired pattern onto a substrate constituting a large-scale panel for PDPs, liquid crystal panels, circuit boards, or the like is simplified, a panel on which a pattern is formed can be manufactured with low price, and yet a high-precision fine pattern can be formed on the panel substrate.

(Fifth Embodiment)

The pattern forming method of the foregoing first embodiment may have the following issues.

In the case where the panel substrate 3 is glass or the like having a thickness of 2 to 3 mm, with voltage application from the back side of the panel substrate 3, generating a voltage of about 1000 V on the surface of the panel substrate 3 would involve a high voltage of about 10000–5000 V, which is dangerous. Also, even if a high voltage is applied, there is a difficulty in electrically charging the whole panel substrate 3 uniformly. Moreover, the voltage becomes lower at places in the back side of the panel substrate 3 where the contact with the power supply is poor, so that the surface potential on the panel substrate 3 would be nonuniform.

When a corona discharging device is used for the surface of the panel substrate 3 as the method of electrically charging the panel substrate 3, it may be difficult to uniformly charge the whole panel substrate 3 depending on moisture etc. on the surface state of the panel substrate 3. Also, since the panel substrate 3 itself moves, there may be lacks of uniformity and stability of the surface voltage. Further, the stability depends on the temperature, the humidity, and the surface state of the glass, which is the panel substrate 3, thus making the panel manufacture unstable.

Accordingly, the object of the fifth embodiment of the present invention is to provide a pattern forming method which allows various types of patterning to be achieved on panel substrates simply and stably.

That is, the pattern forming method of the fifth embodiment is a method for forming a pattern on a surface of a panel substrate, comprising:

a step (a) of electrically charging pattern-forming material particles;

a step (b) of exerting an electrostatic force on the electrically charged pattern-forming material particles to make the pattern-forming material particles applied to the surface of the panel substrate;

a step (c) of forming a desired pattern with the applied pattern-forming material particles; and a step (d) of fixing the pattern onto the panel substrate, wherein:

① the pattern forming method, exploiting static electricity, further includes a step of applying a voltage to an additional layer present on the surface of the panel substrate to apply the pattern-forming material particles;

② the pattern forming method further includes a step of applying a voltage to a conductor without irregularities on the back side of the panel substrate, to apply the pattern-forming material particles; or providing the conductor on the back side having a configuration identical to the pattern configuration; or ③ the pattern forming method further includes a step of forming an additional electrically conductive layer on the surface of the panel substrate and applying a voltage to the layer to apply the pattern-forming material particles.

Now, the patterning for PDP electrode formation according to the fifth embodiment is described in detail with reference to FIGS. 76A and 76B, FIG. 77 and the like.

Figure 76A:
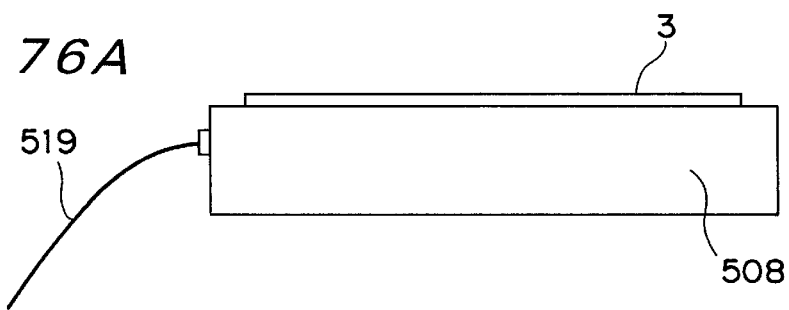
FIGS. 76A and 76B are views of voltage applying structures of pattern forming apparatuses according to a fifth embodiment of the present invention and a first modification of the fifth embodiment, respectively.
Figure 77:
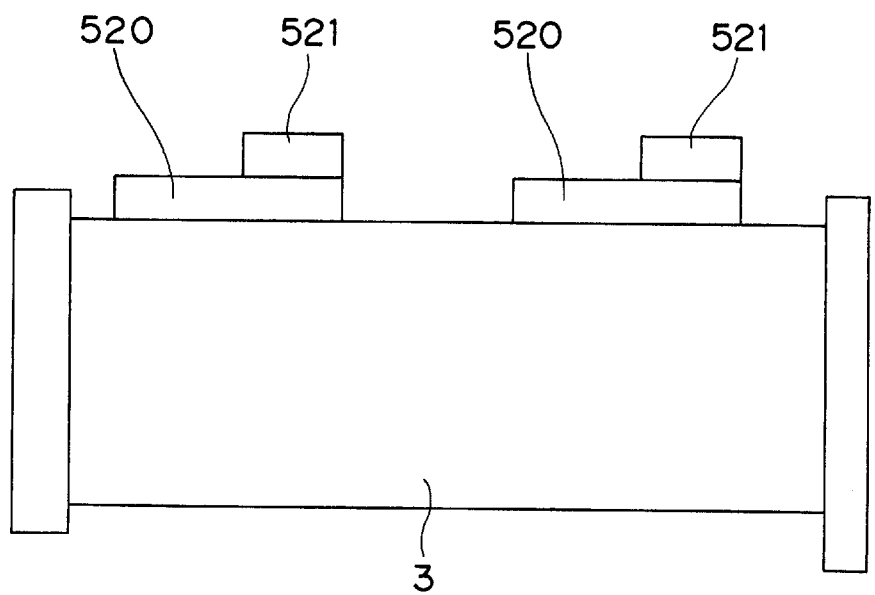
FIG. 77 is a view for explaining the voltage applying structure of the pattern forming apparatus according to a first modification of the fifth embodiment of the present invention.

In FIG. 76A, a voltage is applied by a cable 519 to a table 508 on which the panel substrate 3 is placed. The table 508 is made of a metal as an electrical conductor, for example, aluminum, stainless steel (SUS) metal, or the like. The panel substrate 3 is 800 mm×600 mm sized, and the table 508 is 1000 mm×800 mm sized and 30 mm thick. The voltage may be applied to any position of the table 508. Poor contact between the table 508 and the panel substrate 3 would cause the surface voltage of the panel substrate 3 to be nonuniform, having an effect on the pattern precision. Surface irregularities of the table 508 are preferably suppressed within ±15 μm or less, further preferably within ±10 μm or less. The table 508 has vacuum suction holes for making the panel substrate 3 brought into close contact therewith, the holes allowing the panel substrate 3 to be sucked up in good contact. Making the hole too large would cause the hole part to be worse in voltage application, resulting in a distorted or weakened electric field, which makes it impossible to achieve a successful patterning.

Figure 76B:
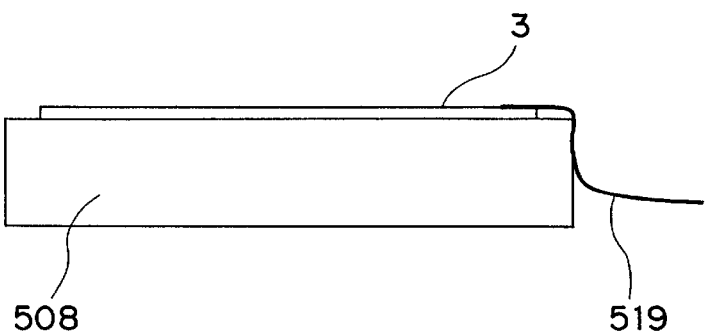

FIG. 76B shows a first modification of the fifth embodiment. A voltage is applied by the cable 519 to an electrically conductive film 520 present on the surface of the panel substrate 3 as shown in FIG. 77. This method allows the patterning to be accomplished, whatever thickness lower part of the panel substrate 3 has. FIG. 77 shows an example in which this method is actually used. FIG. 77 is a sectional view of the structure of a PDP, where a silver electrode 521 is present on an ITO film 520 which is an example of the conductive film 520. For the patterning of the silver electrode 521, a voltage is applied to the conductive film 520, which is an electrically conductive indium tin oxide film (ITO film). Since the ITO film has electrical conductivity, the voltage is applied uniformly.

However, in the case where the panel substrate 3 is electrically conductive, since the voltage of 1000 V may be applied to the panel substrate 3 itself, as it is, there is no need for forming the conductive film 520. Also, there is no problem even if a thin film having a film thickness of about 0.5 mm or less is present on the surface of the electrically conductive panel substrate 3, in which case the voltage may be applied to the table 508 as it is.

Figure 78:
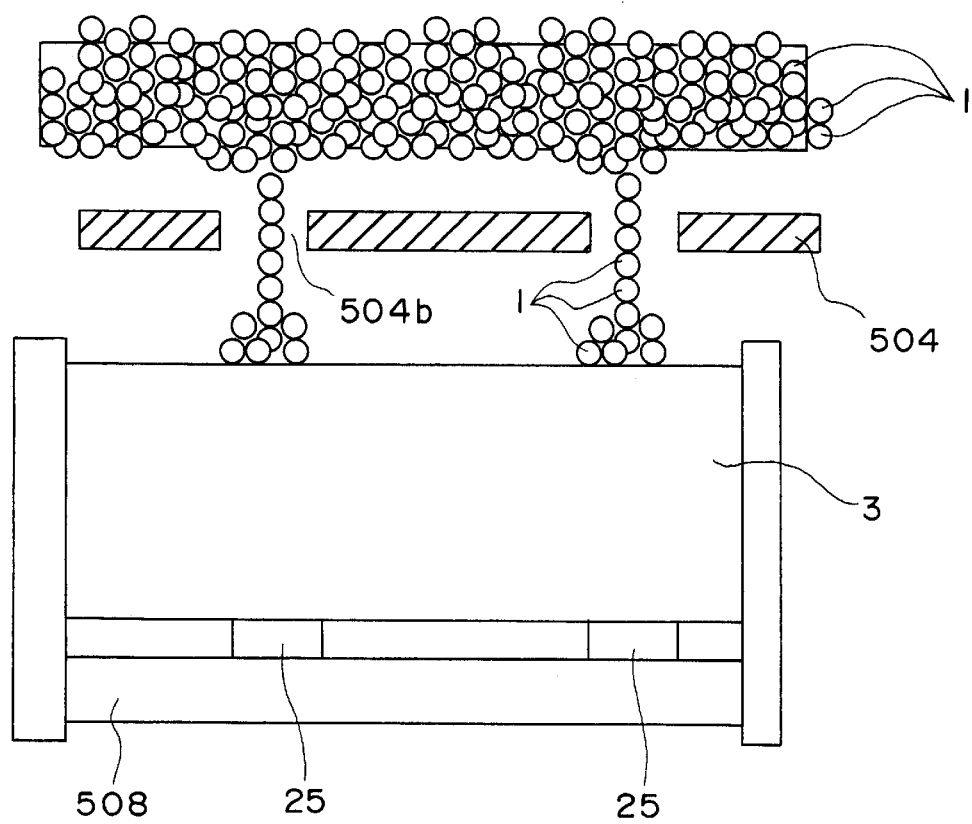
FIG. 78 is a view for explaining details of the voltage applying structure of a pattern forming apparatus according to a second modification of the fifth embodiment of the present invention.

FIG. 78 shows a case, as a second modification of the fifth embodiment, where no conductive film is present on the surface of the panel substrate 3 and where the panel substrate 3 is patterned at its portions other than the conductive film. Reference numeral 25 in FIG. 78 denotes a metal member placed at portions corresponding to the pattern under the glass panel. A voltage is applied to the metal member to deposit the pattern-forming material particles on the upper portion of the glass panel. An electrically conductive stage 508 having protrusions and depressions corresponding to the electrode pattern is fabricated, and with the panel substrate 3 placed thereon, a voltage is applied to the stage 508. Then, voltage is generated only at places that should be patterned, in which case the pattern-forming material particles 1 are easily applied from the nozzle. The panel substrate 3 (in this case, a 2.8 mm thick glass panel as an example) is present on the stage 508 having protrusions of a desired pattern, and a voltage is applied to the stage 508, by which voltage is generated only at places corresponding to the pattern on the glass panel 3, which is an example of the panel substrate 3. To these places, the pattern-forming material particles 1 are applied from a nozzle 504, and patterned by electrostatic force. Without using the nozzle 504, the pattern-forming material particles 1 electrically charged in a simplified manner may be sprayed onto the panel substrate 3.

As a method according to a third modification of the fifth embodiment, pattern formation can be fulfilled by preliminarily fabricating a thin conductive resin film on the panel substrate 3 and then applying a voltage to the film. As the conductive film, a film is fabricated by coating the panel substrate 3 with terpineol, which is a solvent in which carbon and acrylic resin are dissolved. The coating may be done by dipping, spraying, or die coating, but a planarity is required of the coat, where unless a planarity of ±10 μm or less is given, the patterning precision would be deteriorated. A planarity of ±5 μm or less is further preferable. The electrically conductive coating material needs to be evaporated by baking. The coating material, if left, would adversely affect the product in terms of color tone and electrical characteristics. As an example, coating materials for static protection measures are usable.

The pattern-forming material particles 1 used in this case were fabricated by mixing silver into a molten resin and by grinding the mixture. Silver particles having particle sizes of 1 μm or less were used. Polyethylene was used as the resin, where others selected from thermoplastic resins are also usable. As to the composition of the pattern-forming material particles 1, the silver content was 50 to 90 wt %, the rest being resin, where an internally added charge controlling agent and an externally added mold releasing agent were also mixed at several % or less. Particle size of the pattern-forming material particles was 5 to 10 μm.

A fourth modification of the fifth embodiment is explained as a working example in which the modification is applied to the formation of a fluorescent member in a PDP, which is another example of the panel substrate 3.

Figure 79A:
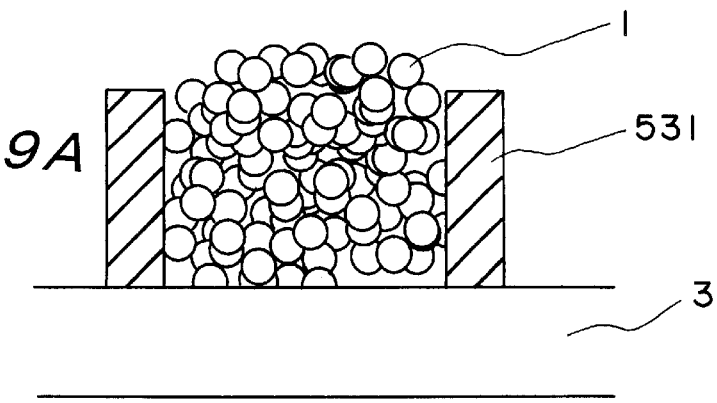
FIGS. 79A, 79B, and 79C are views for explaining the process of the pattern forming method according to a fourth modification of the fifth embodiment of the present invention.
Figure 79B:
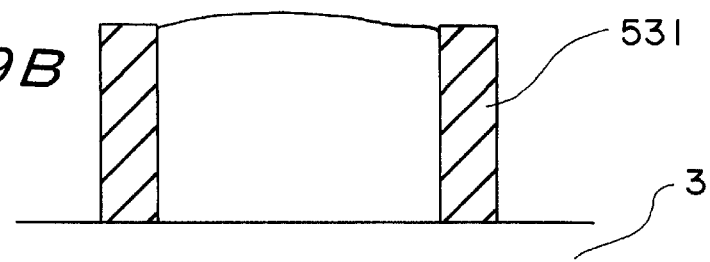
Figure 79C:
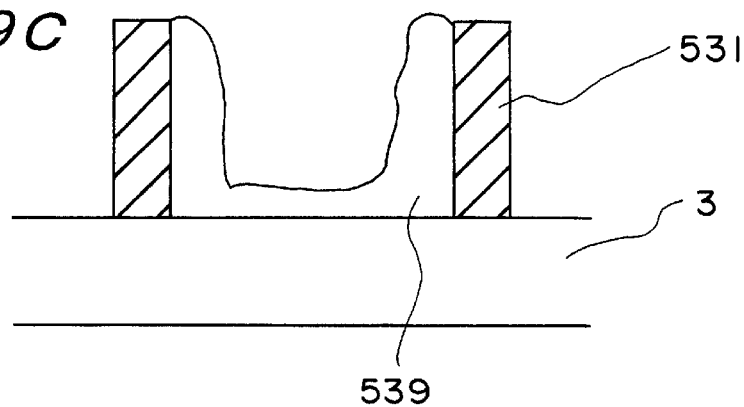

First, the process for forming the fluorescent member is explained with reference to FIGS. 79A, 79B, and 79C. The pattern-forming material particles 1 electrically charged on a particle feed roller 502 are inserted by electrostatic force into a partitioning wall 531 to about 100% of its capacity as shown in FIG. 79A. Thereafter, the panel substrate 3 is once heated to 130° C, by which the pattern-forming material particles 1 have their resin material melted, and fixed and flattened, resulting in FIG. 79B. After that, the resin material is evaporated by a 600° C. baking, by which the formation of a fluorescent film 539 is completed, resulting in FIG. 79C. The fluorescent film 539 needs to be fabricated at a uniform film thickness within the partitioning wall 531.

As described also in the foregoing embodiments, the charger for electrically charging the panel substrate 3 for PDP use may be given in the charging system that the panel substrate 3 is charged from its top surface side such as in a corona charger or contact charger, or in the back charging system that the panel substrate 3 is given a voltage from its back, as in a voltage generator. However, when a voltage is applied from the back side of the panel substrate 3, the voltage is partitioned by the capacitor component of the panel substrate 3, resulting in a reduced voltage difference between the particle feeder 502 and the panel substrate 3. The panel substrate 3 has a thickness of 2.8 mm, and the application of a voltage of 1000 V onto the surface of the panel substrate 3 would involve a voltage of 5000 V to 10000 V to the back side of the panel substrate 3, which is dangerous. Also, even if such an voltage can be applied, variations in the thickness of the panel substrate 3 would cause the voltage difference between the particle feeder 502 and the panel substrate 3 to also vary, resulting in an unstable electric field therebetween.

Figure 80:
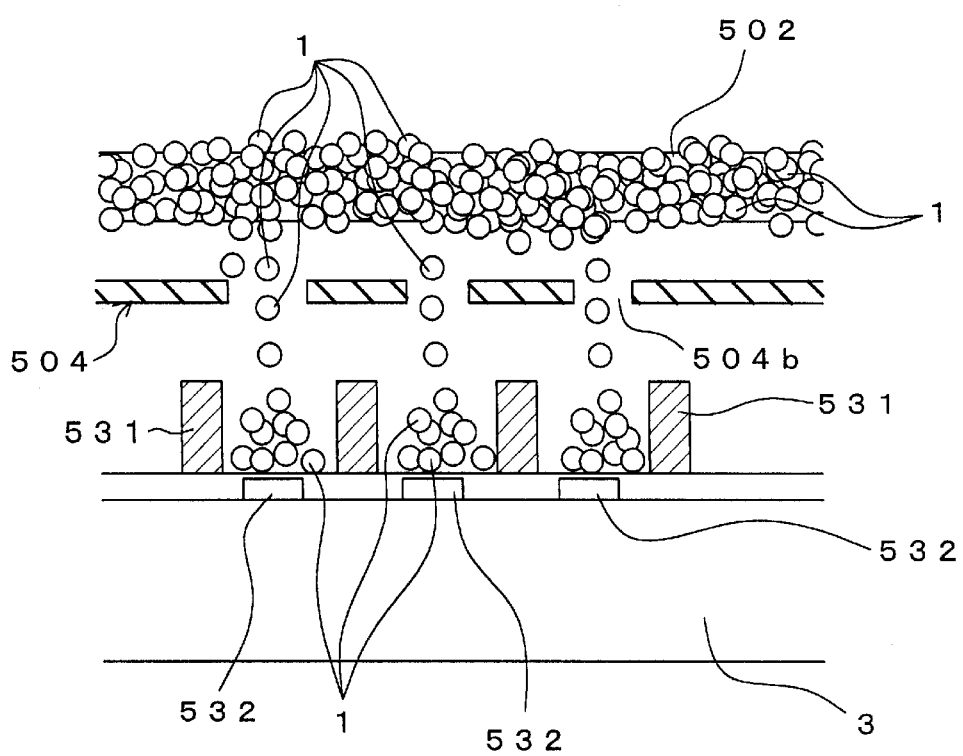
FIG. 80 is a view for explaining voltage-applying places in a fifth modification of the fifth embodiment of the present invention.

As a voltage applying method according to a fifth modification of the fifth embodiment of the present invention, a method of applying a voltage to an electrode provided under the partitioning wall of the panel has been devised. FIG. 80 shows a cross section of the panel substrate 3 and a state of application of the pattern-forming material particles 1, where a fluorescent film is to be formed within the partitioning wall 531 with the use of a PDP back-plate substrate 3 as an example of the panel substrate 3. An electrode 532 is present at an underlayer in each center of the individual partitioning walls 531. This electrode 532 is a constituent element indispensable for the occurrence of plasma discharge. With a voltage applied to this electrode 532, the pattern-forming material particles 1 are patterned by electrostatic force within the partitioning wall 531, where the pattern-forming material particles 1 are necessarily inserted by the electrostatic force into a partitioning wall 531 to which the electrode 532 belongs. The voltage can be applied to the electrode 532 by bringing a terminal, which is connected to the power supply, into contact with the electrode 532, which is placed at an end portion of the substrate 3. The hole diameter of the nozzle 504 is set within 80% of the width of the partitioning wall 531, and the distance therebetween is set equal to the interval of the partitioning walls 531. In this case, the hole diameter is 0.150 mm and the distance is 1.08 mm as an example. R, G, and B fluorescent substances are inserted one by one, collectively fixed (130° C., 10 minutes), and baked (600° C., 10-minute holding), by which the formation of the fluorescent film 539 is completed. With respect to the insertion of the fluorescent substances, since deposition of the fluorescent substances at the top of the partitioning walls 531 would cause a color mixture, it is also possible to adopt a method of, with an ultraviolet-curing type resins or acrylic resin used as the resin for the pattern-forming material particles 1, inserting the fluorescent substances, thereafter performing exposure process through a mask to fix only the interiors of the partitioning walls 531, and performing development process to remove fluorescent substances deposited at portions other than the fixed portions.

Figure 81:
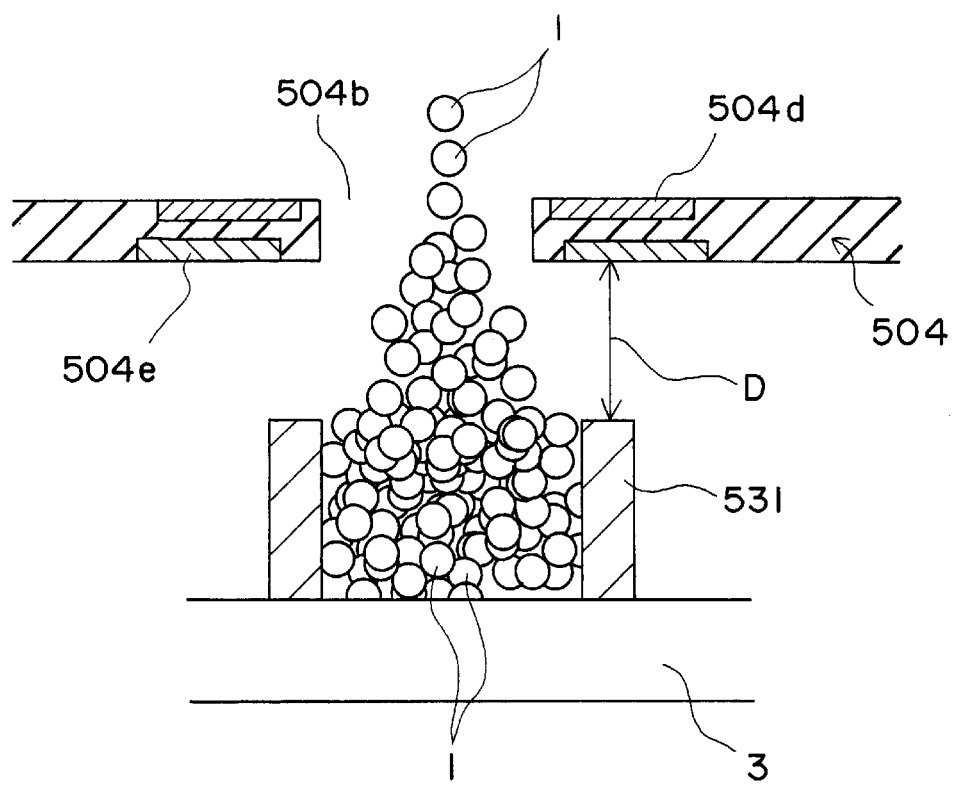
FIG. 81 is a view for explaining the insertion of particles into the partitioning wall in the case where deflecting electrodes are used in a sixth modification of the fifth embodiment of the present invention.

As a sixth modification of the fifth embodiment of the present invention, as shown in FIG. 81, around a nozzle hole 504b, a deflecting electrode 504e is also buried in addition to the control electrode 504d for turning on and off the jet-out of the pattern-forming material particles 1, so that the pattern-forming material particles 1 are controlled in their jet-out angle by the action of the deflecting electrode 504e, as in the foregoing embodiments. The deflecting electrode 504e performing such an action is, generally, placed at a position opposite to the nozzle hole 504b, so as to deflect the jet stream of the pattern-forming material particles 1 toward one direction such as the back-and-forth direction or the right-and-left direction. Otherwise, the deflecting electrode may be a ring-shaped one for converging and throttling the jet stream of the pattern-forming material particles 1, other than such a deflecting electrode as shown above.

A state in which the pattern-forming material particles 1 are inserted into the partitioning wall 531 by using these electrodes is explained with reference to FIG. 81. A voltage is normally applied to between the roller 502 and the panel substrate 3. A voltage is applied to the stage 508 below the panel substrate 3. The pattern-forming material particles 1 are negatively charged, and the negative voltage for the control electrode 504d is canceled so that the pattern-forming material particles 1 are started being discharged, while concurrently a positive voltage is applied to the deflecting electrode 504e, thereby broadening the discharge path of the pattern-forming material particles 1 so that the pattern-forming material particles 1 are inserted into the partitioning wall 531 uniformly. If the voltage applied to the deflecting electrode 504e is too high, the pattern-forming material particles 1 are inserted into a neighboring partitioning wall 531, resulting in a color mixture. If the voltage applied to the deflecting electrode 504e is low, the pattern-forming material particles 1 are inserted so as to be biased within the partitioning wall 531. Otherwise, the pattern-forming material particles 1 may be throttled so as to be inserted into the partitioning wall 531, by enlarging the nozzle hole diameter 504b and by applying a negative voltage to the deflecting electrode 504e.

Figure 82:
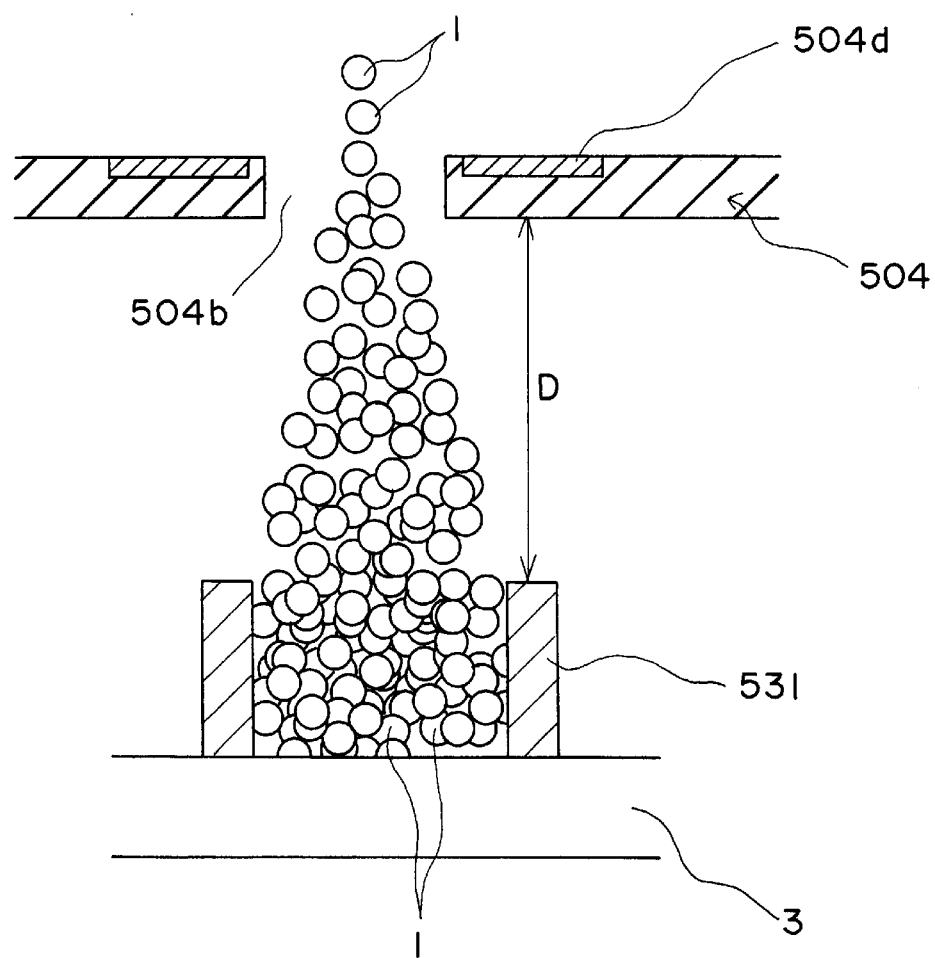
FIG. 82 is a view for explaining the distance between nozzle and partitioning wall in the case where particles are inserted into a partitioning wall in a seventh modification of the fifth embodiment of the present invention.

As a seventh modification of the fifth embodiment of the present invention, a method which does not use the deflecting electrode 504e is shown in FIG. 82. This is a method in which the discharge path of the pattern-forming material particles 1 is broadened by providing a larger distance D between the nozzle 504 and the panel substrate 3 so that the pattern-forming material particles 1 are inserted uniformly into the partitioning walls 531. The distance D therebetween is determined depending on the relationship between the discharge hole diameter and the inner diameter of the partitioning wall 531. That is, as an example, broadening the nozzle hole diameter by 100 $\mu$m needs increasing the distance D by 200 $\mu$m. In this case, the nozzle hole diameter was set to 0.100 mm, the inner diameter of the partitioning wall was set to 0.300 mm, and the distance between the nozzle 504 and the top of the partitioning wall was set to 0.200 mm.

Figure 83:
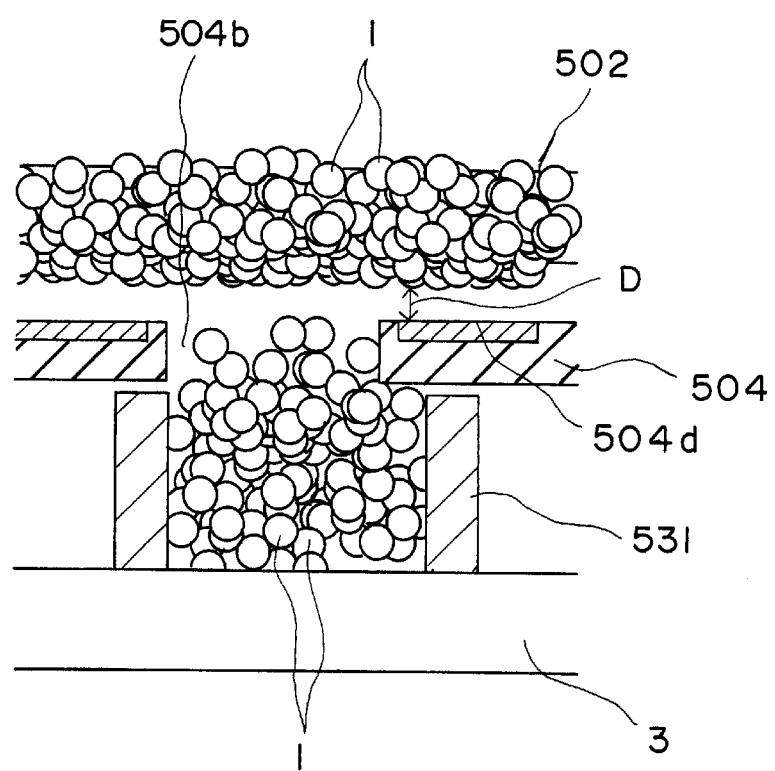
FIG. 83 is a view for explaining the insertion of particles into a partitioning wall with the distance between nozzle and partitioning wall in an eighth modification of the fifth embodiment of the present invention.

An eighth modification of the fifth embodiment of the present invention, in FIG. 83, the pattern-forming material particles 1 are inserted into the partitioning wall 531 by, conversely, reducing the distance D between the nozzle 504 and a panel substrate 3. The pattern-forming material particles 1 are inserted to the center of the partitioning wall 531 with a lower particle velocity. For this purpose, the voltage for drawing out the charged pattern-forming material particles 1 is made smaller. That is, the voltage to be applied to the panel substrate 3 may appropriately be lowered from 1000 V to 500 V for surface voltage. Higher lead-out voltages would cause the pattern-forming material particles 1 to rebound from the inner wall of the partitioning wall 531, so that the pattern-forming material particles 1 are inserted to the top portion of the partitioning wall 531 or neighboring partitioning walls, resulting in a color mixture.

Figure 84:
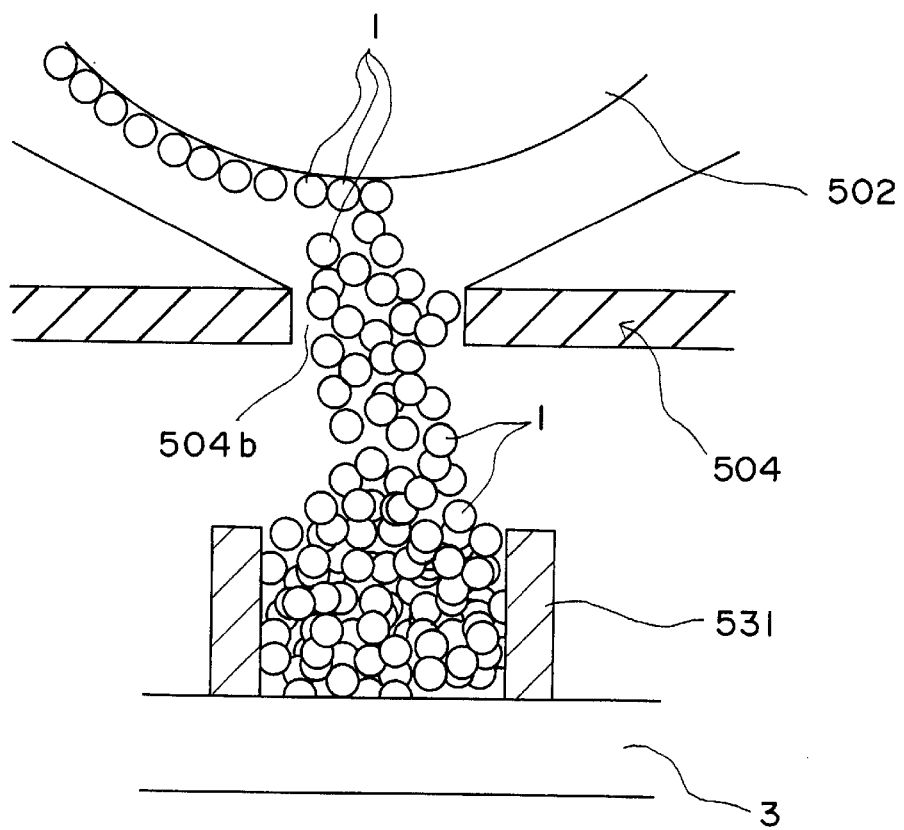
FIG. 84 is a view for explaining the insertion of particles into a partitioning wall in the case where no electrodes are used in a ninth modification of the fifth embodiment of the present invention.
Figure 85:
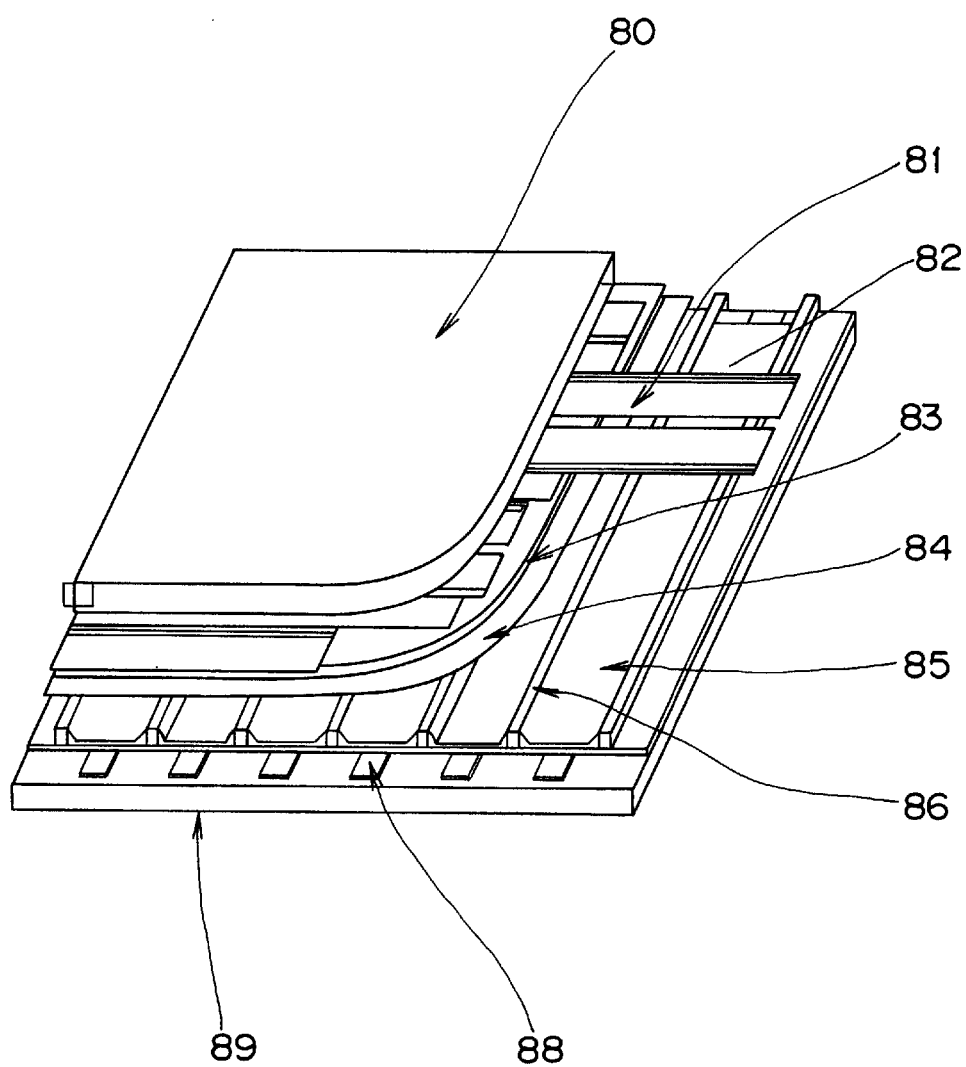
FIG. 85 is a perspective view of a PDP in a partly cut-out state.

As a ninth modification of the fifth embodiment of the present invention, FIG. 84 shows a case in which neither the deflecting electrode 504e nor the control electrode 504d is provided. In this case, start and end of a discharge operation are controlled by voltage control with a sensor or the like, where the discharge operation is started by applying a voltage to the panel substrate 3 when the nozzle 504 has relatively come to an end portion of the partitioning wall 531, and the discharge operation is ended by turning off the voltage when the nozzle 504 has come to the opposite end portion. The application rate is 25 cm per second, and can well be limited within 3 mm for non-display portions even if start and end variations are involved.

The pattern-forming material particles 1 used in this case were those formed of a resin with 3 in-dia. fluorescent particles contained therein. Polyethylene was used as the resin, where others selected from thermoplastic resins are also usable. The pattern-forming material particles 1 were fabricated by mixing fluorescent particles into a molten resin, well dispersing, cooling and grinding the mixture. As to the composition of the pattern-forming material particles 1, the fluorescent-substance content was 50 to 90 wt %, the rest being resin, where an internally added charge controlling agent and an externally added mold releasing agent were also mixed at several % or less. Particle size of the pattern-forming material particles 1 was about 15 $\mu$m.

Further, in order to form a fluorescent film uniformly within the partitioning wall 531, it is preferable to apply an oil, an adhesive, or a solvent within the partitioning wall 531 before inserting the pattern-forming material particles 1 thereinto. Silicon base oils are preferred as the oil. Terpineol or other solvents having high evaporation temperatures can be used stably.

According to the fifth embodiment of the present invention, by using a method of forming a pattern onto a panel substrate with electrostatic force, various types of patterning on panel substrates can be achieved simply and stably. As a result of this, since the process for forming a desired pattern onto a substrate constituting a large-scale panel for PDPs, liquid crystal panels, circuit boards, or the like is simplified, a panel on which a pattern is formed can be manufactured with low price, and yet a high-precision fine pattern can be formed on the panel substrate.

In addition, any arbitrary embodiments or modifications among the above-described various embodiments and modifications may be combined, as appropriate, so that the effects of the individual embodiments and modifications can be produced.

With the method and apparatus for forming a pattern onto a panel substrate according to the present invention, since the process for forming a desired pattern onto a substrate constituting a large-scale panel for PDPs, liquid crystal panels, circuit boards, or the like is simplified, a panel on which a pattern is formed can be manufactured with low price, and yet a high-precision fine pattern can be formed on the panel substrate.

As described hereinabove, according to the pattern-forming material particles of the present invention, a pattern-forming material particle having a good insulating property can be obtained by virtue of the arrangement that a large amount of resin material, which is to be evaporated by baking process, is used to cover constituent materials therewith, so that a stable patterning onto the panel substrate can be achieved by means of electrostatic force. As a result of this, a desired pattern can be formed successfully with high precision on a substrate constituting a large-scale panel for PDPs, liquid crystal panels, circuit boards, or the like. Moreover, since the process for pattern formation is simplified, a panel substrate with a pattern formed thereon can be manufactured with low price.

Also, according to the pattern forming method with the pattern-forming material particles, since the pattern-forming material particles, when patterned and deposited in a plurality of layers, are stacked in a wide-bottom shape, the pattern-forming material particles of upper layers are less likely to drop downward at edge portions, thus eliminating the possibility that the dropped pattern-forming material particles are deposited onto non-pattern portions. Thus, any deterioration of pattern precision can be prevented beforehand.

With the method and apparatus for forming a pattern onto a panel substrate according to the present invention, since the process for forming a desired pattern onto a substrate constituting a large-scale panel for PDPs, liquid crystal panels, circuit boards, or the like is simplified, and since the pattern-forming material particles are not deposited directly onto the panel substrate but once deposited onto the electrostatic pattern of the intermediate body and subsequently transferred to the panel substrate, the deposition and transfer-and-feed of the pattern-forming material particles can be accomplished smoothly so that the pattern formation on the panel substrate can be accomplished stably with high precision. As a result of this, a panel on which a pattern is formed can be manufactured with low price, and yet a high-precision fine pattern can be formed on the panel substrate.

With the method and apparatus for forming a pattern onto a panel substrate according to the present invention, since the process for forming a desired pattern onto a substrate constituting a large-scale panel for PDPs, liquid crystal panels, circuit boards, or the like is simplified, a panel on which a pattern is formed can be manufactured with low price, and yet a high-precision fine pattern can be formed on the panel substrate.

With the use of the method for forming a pattern onto a panel substrate by means of electrostatic force according to the present invention, various types of patterning on panel substrates can be achieved simply and stably. As a result of this, since the process for forming a desired pattern onto a substrate constituting a large-scale panel for PDPs, liquid crystal panels, circuit boards, or the like is simplified, a panel on which a pattern is formed can be manufactured with low price, and yet a high-precision fine pattern can be formed on the panel substrate.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method for forming a pattern on a surface of a panel substrate, comprising:

detecting a distance between a nozzle and a panel substrate;

controlling a distance between said nozzle and said panel substrate based on the detected distance between said nozzle and said panel substrate;

electrically charging pattern-forming material particles;

jetting out the electrically charged pattern-forming particles through said nozzle by applying electrostatic force said pattern-forming material particles to form a pattern; and fixing the said pattern said panel substrate.

2. The method for forming a pattern on a panel substrate according to claim 1, wherein detecting a distance between a nozzle and a panel substrate includes measuring a thickness of said, panel substrate, and from this measured thickness determining said distance between said nozzle and said panel substrate, and controlling a distance between said nozzle and said panel substrate includes moving said nozzle towards or away from said panel substrate.

3. The method for forming a pattern on a panel substrate according to claim 1, wherein in forming the pattern, a pattern is initially formed on a surface of an intermediate member with the jetted out pattern-forming material particles, and thereafter the pattern on the intermediate member is transferred onto a surface of said panel substrate.

4. The method for forming a pattern on a panel substrate according to claim 1, further comprising performing an exposure and development process on the formed pattern.

5. The method for forming a pattern on a panel substrate according to claim 1, further comprising forming an adhesion layer on a surface of said panel substrate to which the pattern-forming material particles will adhere upon being jetted out from said nozzle.

6. The method for forming a pattern on a panel substrate according to claim 1, wherein the pattern-forming material particles are particles each having a particle size of 0.5 to 15 $\mu$m formed from a compound material which contains a particle body and hard inorganic fine particles deposited on a surface of the said particle body, the said particle body containing one or more kinds of inorganic material selected from the group consisting of metal, metal oxide, ceramics, and glass, and a binder resin with a ratio of the inorganic material to a total amount of the inorganic material and the binder resin being 30 to 99 wt %.

7. The method for forming a pattern on a panel substrate according to claim 1, wherein said pattern-forming material particle are composed of a resin material, which is to be evaporated by a baking process, and a kind of constituent material particles which are disposed within the resin material at a uniform distribution and which function to form a pattern, and wherein said pattern-forming material particles are particles each of which contains a particle body and hard inorganic fine particles deposited on a surface of said particle body, said particle body containing inorganic material and a binder resin with a ratio of the inorganic material to a total amount of the inorganic material and the binder resin being 30 to 99 wt %.

8. The method for forming a pattern on a panel substrate according to claim 7, wherein the said constituent material particles are made of an electrically conductive material and, when baked, form an electrode of said pattern.

9. The method for forming a pattern on a panel substrate according to claim 7, wherein fixing said pattern to said panel substrate includes:

baking the said pattern-forming material particles containing different kinds of constituent material particles which are deposited so as to be coexistent at individual sites, by which different constituent material particles are mixed together.

10. The method for forming a pattern on a panel substrate according to claim 7, wherein fixing said pattern to said panel substrate includes:

stacking said pattern-forming material particles on said panel substrate into a plurality of layers; and changing the kind of constituent material particles contained in said pattern-forming material particles among individual layers of said pattern-forming material particles.

11. The method for forming a pattern on of a panel substrate according to claim 7, wherein the said pattern-forming material particles are fixed to said panel substrate, by:

stacking said pattern-forming material particles on said panel substrate in a plurality of layers, with the lower layers, or layers closer to said panel substrate, being increasingly wider in width.

12. The method for forming a pattern on a panel substrate according to claim 7, wherein said constituent material particles have a diameter at most ⅕ times a diameter of said pattern-forming material particles.

13. The method for forming a pattern on a panel substrate according to claim 7, wherein said constituent material particles are disposed at a central portion of said pattern-forming material particles and are peripherally coated with the said resin material.

14. The method for forming a pattern on a panel substrate according to claim 13, wherein said pattern-forming material particles are fixed to said panel substrate, by:

stacking said pattern-forming material particles on the panel substrate in a plurality of layers, with the lower layers, or layers closer to said panel substrate, being increasingly wider in width.

15. The method for forming a pattern on a panel substrate according to claim 7, wherein another kind of constituent material particles are dispersedly disposed in said resin material present in peripheries of said constituent material particles disposed in said central portion of the pattern-forming material particles.

16. The method for forming a pattern on a panel substrate according to claim 7, wherein a multiplicity of smaller-diameter resin-material particles, relative to said constituent material particles, are deposited on a peripheral surface of said constituent material particles.

17. The method for forming a pattern on a panel substrate according to claim 13, wherein said constituent material particles are made of an electrically conductive material and, when baked, form an electrode of said pattern.

18. The method for forming a pattern on a panel substrate according to claim 13, wherein fixing said pattern on said panel substrate includes:

baking said pattern-forming material particles containing different kinds of constituent material particles which are deposited so as to be coexistent at individual sites, by which different constituent material particles are mixed together.

19. The method for forming a pattern on a panel substrate according to claim 13, fixing said pattern on said panel substrate includes:

stacking said pattern-forming material particles on said panel substrate into a plurality of layers; and changing the kind of constituent material particles contained in said pattern-forming material particles among individual layers of said pattern-forming material particles.

20. The method for forming a pattern on a panel substrate according to claim 1, wherein when said pattern is fixed to said panel substrate, an electrostatic pattern is formed on an intermediate body, said pattern-forming material particles are deposited onto said electrostatic pattern formed on said intermediate body, said pattern-forming material particles deposited on said intermediate body are transferred onto said panel substrate, and thereafter the transferred pattern forming material particles are fixed to said panel substrate; and further comprising cleaning said intermediate body onto which said pattern-forming material particles have been transferred, by which remaining pattern-forming material particles are removed.

21. The method for forming a pattern on a panel substrate according to claim 20, wherein when said pattern-forming material particles are electrically charged, said pattern material particles are electrically charged by friction between a blade and said pattern-forming material particles.

22. The method for forming a pattern on a panel substrate according to claim 20, wherein when said transferred pattern-forming material particles are fixed to said panel substrate, the processes from the electrically charging of said pattern-forming material particles to the removal of pattern-forming material particles remaining on said intermediate body are repeated a plurality of times, by which a plurality of pattern-forming material particles are fixed; and further comprising baking said panel substrate so that said pattern is formed on said panel substrate, by which a plurality of patterns are formed at a time.

23. The method for forming a pattern on a panel substrate according to claim 22, wherein said intermediate body is one in which an electrical conductor is buried within a platy substrate along said pattern, and in forming said electrostatic pattern on said intermediate body, a voltage is applied to said electrical conductor, by which said electrostatic pattern is formed on the a surface of said substrate as said intermediate body.

24. The method for forming a pattern a panel substrate according to claim 22, wherein said intermediate body is one in which a patterned mask is provided on a surface of a platy substrate.

25. The method for forming a pattern on a panel substrate according to claim 20 wherein said intermediate body is one in which an electrical conductor is buried within a platy substrate along said pattern, and in forming said electrostatic pattern on said intermediate body, a voltage is applied to said electrical conductor, by which said electrostatic pattern is formed on a surface of said substrate as said intermediate body.

26. The method for forming a pattern on a panel substrate according to claim 20, wherein said intermediate body is one in which a patterned mask is provided on a surface of a platy substrate.

27. The method for forming a pattern on a panel substrate according to claim 20, wherein when said pattern-forming material particles are electrically charged, said pattern-forming material particles are electrically charged by an electric charger.

28. The method for forming a pattern on a panel substrate according to claim 20, wherein when said electrically charged pattern-forming material particles are jetted out by electrostatic force, a mixture of said pattern-forming material particles and highly chargeable particles are jetted out.

29. The method for forming a pattern on a panel substrate according to claim 28, wherein when said pattern-forming material particles are electrically charged said pattern-forming material particles are mixed with highly chargeable particles to be electrically charged.

30. The method for forming a pattern on a panel substrate according to claim 1, wherein said electrically charged pattern-forming material particles are jetted out through said nozzle by exerting electrostatic force on said electrically charged pattern-forming material particles to perform application of said pattern-forming material particles after a voltage is applied to a conductor provided on a back side of said panel substrate, to form said pattern by the jetted-out pattern-forming material particles.

31. The method for forming a pattern on a panel substrate according to claim 1, wherein said electrically charged pattern-forming material particles are jetted out through said nozzle by exerting electrostatic force on said electrically charged pattern-forming material particles to perform application of said pattern-forming material particles after a voltage is applied to a conductor provided on a back side of said panel substrate to form said pattern by the jetted-out pattern-forming material particles, to form an electrically conductive film on a top surface of said panel substrate, and to apply a voltage to said film.

32. The method for forming a pattern on a panel substrate according to claim 1, wherein when said pattern-forming material particles are electrically charged, said pattern-forming material particles are electrically charged by an electric charger.

33. The method for forming a pattern on a panel substrate according to claim 1, wherein when said electrically charged pattern-forming material particles are jetted out by electrostatic force, a mixture of said pattern-forming material particles and highly chargeable particles are jetted out.

34. The method for forming a pattern on a panel substrate according to claim 1, wherein when said pattern-forming material particles are electrically charged, said pattern-forming material particles are mixed with highly chargeable particles to be electrically, charged.

35. The method for forming a pattern on a panel substrate according to claim 1, wherein when said pattern-forming material particles are electrically charged said pattern-forming material particles are electrically charged by friction between a blade and said pattern-forming material particles.

36. The method for forming a pattern on a panel substrate according to claim 1, wherein said electrically charged pattern-forming material particles are jetted out through said nozzle by exerting electrostatic force on said electrically charged pattern-forming material particles to perform application of said pattern-forming material particles after a voltage is applied to an electrically conductive layer present on a top surface of panel substrate, to form said pattern by the jetted-out pattern-forming material particles.

37. The method for forming a pattern on a panel substrate according to claim 1, wherein controlling a distance between said nozzle and said panel substrate includes controlling said distance between said nozzle and said panel substrate while jetting out said electrically charged pattern-forming particles through said nozzle.

38. The method for forming a pattern on a panel substrate according to claim 37, wherein detecting a distance between a nozzle and a panel substrate includes measuring a thickness of said panel substrate, and from this measured thickness determining said distance between said nozzle and said panel substrate, and controlling said distance between said nozzle and said panel substrate while jetting out said electrically charged pattern-forming particles includes moving said nozzle towards or away from said panel substrate.

39. An apparatus for forming a pattern on a panel substrate, said apparatus comprising:
- a particle feeder for feeding electrically charged pattern-forming material particles;
- a nozzle to be positioned between said particle feeder and a panel substrate;
- a jet device for jetting out the pattern-forming material particles from said nozzle by exerting an electrostatic force to the pattern-forming material particles fed from said particle feeder;
- a detector for detecting a distance between said nozzle and the panel substrate when said nozzle is positioned between said particle feeder and the panel substrate; and
- a distance controller for controlling a distance between said nozzle and the panel substrate. when said nozzle is positioned between said particle feeder and the panel substrate, based on the distance detected by said detector.

40. The apparatus for forming a pattern on a panel substrate according to claim 39, further comprising a panel substrate holder having a flat surface for holding the panel substrate, wherein, during a pattern forming operation, the panel substrate is vacuum-sucked by said flat surface of said panel substrate holder.

41. The apparatus for forming a pattern on a panel substrate according to claim 40, further comprising: around an opening of said nozzle, an electrode for converging a jet stream of the pattern-forming material particles by applying electrostatic force to the pattern-forming material particles that pass through said opening.

42. The apparatus for forming a pattern on a panel substrate according to claim 39, further comprising: around an opening of said nozzle, an electrode for converging a jet stream of the pattern-forming material particles by applying electrostatic force to the pattern-forming material particles that pass through said opening.

43. The apparatus for forming a pattern on a panel substrate according to claim 39, wherein said nozzle comprises a circuit board provided with at least one through hole, a converging electrode disposed around said at least one through hole, and a deflecting electrode disposed around said at least one through hole on an opposite side of the circuit board relative to said converging electrode.

44. The apparatus for forming a pattern on a panel substrate according to claim 39, wherein said nozzle comprises a circuit board provided with at least one through hole, and a converging electrode, disposed around said at least one through hole, for causing said pattern-forming material particles to be jetted out toward the panel substrate by electrostatic force.

45. The apparatus for forming a pattern on a panel substrate according to claim 39, wherein
said distance controller for controlling a distance between said nozzle and the panel substrate, when said nozzle is between said particle feeder and the panel substrate, is for controlling the distance while said jet device is jetting out the pattern-forming material particles from said nozzle.

46. The apparatus for forming a pattern on a panel substrate according to claim 45, wherein
said detector for detecting a distance between said nozzle and the panel substrate includes a device for measuring a thickness of the panel substrate, such that from this measured thickness can be determined the distance between said nozzle and the panel substrate when said nozzle is between said particle feeder and the panel substrate, and
said distance controller for controlling the distance between said nozzle and the panel substrate while said jet device is jetting out the pattern-forming material particles from said nozzle includes a device for moving said nozzle towards or away from the panel substrate.

47. The method for forming a pattern on a surface of a panel substrate according to claim 39, wherein
said detector for detecting a distance between said nozzle and the panel substrate includes a device for measuring a thickness of the panel substrate, such that from this measured thickness can be determined the distance between said nozzle and the panel substrate when said nozzle is between said particle feeder and the panel substrate, and
said distance controller for controlling a distance between said nozzle and the panel substrate, when said nozzle is between said particle feeder and the panel substrate, includes a device for moving said nozzle towards or away from the panel substrate.

* * * * *

UNITED STATES PATENT AND TRADEMARK OFFICE
CERTIFICATE OF CORRECTION

PATENT NO.     : 6,673,386 B2
DATED          : January 6, 2004
INVENTOR(S)    : Daido Komyoji et al.

It is certified that error appears in the above-identified patent and that said Letters Patent is hereby corrected as shown below:

Drawings,
Figure 12 is replaced by Figure 12 attached herewith.

Column 59,
Line 4, insert -- to -- after "force".
Line 6, insert -- to -- after "pattern".
Line 6, delete "the" after "fixing".
Line 10, delete "," after "said".
Line 36, delete "the" after "of".
Line 36, delete "the" after "body,".
Line 56, delete "the" after "wherein".
Line 62, delete "the" after "baking".

Column 60,
Line 26, delete "the" before "said".
Lines 35 and 41, change "7" to -- 13 --.
Line 38, change "the" to -- said --.
Line 58, insert -- wherein -- after "claim 13,".

Column 61,
Line 15, change "pattern" to -- pattern-forming --.
Line 30, insert paragraph break after "wherein".
Line 32, insert paragraph break after "and".
Line 35, delete "the" after "on".
Line 37, insert -- on -- after "pattern".
Line 42, insert -- , -- after "claim 20".
Line 65, change "28" to -- 20 --.
Line 66, insert -- , -- after "charged".

Column 62,
Line 35, delete "," after "electrically".
Line 38, insert -- , -- after "charged".
Line 49, insert -- said --, after "of".

UNITED STATES PATENT AND TRADEMARK OFFICE
CERTIFICATE OF CORRECTION

PATENT NO. : 6,673,386 B2
DATED : January 6, 2004
INVENTOR(S) : Daido Komyoji et al.

It is certified that error appears in the above-identified patent and that said Letters Patent is hereby corrected as shown below:

Column 63,
Line 16, change "." to -- , --.

Signed and Sealed this

Seventeenth Day of August, 2004

JON W. DUDAS
*Acting Director of the United States Patent and Trademark Office*